United States Patent
Kurokawa

(10) Patent No.: US 9,761,598 B2
(45) Date of Patent: Sep. 12, 2017

(54) PROGRAMMABLE LOGIC DEVICE (PLD)

(71) Applicant: SEMICONDUCTOR ENERGY LABORATORY CO., LTD., Atsugi-shi, Kanagawa-ken (JP)

(72) Inventor: Yoshiyuki Kurokawa, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 119 days.

(21) Appl. No.: 14/309,103

(22) Filed: Jun. 19, 2014

(65) Prior Publication Data

US 2014/0374747 A1    Dec. 25, 2014

(30) Foreign Application Priority Data

Jun. 21, 2013 (JP) ................................. 2013-130108
Jul. 3, 2013 (JP) ................................. 2013-139351

(51) Int. Cl.

| | | |
|---|---|---|
| H01L 27/115 | (2017.01) | |
| H01L 27/11529 | (2017.01) | |
| H01L 27/11558 | (2017.01) | |
| H01L 27/07 | (2006.01) | |
| H01L 27/088 | (2006.01) | |

(Continued)

(52) U.S. Cl.
CPC .. *H01L 27/11529* (2013.01); *H01L 27/11558* (2013.01); *H01L 27/0623* (2013.01); *H01L 27/0705* (2013.01); *H01L 27/088* (2013.01); *H01L 27/1225* (2013.01)

(58) Field of Classification Search
CPC ......... H03K 19/17728; H03K 19/1776; H03K 19/17772; H03K 19/173; H03K 19/17736; H03K 19/17784; H03K 19/0013; H03K 19/018585; H01L 27/11529; H01L 29/7825; G01R 19/0084

See application file for complete search history.

(56) References Cited

U.S. PATENT DOCUMENTS 5,214,327 A   5/1993   Saeki et al.
5,731,856 A   3/1998   Kim et al.
(Continued)

FOREIGN PATENT DOCUMENTS

EP   0416546 A    3/1991
EP   1737044 A   12/2006
(Continued)

OTHER PUBLICATIONS

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

(Continued)

*Primary Examiner* — Ermias Woldegeorgis
(74) *Attorney, Agent, or Firm* — Fish & Richardson P.C.

(57) ABSTRACT

To provide a semiconductor device with excellent charge retention characteristics, a transistor including a thick gate insulating film to achieve low leakage current is additionally provided such that its gate is connected to a node for holding charge. The node is composed of this additional transistor and a transistor using an oxide semiconductor in its semiconductor layer including a channel formation region. Charge corresponding to data is held at the node.

31 Claims, 28 Drawing Sheets

(51) Int. Cl.
 *H01L 27/06* (2006.01)
 *H01L 27/12* (2006.01)

(56) References Cited

U.S. PATENT DOCUMENTS

| | | |
|---|---|---|
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,863,611 B2 | 1/2011 | Abe et al. |
| 8,203,146 B2 | 6/2012 | Abe et al. |
| 8,455,868 B2 | 6/2013 | Yamazaki et al. |
| 8,829,594 B2 | 9/2014 | Tatsumura et al. |
| 9,349,735 B2 | 5/2016 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1* | 6/2006 | Abe et al. .................... 257/197 |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0101339 A1 | 5/2011 | Yamazaki et al. |
| 2012/0049901 A1 | 3/2012 | Takewaki et al. |
| 2012/0293202 A1 | 11/2012 | Nishijima et al. |
| 2016/0260718 A1 | 9/2016 | Yamazaki et al. |

FOREIGN PATENT DOCUMENTS

| | | |
|---|---|---|
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 03-091319 A | 4/1991 |
| JP | 04-042615 A | 2/1992 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165532 A | 6/2006 |
| JP | 2011-119675 A | 6/2011 |
| JP | 2011-151383 A | 8/2011 |
| JP | 2012-257217 A | 12/2012 |
| JP | 2013-114729 A | 6/2013 |
| WO | WO-2004/114391 | 12/2004 |
| WO | WO-2011/077967 | 6/2011 |

OTHER PUBLICATIONS

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

(56) References Cited

OTHER PUBLICATIONS

Kimizuka.N. et al., "Spinel,YbFe2O4, and Yb2Fe3O7 Types of Structures for Compounds in the In2O3 and Sc2O3—A2O3—Bo Systems [A; Fe, Ga, or Al; B; Mg, Mn, Fe, Ni, Cu, or Zn] at Temperatures over 1000° C.", Journal of Solid State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Lee.H et al., "Current Status of, Challenges to, and Perspective View of AM-OLED", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO TFTS) for AMLCDS", Journal of the SID, 2007, vol. 15, No. 1, pp. 17-22.

Park.S et al., "Challenge to Future Displays: Transparent AM-OLED Driven by PEALD Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases Display Application", SID Digest '07 : SID International Symposium Digest of Technical Papers, 2007, vol. 38, pp. 1737-1740.

Miyasaka.M, "SUFTLA Flexible Microelectronics on Their Way to Business", SID Digest '07 : SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits , 2008, vol. 43, No. 1, pp. 292-299.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Park.J et al., "Amorphous Indium-Gallium-Zinc Oxide TFTS and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Sakata.J et al., "Development of 4.0-In. AMOLED Display With Driver Circuit Using Amorphous In—Ga—Zn-Oxide TFTS", IDW '09 : Proceedings of the 16th International Display Workshops, 2009, pp. 689-692.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Nowatari.H et al., "60.2: Intermediate Connector With Suppressed Voltage Loss for White TANDEM OLEDS", SID Digest '09 : SID International Symposium Digest of Technical Papers, May 31, 2009, vol. 40, pp. 899-902.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Ohara.H et al., "21.3:4.0 In. QVGA AMOLED Display Using In—Ga—Zn-Oxide TFTS With a Novel Passivation Layer", SID Digest '09 : SID International Symposium Digest of Technical Papers, May 31, 2009, pp. 284-287.

Godo.H et al., "P-9:Numerical Analysis on Temperature Dependence of Characteristics of Amorphous In—Ga—Zn-Oxide TFT", SID Digest '09 : SID International Symposium Digest og Technical Papers, May 31, 2009, pp. 1110-1112.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structure", NIRIM Newsletter, Mar. 1, 1995, vol. 150, pp. 1-4.

(56) References Cited

OTHER PUBLICATIONS

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m<4):a Zn4s conductor", Philosophical Magazine, 2001, vol. 81, No. 5, pp. 501-515.

Janotti.A et al., "Oxygen Vacancies In ZnO", Appl. Phys. Lett. (Applied Physics Letters), 2005, vol. 87, pp. 122102-1-122102-3.

Clark.S et al., "First Principles Methods Using CASTEP", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.J et al., "Electronic Transport Properties of Amorphous Indium-Gallium-Zinc Oxide Semiconductoe Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review, B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society). 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probe using single-crystalline InGaO3(ZnO)5 films", Appl. Phys. Lett. (Applied Physics Letters), Sep. 13, 2004, vol. 85, No. 11, pp. 1993-1995.

Kazunari Ishimaru; "45nm/32nm CMOS—Challenge and perspective"; Solid-State Electronics, vol. 52, No. 9; pp. 1266-1273; Sep. 1, 2008.

\* cited by examiner

PROGRAMMABLE LOGIC DEVICE (PLD)

BACKGROUND OF THE INVENTION

1. Field of the Invention

The present invention relates to semiconductor devices, and particularly to a programmable logic device and a semiconductor device that can change a hardware configuration.

2. Description of the Related Art

A programmable logic device (PLD) includes a plurality of programmable logic elements and a plurality of programmable switch elements. A circuit structure of a PLD can be varied to change its function in such a manner that a function of each programmable logic element or a connection between programmable logic elements through programmable switch elements is changed by programming performed by a user after fabrication.

A function of each programmable logic element and a connection between programmable logic elements through programmable switch elements are determined by configuration data. Configuration data is stored in a memory circuit included in a programmable logic element or a memory circuit included in a programmable switch element. A memory circuit for storing configuration data is hereinafter referred to as configuration memory.

Patent Document 1 suggests a programmable logic device using, as configuration memory, memory that is composed of a combination of a transistor in which a semiconductor layer including a channel formation region contains an oxide semiconductor (also referred to as OS transistor) and a transistor in which a semiconductor layer including a channel formation region contains silicon (also referred to as Si transistor). The use of the memory including the OS transistor and the Si transistor as configuration memory makes it possible to configure a nonvolatile programmable switch with a small number of transistors.

Moreover, a semiconductor device in which data is retained by a combination of a Si transistor and an OS transistor has attracted attention (see Patent Document 2).

REFERENCE

Patent Document 1: Japanese Published Patent Application No. 2012-257217
Patent Document 2: Japanese Published Patent Application No. 2011-119675

SUMMARY OF THE INVENTION

Miniaturization of Si transistors progresses with shrinking design rules. Reduction in the size of elements results in thinner gate insulating films, thereby posing a problem of leakage current through a gate insulating film.

For this reason, when a node that holds charge is connected to a gate of a Si transistor that is a path transistor as in the above programmable switch element, charge accumulated at the node leaks through a gate insulating film of the Si transistor. Accordingly, a function of a nonvolatile memory circuit in the programmable switch element is impaired even when the leakage current of the OS transistor in the off state (off-state current) is low.

Alternatively, when a node that holds charge is connected to a gate of a Si transistor as in the above semiconductor device, charge accumulated at the node leaks through a gate insulating film of the Si transistor. Thus, charge retention characteristics of the node deteriorate even when the off-state leakage current of the OS transistor (off-state current) is low.

In view of the above, an object of one embodiment of the present invention is to provide a novel-structured programmable logic device in which a function of a nonvolatile memory circuit in a programmable switch element is not impaired. Another object of one embodiment of the present invention is to provide a novel-structured programmable logic device in which a function of a nonvolatile memory circuit in a programmable switch element is not impaired even when leakage current through a gate insulating film of a Si transistor serving as a path transistor occurs.

Another object of one embodiment of the present invention is to provide a novel-structured semiconductor device with excellent charge retention characteristics of a node that holds charge. Another object of one embodiment of the present invention is to provide a novel-structured semiconductor device in which a function of a nonvolatile memory circuit is not impaired even when leakage current through a gate insulating film of a Si transistor occurs. Another object of one embodiment of the present invention is to provide a novel-structured semiconductor device that has high area efficiency by preventing an increase in area occupied by memory cells due to the increase in the number of components.

Note that the descriptions of these objects do not disturb the existence of other objects. In one embodiment of the present invention, there is no need to achieve all the objects. Objects other than the above objects will be apparent from and can be derived from the description of the specification, the drawings, the claims, and the like.

In one embodiment of the present invention, a transistor including a thick gate insulating film to achieve low leakage current is additionally provided as a transistor whose gate is connected to a node for holding charge so that the node is formed using the transistor to maintain a function of a nonvolatile memory circuit. One of a source and a drain of the additional transistor is supplied with a potential for turning on a Si transistor that is a path transistor, and the other of the source and the drain is connected to a gate of the Si transistor.

With the above structure, charge at the node for holding charge is held in the nonvolatile memory circuit included in a programmable switch element; thus, the function of the nonvolatile memory circuit can be maintained. Moreover, it is possible to achieve a programmable logic device in which a function of the path transistor in the programmable switch element is not impaired even if leakage current occurs in the Si transistor because of miniaturization.

In another embodiment of the present invention, a transistor having a first gate and a second gate functioning as a backgate is additionally provided as a transistor having a gate connected to a node for holding charge. In the transistor, the first gate is connected to the node for holding charge, and leakage current is low due to the use of a thick gate insulating film on the first gate side. The node for holding charge is composed of the additional transistor and a transistor using an oxide semiconductor for a semiconductor layer including a channel formation region. Charge corresponding to data is held at the node. To read data from the node, a signal is applied to the second gate to control whether a potential is applied to a gate of a Si transistor or not in accordance with stored data and the potential of the second gate, and the stored data is detected by a change in the potential of one of a source and a drain of the Si transistor.

With the above structure, even if leakage current occurs in the Si transistor because of miniaturization, charge retention characteristics of the node that holds charge are improved, and the function of a nonvolatile memory circuit with excellent charge retention characteristics is maintained. Furthermore, stacking transistors composing a memory cell prevents the increase in the memory cell area due to the increase in the number of elements.

One embodiment of the present invention is a programmable logic device including a programmable switch element including a first transistor, a second transistor, and a third transistor. One of a source and a drain of the first transistor is electrically connected to a bit line. A gate of the first transistor is electrically connected to a word line. One of a source and a drain of the second transistor is electrically connected to a wiring applying a constant potential. A gate of the second transistor is electrically connected to the other of the source and the drain of the first transistor. A gate of the third transistor is electrically connected to the other of the source and the drain of the second transistor. Continuity between a source and a drain of the third transistor is controlled in accordance with the constant potential. The first transistor includes a semiconductor layer containing an oxide semiconductor. The third transistor includes a semiconductor layer containing silicon. The thickness of a gate insulating film of the second transistor is larger than that of a gate insulating film of the third transistor.

One embodiment of the present invention is a programmable logic device including a programmable switch element including a first transistor, a second transistor, a third transistor, and a capacitor. One of a source and a drain of the first transistor is electrically connected to a bit line. A gate of the first transistor is electrically connected to a word line. One of a source and a drain of the second transistor is electrically connected to a wiring applying a constant potential. A gate of the second transistor is electrically connected to the other of the source and the drain of the first transistor. A gate of the third transistor is electrically connected to the other of the source and the drain of the second transistor. The third transistor controls continuity between its source and drain in accordance with the constant potential. A first electrode of the capacitor is electrically connected to the other of the source and the drain of the first transistor and the gate of the second transistor. A second electrode of the capacitor is electrically connected to a wiring applying a ground potential. The first transistor includes a semiconductor layer containing an oxide semiconductor. The third transistor includes a semiconductor layer containing silicon. The thickness of a gate insulating film of the second transistor is larger than that of a gate insulating film of the third transistor.

In the programmable logic device of one embodiment of the present invention, the constant potential is preferably a potential for turning on or off the third transistor.

In the programmable logic device of one embodiment of the present invention, the bit line is preferably at L level while the word line is at L level.

In the programmable logic device of one embodiment of the present invention, it is preferable that a reset circuit be electrically connected to one of the source and the drain of the third transistor.

In the programmable logic device of one embodiment of the present invention, it is preferable that a latch circuit is electrically connected to one of the source and the drain of the third transistor.

One embodiment of the present invention is a programmable logic device including a programmable switch element including a first transistor, a second transistor, a third transistor, a fourth transistor, and a fifth transistor. One of a source and a drain of the first transistor is electrically connected to a bit line. A gate of the first transistor is electrically connected to a word line. One of a source and a drain of the second transistor is electrically connected to a wiring applying a first potential. A gate of the second transistor is electrically connected to the other of the source and the drain of the first transistor. One of a source and a drain of the third transistor is electrically connected to an inverted bit line. A gate of the third transistor is electrically connected to the word line. One of a source and a drain of the fourth transistor is electrically connected to a wiring applying a second potential. A gate of the fourth transistor is electrically connected to the other of the source and the drain of the third transistor. A gate of the fifth transistor is electrically connected to the other of the source and the drain of the second transistor and the other of the source and the drain of the fourth transistor. The fifth transistor controls continuity between its source and drain in accordance with the first potential or the second potential. The first transistor and the third transistor each include a semiconductor layer containing an oxide semiconductor. The fifth transistor includes a semiconductor layer containing silicon. The thickness of a gate insulating film of each of the second transistor and the fourth transistor is larger than that of a gate insulating film of the fifth transistor.

One embodiment of the present invention is a programmable logic device including a programmable switch element including a first transistor, a second transistor, a third transistor, a fourth transistor, a fifth transistor, a first capacitor, and a second capacitor. One of a source and a drain of the first transistor is electrically connected to a bit line. A gate of the first transistor is electrically connected to a word line. One of a source and a drain of the second transistor is electrically connected to a wiring applying a first potential. A gate of the second transistor is electrically connected to the other of the source and the drain of the first transistor. One of a source and a drain of the third transistor is electrically connected to an inverted bit line. A gate of the third transistor is electrically connected to the word line. One of a source and a drain of the fourth transistor is electrically connected to a wiring applying a second potential. A gate of the fourth transistor is electrically connected to the other of the source and the drain of the third transistor. A gate of the fifth transistor is electrically connected to the other of the source and the drain of the second transistor and the other of the source and the drain of the fourth transistor. The fifth transistor controls continuity between its source and drain in accordance with the first potential or the second potential. A first electrode of the first capacitor is electrically connected to the other of the source and the drain of the first transistor and the gate of the second transistor. A second electrode of the first capacitor is electrically connected to a wiring applying a ground potential. A first electrode of the second capacitor is electrically connected to the other of the source and the drain of the third transistor and the gate of the fourth transistor. A second electrode of the second capacitor is electrically connected to the wiring applying the ground potential. The first transistor and the third transistor each include a semiconductor layer containing an oxide semiconductor. The fifth transistor includes a semiconductor layer containing silicon. The thickness of a gate insulating film of each of the second transistor and the fourth transistor is larger than that of a gate insulating film of the fifth transistor.

In the programmable logic device of one embodiment of the present invention, it is preferable that the first potential be a potential for turning on the fifth transistor and the second potential be a potential for turning off the fifth transistor.

In the programmable logic device of one embodiment of the present invention, the bit line and the inverted bit line are preferably at L level while the word line is at L level.

In the programmable logic device of one embodiment of the present invention, the first potential is preferably higher than the second potential.

In the programmable logic device of one embodiment of the present invention, it is preferable that a reset circuit be electrically connected to one of the source and the drain of the fifth transistor.

In the programmable logic device of one embodiment of the present invention, it is preferable that a latch circuit is electrically connected to one of the source and the drain of the fifth transistor.

One embodiment of the present invention is a semiconductor device that includes a data memory unit including a first transistor, a second transistor, and a capacitor; and a third transistor. One of a source and a drain of the first transistor is electrically connected to a write data line. A gate of the first transistor is electrically connected to a write selection line. One of a source and a drain of the second transistor is electrically connected to a voltage control line. A first gate of the second transistor is electrically connected to the other of the source and the drain of the first transistor. A second gate of the second transistor is electrically connected to a read selection line. A first electrode of the capacitor is electrically connected to the other of the source and the drain of the first transistor and the first gate of the second transistor. A second electrode of the capacitor is electrically connected to a ground line. A gate of the third transistor is electrically connected to the other of the source and the drain of the second transistor. One of a source and a drain of the third transistor is electrically connected to a wiring applying a constant potential. The other of the source and the drain of the third transistor is electrically connected to a read data line. The first transistor includes a semiconductor layer containing an oxide semiconductor. The third transistor includes a semiconductor layer containing single crystal silicon. The thickness of a gate insulating film of the second transistor is larger than that of a gate insulating film of the third transistor.

In the semiconductor device of one embodiment of the present invention, the second transistor preferably includes a semiconductor layer containing an oxide semiconductor.

In the semiconductor device of one embodiment of the present invention, the second transistor is preferably provided in the same layer as the first transistor.

In the semiconductor device of one embodiment of the present invention, the second transistor preferably includes a semiconductor layer containing silicon that is provided in a layer different from the semiconductor layer of the third transistor.

In the semiconductor device of one embodiment of the present invention, the second transistor is preferably provided in a layer different from layers in the first transistor and the third transistor.

The semiconductor device of one embodiment of the present invention preferably includes a plurality of data memory units.

In the semiconductor device of one embodiment of the present invention, the write data line preferably applies a potential for turning off the second transistor as an initial potential held between the other of the source and the drain of the first transistor, the first gate of the second transistor, and the first electrode of the capacitor.

One embodiment of the present invention can provide a novel-structured programmable logic device in which a function of a programmable switch element as a nonvolatile memory circuit is not impaired. Moreover, one embodiment of the present invention can provide a novel-structured programmable logic device in which a function of a nonvolatile memory circuit in a programmable switch element is not impaired even when leakage current through a gate insulating film of a Si transistor serving as a path transistor occurs.

One embodiment of the present invention can provide a novel-structured semiconductor device with excellent charge retention characteristics of a node that holds charge. One embodiment of the present invention can provide a novel-structured semiconductor device in which a function of a nonvolatile memory circuit is not impaired even when leakage current through a gate insulating film of a Si transistor occurs. Further, one embodiment of the present invention can provide a novel-structured semiconductor device that has high area efficiency by preventing an increase in area occupied by memory cells due to the increase in the number of components.

BRIEF DESCRIPTION OF THE DRAWINGS

In the accompanying drawings.

DETAILED DESCRIPTION OF THE INVENTION

Figure 1A:
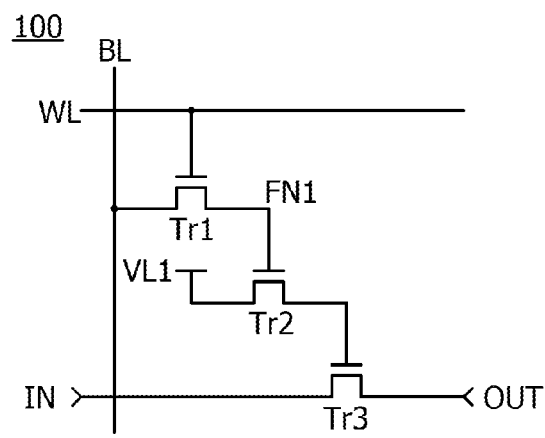
FIGS. 1A and 1B are a circuit diagram and a cross-sectional schematic view of one embodiment of the present invention.

Embodiments will be described below with reference to the drawings. Note that the embodiments can be implemented with various modes, and it will be readily appreciated by those skilled in the art that modes and details can be changed in various ways without departing from the spirit and scope of the present invention. Thus, the present invention should not be interpreted as being limited to the following description of the embodiments. Note that in structures of the present invention described below, reference numerals denoting the same portions are used in common in different drawings.

In the drawings, the size, the layer thickness, or the region is exaggerated for clarity in some cases. Therefore, embodiments of the present invention are not limited to such a scale. Note that the drawings are schematic views showing ideal examples, and embodiments of the present invention are not limited to shapes or values shown in the drawings. For example, variation in signal, voltage, or current due to noise or difference in timing can be included.

In this specification and the like, a transistor is an element having at least three terminals: a gate, a drain, and a source. The transistor has a channel region between the drain (a drain terminal, a drain region, or a drain electrode) and the source (a source terminal, a source region, or a source electrode), and current can flow through the drain, the channel region, and the source.

Here, since the source and the drain of the transistor may change depending on the structure, operating conditions, and the like of the transistor, it is difficult to define which is a source or a drain. Thus, it is possible that a portion functioning as the source and a portion functioning as the drain are not called a source and a drain, and that one of the source and the drain is referred to as a first electrode and the other is referred to as a second electrode.

In this specification and the like, ordinal numbers such as first, second, and third are used to avoid confusion among components, and thus do not limit the number of the components.

In this specification and the like, the expression "A and B are connected" means the case where A and B are electrically connected to each other in addition to the case where A and B are directly connected to each other. Here, the expression "A and B are electrically connected" means the case where electric signals can be transmitted and received between A and B when an object having any electric action exists between A and B.

In this specification and the like, terms for explaining arrangement, such as "over" and "under", are used for convenience to describe the positional relation between components with reference to drawings. Further, the positional relation between components is changed as appropriate in accordance with a direction in which each component is described. Thus, there is no limitation on terms used in this specification, and description can be made as appropriate depending on the situation.

In this specification and the like, the layout of circuit blocks in a drawing specifies the positional relation for description. Thus, even when a drawing shows that different functions are achieved in different circuit blocks, an actual circuit block may be configured so that the different functions are achieved in the same circuit block. In addition, the function of each circuit block in a drawing is specified for description. Thus, even when one circuit block is illustrated, an actual circuit or region may be configured so that processing which is shown as being performed in the one circuit block is performed in a plurality of circuit blocks.

In this specification and the like, voltage often refers to a potential difference between a given potential and a reference potential (e.g., a ground potential). Accordingly, voltage, potential, and potential difference can also be referred to as potential, voltage, and voltage difference, respectively. Note that voltage refers to a difference between potentials of two points, and a potential refers to electrostatic energy (electric potential energy) of a unit charge at a given point in an electrostatic field.

In this specification and the like, the term "parallel" indicates that the angle formed between two straight lines ranges from −10° to 10°, and accordingly also includes the case where the angle ranges from −5° to 5°. In addition, the term "perpendicular" indicates that the angle formed between two straight lines ranges from 80° to 100°, and accordingly also includes the case where the angle ranges from 85° to 95°.

In this specification and the like, the trigonal and rhombohedral crystal systems are included in the hexagonal crystal system.

In this specification and the like, data for setting a function of a programmable logic element and a connection between programmable switch elements (i.e., configuration data) is stored in a memory device such as flash memory. Configuration refers to writing of configuration data stored in a memory device into a programmable logic element and a programmable switch element. Configuration memory refers to memory that stores configuration data and is included in a programmable logic element and a programmable switch element.

Embodiment 1

In this embodiment, a structure of a programmable switch element will be described.

Figure 1B:
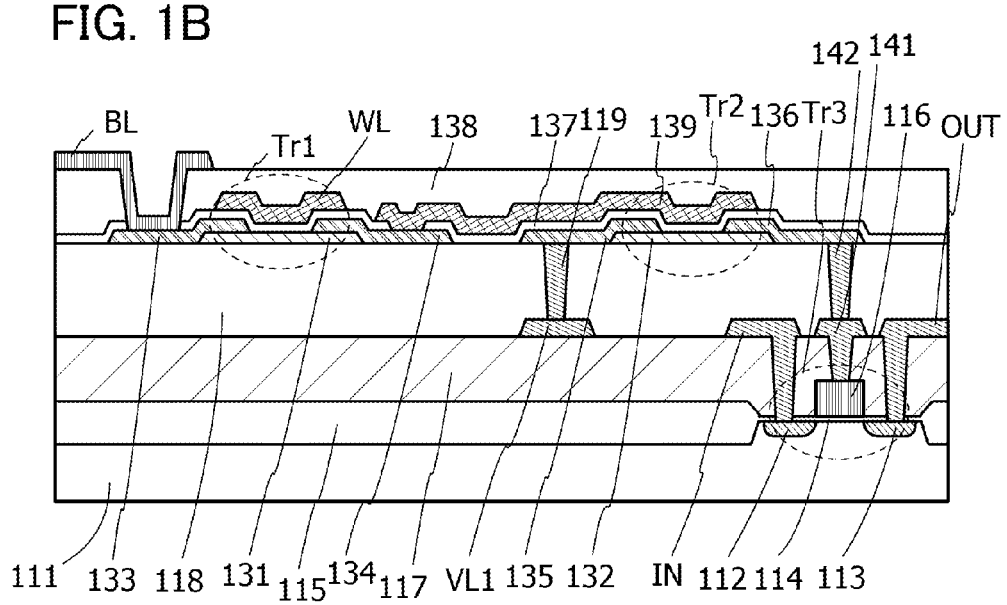

FIG. 1A is a circuit diagram illustrating the structure of a programmable switch element. FIG. 1B is a cross-sectional schematic view corresponding to the circuit diagram.

A programmable switch element 100 illustrated in FIG. 1A includes a transistor Tr1, a transistor Tr2, and a transistor Tr3. Note that the transistors Tr1 to Tr3 are n-channel transistors in FIG. 1A.

The transistor Tr1 has a function of controlling writing of configuration data into the programmable switch element 100 in accordance with a word signal. A gate of the transistor Tr1 is connected to a word line WL for applying a word signal (wiring). One of a source and a drain of the transistor Tr1 is connected to a bit line BL for applying configuration data (wiring).

The transistor Tr2 has a function of controlling the on/off state of the transistor Tr3 in accordance with configuration data written into the programmable switch element 100. A gate of the transistor Tr2 is connected to the other of the source and the drain of the transistor Tr1. One of a source and a drain of the transistor Tr2 is connected to a wiring VL1 for applying a constant potential V1.

The transistor Tr3 functions as a path transistor that controls continuity between an input terminal IN and an output terminal OUT in accordance with the potential of a gate of the transistor Tr3; whether the constant potential V1 is applied to the gate of the transistor Tr3 or not is determined by the on/off state of the transistor Tr2. The gate of the transistor Tr3 is connected to the other of the source and the drain of the transistor Tr2. One of a source and a drain of the transistor Tr3 is connected to the input terminal N. The other of the source and the drain of the transistor Tr3 is connected to the output terminal OUT.

When the transistor Tr3 is an n-channel transistor, the constant potential V1 is an H-level potential capable of turning on the transistor Tr3. Note that when the transistor Tr3 is a p-channel transistor, the constant potential V1 is preferably an H-level potential capable of turning off the transistor Tr3. To turn off the transistor Tr3 in the structure of this embodiment, it is possible to utilize a drop of the gate potential of the transistor Tr3 to L level using leakage current through a gate insulating film of the transistor Tr3. Alternatively, to turn off the transistor Tr3, a different circuit may be used to switch the gate potential of the transistor Tr3 to L level.

In the programmable switch element 100 illustrated in FIG. 1A, configuration data applied to the bit line BL is stored at a node including the other of the source and the drain of the transistor Tr1, the gate of the transistor Tr2, and a wiring to which these electrodes are connected. In this specification, the node including the other of the source and the drain of the transistor Tr1, the gate of the transistor Tr2, and the wiring to which these electrodes are connected is referred to as a node FN1.

In other words, a node is defined as follows, for example: the node FN1 includes the other of the source and the drain of the transistor Tr1, the gate of the transistor Tr2, and the wiring to which these electrodes are connected. A node also includes a wiring that is provided between elements to connect them, and an electrode of a capacitor or the like connected to the wiring.

In the programmable switch element 100 illustrated in FIG. 1A, a potential corresponding to configuration data is held at the node FN1. Turning on the transistor Tr1 allows configuration data applied to the bit line BL to be written into the node FN1. Moreover, turning off the transistor Tr1 allows the node FN1 to hold the potential for a long time.

To prevent a potential change due to charge transfer at the node FN1 and retain configuration data for a long time, the following two features are required: one is extremely low leakage current between the source and the drain of the transistor Tr1, and the other is extremely low leakage current through a gate insulating film of the transistor Tr2.

To prevent a potential change due to charge transfer at the node FN1, the transistor Tr1 is preferably a transistor with extremely low leakage current between its source and drain. Here, low leakage current means that a normalized leakage current per micrometer in channel width at room temperature is 10 zA/µm or lower. Since the leakage current is preferably as low as possible, the normalized leakage current is preferably 1 zA/µm or lower, more preferably 10 yA/µm or lower, still more preferably 1 yA/µm or lower. Note that a voltage between the source and the drain in this case is, for example, approximately 0.1 V, 5 V, or 10 V. An example of a transistor with extremely low leakage current between its source and drain is a transistor in which a semiconductor layer including a channel formation region contains an oxide semiconductor.

To prevent a potential change due to charge transfer at the node FN1, the transistor Tr2 is preferably a transistor with extremely low leakage current through a gate insulating film. The leakage current through the gate insulating film of the transistor Tr2 is preferably as low as the leakage current between the source and the drain of the transistor Tr1.

The leakage current of the transistor Tr2 through the gate insulating film is preferably 10 yA or lower, more preferably 1 yA or lower to prevent a potential change caused by charge transfer at the node FN1. To achieve such leakage current, the thickness of the gate insulating film of the transistor Tr2 is preferably larger than that of the gate insulating film of the transistor Tr3, which is the path transistor.

Note that a leakage current of the transistor Tr2 through the gate insulating film of 10 yA or lower is calculated on the basis of a retention period necessary to hold charge corresponding to configuration data at the node FN1. Specifically, in order to hold charge Q for about 10 years ($t \approx 3 \times 10^8$ s), when the electrostatic capacitance C of the node FN1 is 10 fF and allowable voltage change $\Delta V$ is 0.3 V, it is estimated from Equation (1) that a leakage current I is required to be 10 yA or lower.

$$Q = C \times V > I \times t \qquad (1)$$

In terms of equivalent oxide thickness, the thickness of the gate insulating film that achieves a leakage current of 10 yA or lower, which enables the above-described charge retention, is estimated at approximately 6 nm or more in a transistor with a channel width and length of 1 µm and 1 µm.

Estimation of the thickness of the gate insulating film is explained using a graph of FIG. 9 in the following non-patent document: Kazunari Ishimaru, "45 nm/32 nm CMOS—Challenge and perspective", *Solid-State Electronics*, Vol. 52, 2008, pp. 1266-1273.

FIG. 9 in the non-patent document is a graph with the thickness (nm) of an insulating film as the horizontal axis and leakage current per unit area ($A/cm^2$) as the vertical axis. From the slope of the straight line representing the characteristics of silicon oxide in this graph, the amount of change in the leakage current per unit area per 1 nm thickness can be estimated at approximately $10^{-4}$ $A/cm^2$. According to FIG. 9 in the non-patent document, the leakage current with a 2-nm-thick silicon oxide film can be estimated at $1 \times 10^{-1}$ $A/cm^2$, that is, $1 \times 10^{-9}$ $A/µm^2$. When the above amount of change in the leakage current per unit area per 1 nm thickness is added based on this value, the leakage current per unit area with a gate insulating film with an equivalent oxide thickness of about 6 nm can be estimated at approximately $1 \times 10^{-25}$ $A/µm^2$. From this leakage current per unit area, the thickness of the gate insulating film to achieve a leakage current of 10 yA or lower in a transistor with a channel width and length of 1 µm and 1 µm can be estimated at approximately 6 nm or more. Note that the gate insulating film in the transistor Tr3 is formed to 2 nm or less; thus, the gate insulating film of the transistor Tr2 is thicker than that of the transistor Tr3.

In the programmable switch element 100 illustrated in FIG. 1A, the transistor Tr2 is configured to charge and discharge the gate capacitance of the transistor Tr3. For this reason, the driving capability of the transistor Tr2 may be relatively lower than that of the transistor Tr3. Accordingly, the transistor Tr2 can have a thicker gate insulating film than the transistor Tr3 and have extremely low leakage current, which is lower than or equal to the leakage current between the source and the drain of the transistor Tr1.

To prevent a potential change due to charge transfer at the node FN1, the transistors Tr1 and Tr2 are preferably transistors in which a semiconductor layer including a channel formation region contains an oxide semiconductor.

A transistor using an oxide semiconductor for a semiconductor layer including a channel formation region (OS transistor), which can be used as the transistors Tr1 and Tr2, may have lower driving capability than a transistor using silicon for a semiconductor layer including a channel formation region (Si transistor), which can be used as the path transistor. For this reason, a gate insulating film of the OS transistor can be thicker than that of the Si transistor. In addition, the OS transistor can be a transistor with extremely low leakage current between its source and drain as described above.

Accordingly, in the programmable switch element 100 illustrated in FIG. 1A, the use of OS transistors including a thicker gate insulating film than a Si transistor as the transistors Tr1 and Tr2 enables long-term charge retention at the node FN1.

The transistor Tr1 is a transistor with extremely low leakage current between the source and the drain and the transistor Tr2 is a transistor with extremely low leakage current through the gate insulating film, whereby the node FN1 in the programmable switch element 100 can serve as nonvolatile memory, which is capable of storing data even after power supply is stopped. Thus, configuration data written into the node FN1 can be continuously stored at the node FN1 until the transistor Tr1 is turned on again. This can omit processing of loading configuration data successively from an external memory device, leading to lower power consumption on start-up, a shorter start-up time, and the like.

The transistor Tr2 is a transistor with a thick gate insulating film and extremely low leakage current through the gate insulating film. Moreover, the transistor Tr2 is preferably an OS transistor like the transistor Tr1, in which case the amount of current flowing through the transistor Tr2 when the transistor Tr2 is off can be reduced. Thus, power consumption of the programmable switch element 100 can be reduced.

In the programmable switch element 100 illustrated in FIG. 1A, the transistor Tr3 is preferably a Si transistor, in which case the transistor Tr3 can be miniaturized so that its driving capability is enhanced. Thus, the switching characteristics of the transistor Tr3 as the path transistor can be improved. Since the node FN1 is not connected to the gate of the Si transistor, the charge retention characteristics of the node FN1 are not adversely affected even if the amount of leakage current flowing through the gate insulating film of the Si transistor is increased because of miniaturization.

FIG. 1B illustrates an example of a cross-sectional schematic view of the transistors Tr1 to Tr3 that the programmable switch element 100 in FIG. 1A can employ. In FIG. 1B, reference signs representing the transistors Tr1 to Tr3, the bit line BL, the word line WL, the wiring VL1, the input terminal IN, and the output terminal OUT in FIG. 1A are used to denote corresponding transistors and conductive films.

This embodiment shows an example where the transistor Tr3 is formed on a single crystal silicon substrate and the transistors Tr1 and Tr2 using an oxide semiconductor for an active layer are formed over the transistor Tr3. The transistor Tr3 may include a thin semiconductor layer of silicon, germanium, or the like in an amorphous, microcrystalline, polycrystalline, or single crystal state.

In this embodiment, the transistors Tr1 and Tr2 are transistors in which an oxide semiconductor provided in the same layer is used for a semiconductor layer including a channel formation region. Alternatively, the transistors Tr1 and Tr2 may be provided in different layers and stacked. In this structure, the transistor Tr2 does not necessarily use an oxide semiconductor for the semiconductor layer including a channel formation region as long as the transistor Tr2 includes a thicker gate insulating film than the transistor Tr3.

The chip area of a PLD can be reduced with the use of a programmable switch element having a stacked structure of the Si transistor and the OS transistors illustrated in FIG. 1B.

In FIG. 1B, the n-channel transistor Tr3 is formed on a semiconductor substrate 111.

The semiconductor substrate 111 can be, for example, an n-type or p-type silicon substrate, germanium substrate, silicon germanium substrate, or compound semiconductor substrate (e.g., GaAs substrate, InP substrate, GaN substrate, SiC substrate, GaP substrate, GaInAsP substrate, or ZnSe substrate). In FIG. 1B, a single crystal silicon substrate having n-type conductivity is used.

The transistor Tr3 is electrically isolated from other transistors existing in the same layer by element isolation insulating films 115. The element isolation insulating films 115 can be formed by a local oxidation of silicon (LOCOS) method, a trench isolation method, or the like.

Specifically, the transistor Tr3 includes impurity regions 112 and 113 that are formed in the semiconductor substrate 111 and function as a source region and a drain region, a gate electrode 116, and a gate insulating film 114 provided between the semiconductor substrate 111 and the gate electrode 116. The gate electrode 116 overlaps a channel formation region between the impurity regions 112 and 113 with the gate insulating film 114 positioned between the gate electrode 116 and the channel formation region.

An insulating film 117 is provided over the transistor Tr3. Openings are formed in the insulating film 117. The input terminal IN and the output terminal OUT that are wirings in contact with the impurity regions 112 and 113, respectively, and a wiring 141 in contact with the gate electrode 116 are formed in the openings. The wiring VL1 is formed in the same layer as the input terminal IN, the output terminal OUT, and the wiring 141.

An insulating film 118 is provided over the input terminal IN, the output terminal OUT, the wiring 141, and the wiring VL1. Openings are formed in the insulating film 118. A wiring 119 in contact with the wiring VL1 and a wiring 142 in contact with the wiring 141 are formed in the openings.

In FIG. 1B, the transistor Tr1 and the transistor Tr2 are formed over the insulating film 118.

The transistor Tr1 includes, over the insulating film 118, a semiconductor layer 131 containing an oxide semiconductor, conductive films 133 and 134 that are over the semiconductor layer 131 and function as source and drain electrodes, a gate insulating film 137 over the semiconductor layer 131 and the conductive films 133 and 134, and the word line WL over the gate insulating film 137. Part of the word line WL that overlaps the semiconductor layer 131 between the conductive films 133 and 134 functions as a gate electrode.

The transistor Tr2 includes, over the insulating film 118, a semiconductor layer 132 containing an oxide semiconductor, conductive films 135 and 136 that are over the semiconductor layer 132 and function as source and drain electrodes, the gate insulating film 137 over the semiconductor layer 132 and the conductive films 135 and 136, and a conductive film 139 over the gate insulating film 137. Part of the conductive film 139 that overlaps the semiconductor layer 132 between the conductive films 135 and 136 functions as a gate electrode. The conductive film 135 is connected to the wiring 119. The conductive film 136 is connected to the wiring 142.

An opening reaching the conductive film 134 is formed in the gate insulating film 137. In the opening, a wiring that is extended to reach the gate electrode of the transistor Tr2 and functions as the node FN1 is provided.

An opening reaching the conductive film 133 is formed in the gate insulating film 137 and an insulating film 138. The bit line BL is provided in the opening.

As the gate insulating films 114 and 137, an inorganic insulating film may be used, for example. The inorganic insulating film preferably has a single-layer or multi-layer structure including any of a silicon nitride film, a silicon oxynitride film, a silicon nitride oxide film, and the like.

Each of the insulating films 117, 118, and 138 is preferably a single layer or a multilayer including an inorganic insulating film or an organic insulating film. The organic insulating film preferably has a single-layer or a multi-layer structure containing polyimide, acrylic, or the like.

The semiconductor layers 131 and 132 are preferably formed using an oxide semiconductor. An oxide semiconductor will be described in detail in Embodiment 6.

The gate electrode 116, the input terminal IN, the output terminal OUT, the wiring 141, the wiring VL1, the wiring 119, the wiring 142, the conductive film 133, the conductive film 134, the conductive film 135, the conductive film 136, the conductive film 139, the word line WL, and the bit line BL are each preferably formed using a single layer or a stack containing a metal material such as aluminum, copper, titanium, tantalum, or tungsten, for example.

In FIG. 1B, the transistors Tr1 and Tr2 have the gate electrode on at least one side of the semiconductor layer; alternatively, they may have a pair of gate electrodes with the semiconductor layer positioned therebetween.

When the transistors Tr1 and Tr2 include a pair of gate electrodes with the semiconductor layer positioned therebetween, one of the gate electrodes may be supplied with a signal for controlling the on/off state, and the other of the gate electrodes may be supplied with a potential from another element. In the latter case, potentials with the same level may be supplied to the pair of gate electrodes, or a fixed potential such as a ground potential may be supplied only to the other of the gate electrodes. When the level of a potential supplied to the other of the gate electrodes is controlled, the threshold voltage of the transistors Tr1 and Tr2 can be controlled.

The semiconductor layers 131 and 132 are not limited to a single film of an oxide semiconductor and may be a stack including a plurality of oxide semiconductor films.

In the programmable switch element 100 in this embodiment, an oxide semiconductor is used for the semiconductor layers including the channel formation regions in the transistors Tr1 and Tr2 as described with FIG. 1B. The gate insulating films of the transistors Tr1 and Tr2 are thicker than the gate insulating film of the Si transistor that can be used as the path transistor.

Accordingly, in the programmable switch element 100 illustrated in FIG. 1B, the use of OS transistors including a thicker gate insulating film than a Si transistor as the transistors Tr1 and Tr2 enables long-term charge retention at the node FN1. Thus, leakage current that is increased because of miniaturization of the Si transistor can be suppressed, and the switching characteristics of the path transistor can be improved.

Figure 2:
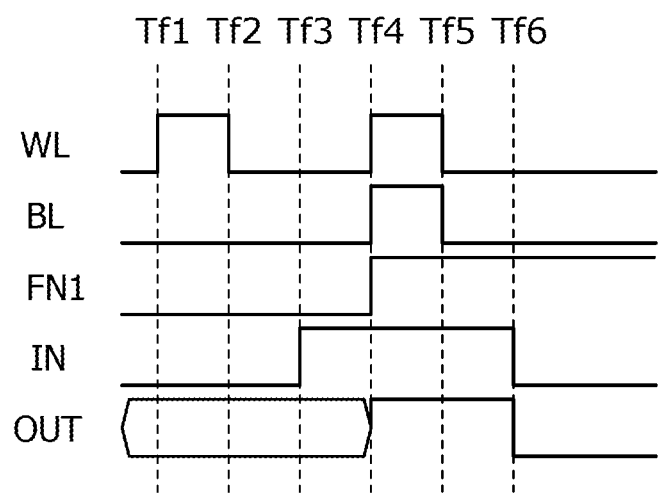
FIG. 2 is a timing chart of one embodiment of the present invention.

Next, an example of the operation of the programmable switch element 100 in FIG. 1A will be described with reference to a timing chart in FIG. 2. In the following description, as configuration data written into the programmable switch element 100, an L-level potential corresponds to data "0" and an H-level potential corresponds to data "1".

From the time Tf1 to the time Tf2, the word line WL is set at H level and the bit line BL is set at L Level. This operation corresponds to writing of configuration data "0" into the node FN1. Then, the potential of the node FN1 becomes L level, so that the transistor Tr2 is turned off and the gate potential of the transistor Tr3 is set at L level. That is, the transistor Tr3 serving as the path transistor is turned off.

From the time Tf2 to the time Tf4, the word line WL is set at L level. This operation keeps configuration data "0" written into the node FN1. Since the transistor Tr3 serving as the path transistor is off, the potential of the output terminal OUT is floating regardless of the potential of the input terminal N. Note that the potential of the output terminal OUT can be kept constant when a latch circuit is connected to the output terminal OUT.

From the time Tf4 to the time Tf5, the word line WL is set at H level and the bit line BL is set at H Level. This operation corresponds to writing of configuration data "1" into the node FN1. Then, the potential of the node FN1 becomes H level, so that the transistor Tr2 is turned on and the gate potential of the transistor Tr3 is set at the H-level potential, which is the potential of the wiring VL1. That is, the transistor Tr3 serving as the path transistor is turned on.

After the time Tf5, the word line WL is set at L level. This operation keeps configuration data "1" written into the node FN1. Since the transistor Tr3 serving as the path transistor is on, the potential of the input terminal N is transmitted to the output terminal OUT. In other words, from the time Tf5 to the time Tf6, the input terminal N is at H level and the output terminal OUT is at H level; after the time Tf6, the input terminal N is at L level and the output terminal OUT is at L level.

As initial configuration data written into the programmable switch element 100, it is effective to write data "0", that is, an L-level potential into the node FN1 immediately after reset. In this case, the transistor Tr3 can be turned off immediately after reset by turning off the transistor Tr2 and making the gate potential of the transistor Tr3 L-level; thus, unintended short circuit between the input terminal IN and the output terminal OUT can be prevented easily.

Figure 3A:
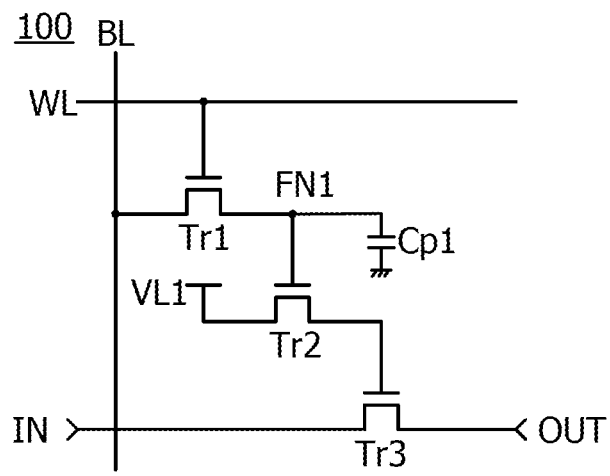
FIGS. 3A and 3B are circuit diagrams of one embodiment of the present invention.

Note that in FIG. 1A, a potential held at the node FN1 is retained at the node where the other of the source and the drain of the transistor Tr1 and the gate of the transistor Tr2 are connected; alternatively, a capacitor may be additionally provided to hold a potential. For example, a capacitor Cp1 is provided as in a circuit diagram of FIG. 3A. The capacitor Cp1 is provided so that one electrode is connected to the node FN1 and the other electrode is grounded (is kept at a ground potential, which is a fixed potential).

Figure 3B:
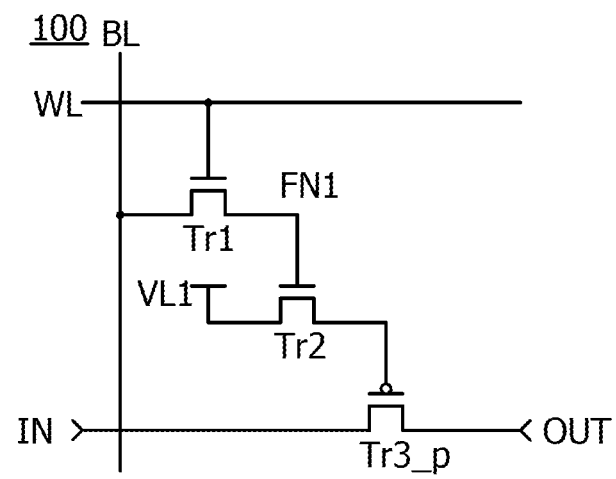

Although the transistors Tr1 to Tr3 are n-channel transistors in FIG. 1A, some of them may be a p-channel transistor. For example, the transistor Tr3 can be a p-channel transistor Tr3_p as in a circuit diagram of FIG. 3B.

Figure 4A:
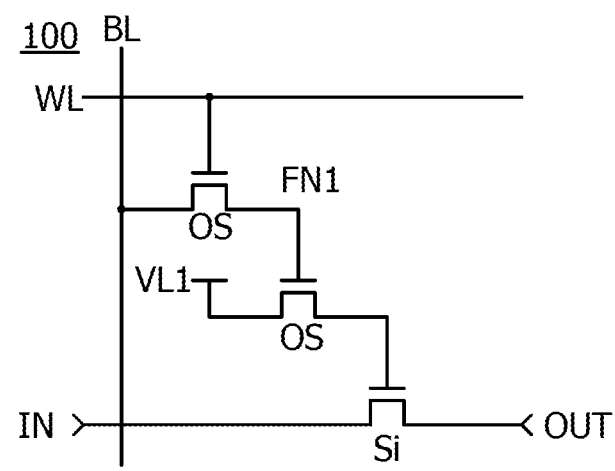
FIGS. 4A and 4B are circuit diagrams of one embodiment of the present invention.

In the structure illustrated in FIGS. 1A and 1B, the transistors Tr1 and Tr2 are OS transistors and the transistor Tr3 is a Si transistor. FIG. 4A is a circuit diagram in which "OS" is used to indicate that a semiconductor layer including a channel formation region of the OS transistor contains an oxide semiconductor and "Si" is used to indicate that a semiconductor layer including a channel formation region of the Si transistor contains silicon.

Figure 4B:
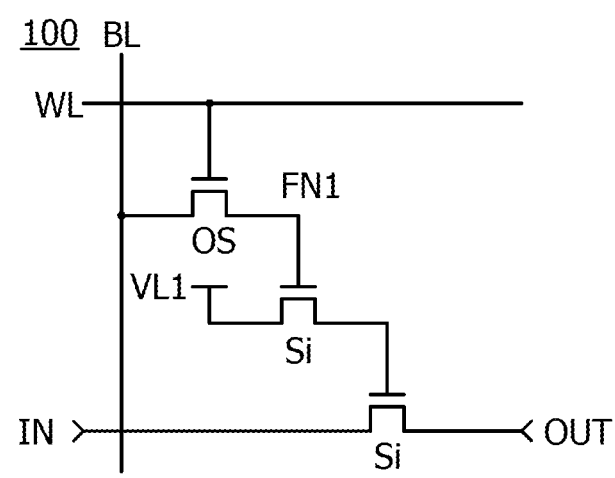

Although the transistor Tr2 needs to have a structure with low leakage current through the gate insulating film as described above, there is no particular limitation on the kind of semiconductor contained in the semiconductor layer including a channel formation region. For this reason, the transistor Tr2 can be a Si transistor as illustrated in FIG. 4B.

Figure 5A:
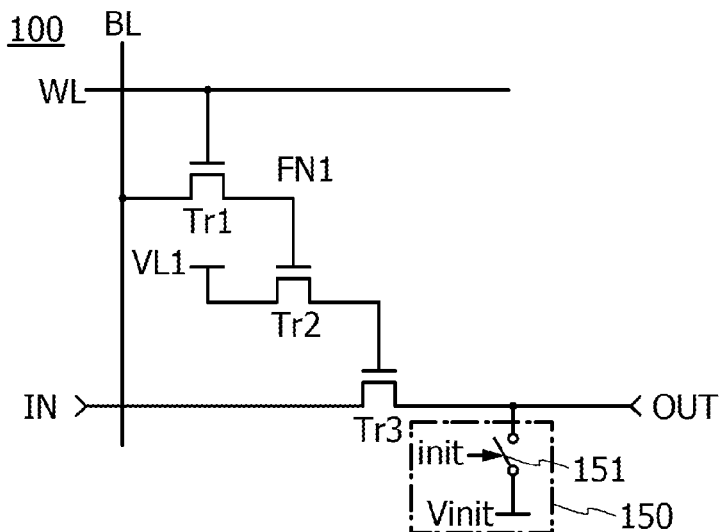
FIGS. 5A to 5C are circuit diagrams of one embodiment of the present invention.
Figure 5B:
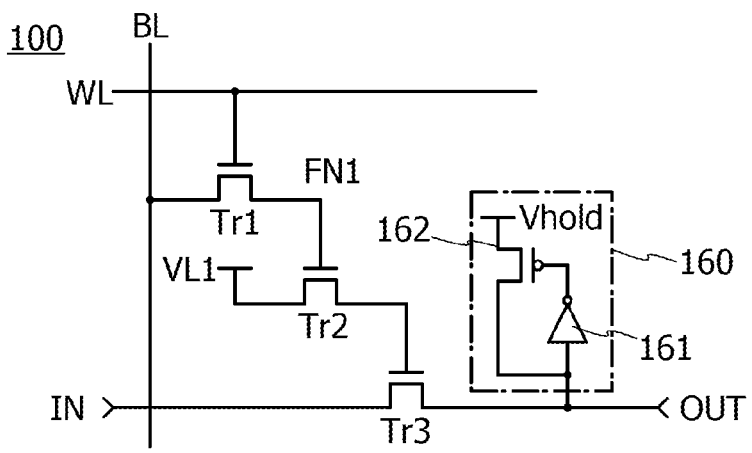
Figure 5C:
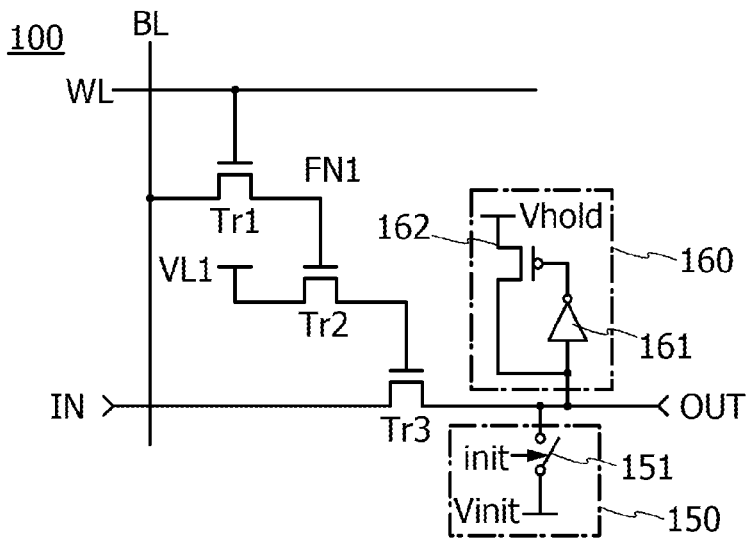

Furthermore, a switch for initializing the potential of the output terminal OUT or a latch for holding the potential of the output terminal OUT may be connected to the programmable switch element 100 in this embodiment. FIGS. 5A to 5C illustrate structures where a reset circuit 150 for initializing the potential of the output terminal OUT and/or a latch circuit 160 for holding the potential of the output terminal OUT is/are connected to the output terminal OUT.

FIG. 5A is a circuit diagram showing the programmable switch element 100 in FIG. 1A in addition to the reset circuit 150 including a switch 151 connected to a wiring supplied with an initialization potential Vinit.

In one embodiment of the present invention, when the reset circuit 150 is connected to the programmable switch element 100 illustrated in FIG. 1A, the potential of the output terminal OUT can be kept at L level after a PLD is powered on. Consequently, even if the output terminal OUT remains at an intermediate potential, flow-through current can be prevented from occurring in a programmable logic element having an input terminal IN connected to this output terminal OUT.

FIG. 5B is a circuit diagram illustrating the programmable switch element 100 in FIG. 1A in addition to the latch circuit 160 that includes an inverter circuit 161 and a p-channel transistor 162 connected to a wiring for supplying a hold potential Vhold.

In one embodiment of the present invention, when the latch circuit 160 is connected to the programmable switch element 100 illustrated in FIG. 1A, the potential of the output terminal OUT can be kept at either H level or L level. Thus, even if the output terminal OUT remains at an intermediate potential, flow-through current can be prevented from occurring in a programmable logic element having an input terminal IN connected to this output terminal OUT.

As illustrated in FIG. 5C, the programmable switch element 100 in FIG. 1A may be provided with a combination of the reset circuit 150 and the latch circuit 160.

As has been described above, in the programmable switch element 100 of one embodiment of the present invention, an oxide semiconductor is used for the semiconductor layer including a channel formation region of the transistor Tr1. The gate insulating film of the transistor Tr2 is thicker than the gate insulating film of the Si transistor that can be used as the path transistor.

Accordingly, in the programmable switch element, charge at the node FN1 can be retained for a long time by using an OS transistor with low leakage current as the transistor Tr1 and a transistor including a thick gate insulating film as the transistor Tr2. Thus, leakage current that is increased because of miniaturization of a Si transistor can be suppressed, and the switching characteristics of the path transistor can be improved.

This embodiment can be implemented in appropriate combination with any of the other embodiments.

Embodiment 2

In this embodiment, a structure of a programmable switch element different from those in Embodiment 1 will be described.

Figure 6A:
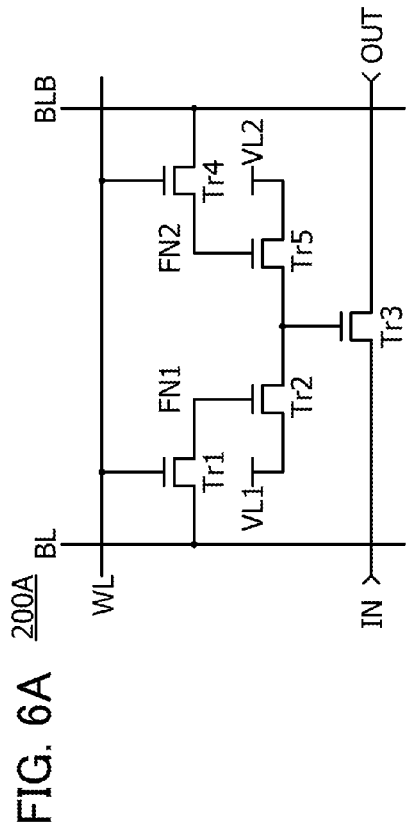
FIGS. 6A and 6B are a circuit diagram and a cross-sectional schematic view of one embodiment of the present invention.
Figure 6B:
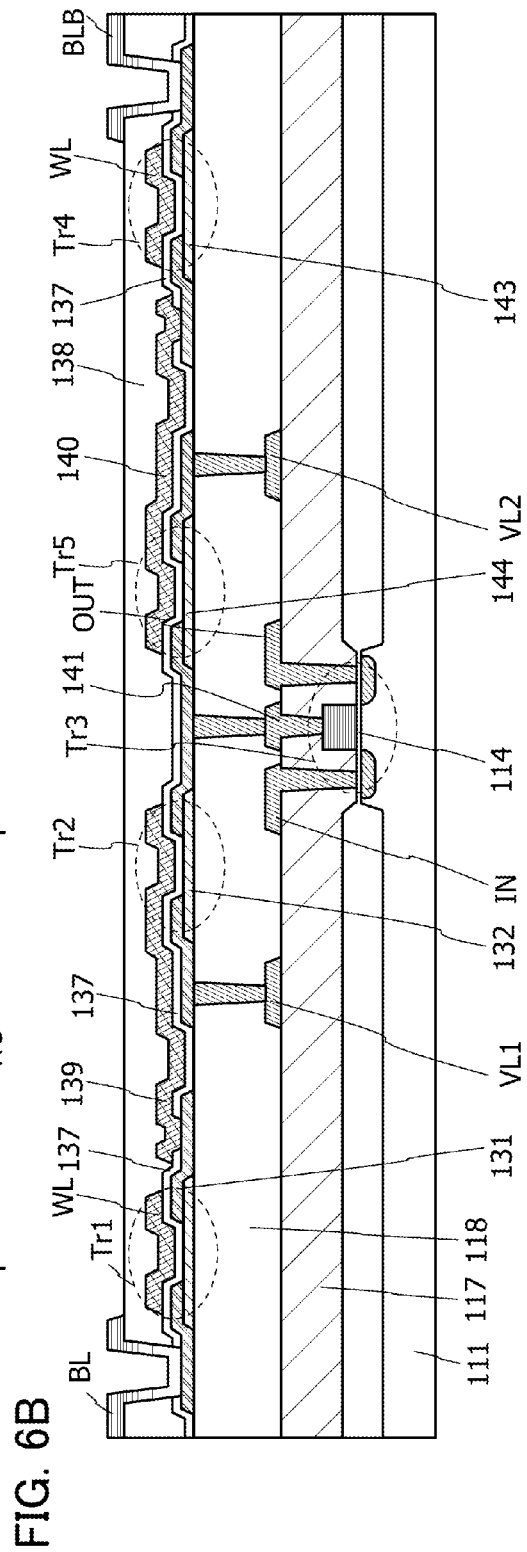

FIG. 6A is a circuit diagram illustrating the structure of a programmable switch element. FIG. 6B is a cross-sectional schematic view corresponding to the circuit diagram. Note that in this embodiment, components common to Embodiment 1 are denoted by the same reference numerals and the description is omitted in some cases.

A programmable switch element 200A illustrated in FIG. 6A includes the transistor Tr1, the transistor Tr2, the transistor Tr3, a transistor Tr4, and a transistor Tr5. Note that the transistors Tr1 to Tr5 are n-channel transistors in FIG. 6A. The circuit diagram in FIG. 6A of this embodiment illustrates a structure where the transistors Tr4 and Tr5 are added to the structure in FIG. 1A of Embodiment 1.

As in FIG. 1A of Embodiment 1, the transistor Tr1 has a function of controlling writing of configuration data into the programmable switch element 200A in accordance with a word signal.

As in FIG. 1A of Embodiment 1, the transistor Tr2 has a function of controlling the on/off state of the transistor Tr3 in accordance with configuration data written into the programmable switch element 200A.

The transistor Tr4 has a function of controlling writing of a signal obtained by inverting the logic of configuration data (also referred to as inverted configuration data) into the programmable switch element 200A in accordance with a word signal. A gate of the transistor Tr4 is connected to the word line WL for applying a word signal. One of a source and a drain of the transistor Tr4 is connected to an inverted bit line BLB for applying inverted configuration data.

The transistor Tr5 has a function of controlling the on/off state of the transistor Tr3 in accordance with configuration data written into the programmable switch element 200A. A gate of the transistor Tr5 is connected to the other of the source and the drain of the transistor Tr4. One of a source and a drain of the transistor Tr5 is connected to a wiring VL2 for applying a constant potential V2.

The transistor Tr3 functions as a path transistor that controls continuity between the input terminal N and the output terminal OUT in accordance with the potential of the gate of the transistor Tr3; whether the constant potential V1 is applied to the gate of the transistor Tr3 or not is determined by the on/off state of the transistor Tr2. The gate of the transistor Tr3 is connected to the other of the source and the drain of the transistor Tr2 and the other of the source and the drain of the transistor Tr5. One of the source and the drain of the transistor Tr3 is connected to the input terminal N. The other of the source and the drain of the transistor Tr3 is connected to the output terminal OUT.

When the transistor Tr3 is an n-channel transistor, the constant potential V1 is an H-level potential capable of turning on the transistor Tr3, and the constant potential V2 is an L-level potential capable of turning off the transistor Tr3.

In the programmable switch element 200A illustrated in FIG. 6A, configuration data applied to the bit line BL is stored at a node including the other of the source and the drain of the transistor Tr1, the gate of the transistor Tr2, and a wiring to which these electrodes are connected. Inverted configuration data that is supplied to the inverted bit line BLB is held at a node including the other of the source and the drain of the transistor Tr4, the gate of the transistor Tr5, and a wiring to which these electrodes are connected. In this specification, the node including the other of the source and the drain of the transistor Tr4, the gate of the transistor Tr5, and the wiring to which these electrodes are connected is referred to as a node FN2.

In the programmable switch element 200A illustrated in FIG. 6A, the node FN1 holds a potential corresponding to configuration data, and the node FN2 holds a potential corresponding to inverted configuration data. Configuration data applied to the bit line BL and the inverted configuration data applied to the inverted bit line BLB are written into the node FN1 and the node FN2, respectively, by turning on the transistor Tr1 and the transistor Tr4. Moreover, the potentials can be held at the node FN1 and the node FN2 for a long time by turning off the transistor Tr1 and the transistor Tr4.

To prevent a potential change due to charge transfer at the node FN1 and the node FN2 and retain configuration data and inverted configuration data for a long time, the following two features are required: one is extremely low leakage current between the source and the drain of the transistors Tr1 and Tr4, and the other is extremely low leakage current through a gate insulating film of the transistors Tr2 and Tr5.

To prevent a potential change caused by charge transfer at the node FN1 and the node FN2, each of the transistors Tr1 and Tr4 is preferably a transistor with extremely low leakage current between its source and drain. An example of a transistor with extremely low leakage current between its source and drain is a transistor in which a semiconductor layer including a channel formation region contains an oxide semiconductor.

To prevent a potential change due to charge transfer at the node FN1 and the node FN2, each of the transistors Tr2 and Tr5 is preferably a transistor with extremely low leakage current through a gate insulating film. An example of a transistor with extremely low leakage current through a gate insulating film is a transistor in which the thickness of a gate insulating film is sufficiently larger than that of the gate insulating film of the transistor Tr3 serving as the path transistor.

Note that the leakage current through the gate insulating film of the transistors Tr2 and Tr5 is preferably as low as the leakage current between the source and the drain of the transistors Tr1 and Tr4.

The leakage current of the transistors Tr2 and Tr5 through the gate insulating film is preferably 10 yA or lower, more preferably 1 yA or lower to prevent a potential change due to charge transfer at the node FN1 and the node FN2. To achieve such leakage current, the thickness of the gate insulating film of the transistors Tr2 and Tr5 is preferably larger than that of the gate insulating film of the transistor Tr3, which is the path transistor.

Note that a leakage current through the gate insulating film of the transistors Tr2 and Tr5 of 10 yA or lower can be estimated in a manner similar to the description of the leakage current through the gate insulating film of the transistor Tr2 in Embodiment 1.

In terms of equivalent oxide thickness, the thickness of the gate insulating film that achieves a leakage current of 10 yA or lower, which is necessary for charge retention, is estimated at approximately 6 nm or more in a transistor with a channel width and length of 1 μm and 1 μm.

In the programmable switch element 200A illustrated in FIG. 6A, the transistors Tr2 and Tr5 are configured to charge and discharge the gate capacitance of the transistor Tr3. For this reason, the driving capability of the transistors Tr2 and Tr5 may be relatively lower than that of the transistor Tr3. Accordingly, the transistors Tr2 and Tr5 can have a thicker gate insulating film than the transistor Tr3 and have extremely low leakage current, which is lower than or equal to the leakage current between the source and the drain of the transistors Tr1 and Tr4.

To prevent a potential change caused by charge transfer at the node FN1 and the node FN2, the transistors Tr1, Tr2, Tr4, and Tr5 are preferably transistors in which a semiconductor layer including a channel formation region contains an oxide semiconductor.

A transistor using an oxide semiconductor for a semiconductor layer including a channel formation region (OS transistor), which can be used as the transistors Tr1, Tr2, Tr4, and Tr5, may have lower driving capability than a transistor using silicon for a semiconductor layer including a channel formation region (Si transistor), which can be used as the path transistor. For this reason, a gate insulating film of the OS transistor can be thicker than that of the Si transistor. In addition, the OS transistor can be a transistor with extremely low leakage current between its source and drain as described above.

Accordingly, in the programmable switch element 200A illustrated in FIG. 6A, the use of OS transistors including a thicker gate insulating film than a Si transistor as the transistors Tr1, Tr2, Tr4, and Tr5 enables long-term charge retention at the node FN1 and the node FN2.

The transistors Tr1 and Tr4 are transistors with extremely low leakage current between the source and the drain and the transistors Tr2 and Tr5 are transistors with extremely low leakage current through the gate insulating film, whereby the node FN1 and the node FN2 in the programmable switch element 200A can serve as nonvolatile memory, which is capable of storing data even after power supply is stopped. Thus, configuration data and inverted configuration data written into the node FN1 and the node FN2 can be continuously stored at the node FN1 and the node FN2 until the transistors Tr1 and Tr4 are turned on again. This can omit processing of loading configuration data successively from an external memory device, leading to lower power consumption on start-up, a shorter start-up time, and the like.

The transistors Tr2 and Tr5 are transistors with a thick gate insulating film and extremely low leakage current through the gate insulating film. Moreover, the transistors Tr2 and Tr5 are preferably OS transistors like the transistors Tr1 and Tr4, in which case the amount of current flowing through the transistors Tr2 and Tr5 when the transistors Tr2 and Tr5 are off can be reduced. Thus, power consumption of the programmable switch element 200A can be reduced.

In the programmable switch element 200A illustrated in FIG. 6A, the transistor Tr3 is preferably a Si transistor, in which case the transistor Tr3 can be miniaturized so that its driving capability is enhanced. Thus, the switching characteristics of the transistor Tr3 as the path transistor can be improved. Since the node FN1 and the node FN2 are not connected to the gate of the Si transistor, the charge retention characteristics of the node FN1 and the node FN2 are not adversely affected even if the amount of leakage current flowing through the gate insulating film of the Si transistor is increased because of miniaturization.

FIG. 6B illustrates an example of a cross-sectional schematic view of the transistors Tr1 to Tr5 that the programmable switch element 200A in FIG. 6A can employ. In FIG. 6B, reference signs representing the transistors Tr1 to Tr5, the bit line BL, the inverted bit line BLB, the word line WL, the wiring VL1, the wiring VL2, the input terminal IN, and the output terminal OUT in FIG. 6A are used to denote corresponding transistors and conductive films.

This embodiment shows an example where the transistor Tr3 is formed on a single crystal silicon substrate and the transistors Tr1, Tr2, Tr4, and Tr5 using an oxide semiconductor for an active layer are formed over the transistor Tr3.

In this embodiment, the transistors Tr1, Tr2, Tr4, and Tr5 are transistors in which an oxide semiconductor provided in the same layer is used for a semiconductor layer including a channel formation region. Alternatively, the transistors Tr1, Tr2, Tr4, and Tr5 may be provided in different layers and stacked. In this structure, the transistors Tr2 and Tr5 do not necessarily use an oxide semiconductor for the semiconductor layer including a channel formation region as long as the transistors Tr2 and Tr5 include a thicker gate insulating film than the transistor Tr3.

The chip area of a PLD can be reduced with the use of a programmable switch element having a stacked structure of the Si transistor and the OS transistors illustrated in FIG. 6B.

In FIG. 6B, the n-channel transistor Tr3 including the gate insulating film 114 is formed on the semiconductor substrate 111.

The insulating film 117 is provided over the transistor Tr3. Openings are formed in the insulating film 117. The input terminal IN, the output terminal OUT, and the wiring 141 are formed in the openings. The wiring VL1 and the wiring VL2 are formed in the same layer as the input terminal IN, the output terminal OUT, and the wiring 141.

The insulating film 118 is provided over the input terminal IN, the output terminal OUT, the wiring 141, the wiring VL1, and the wiring VL2.

In FIG. 6B, the transistors Tr1, Tr2, Tr4, and Tr5 are formed over the insulating film 118.

The transistor Tr1 includes the gate insulating film 137, the semiconductor layer 131, and the word line WL part of which functions as the gate electrode. The insulating film 138 is provided over the transistor Tr1. An opening is formed in the insulating film 138. The bit line BL connected to the transistor Tr1 is formed in the opening.

The transistor Tr2 includes the gate insulating film 137, the semiconductor layer 132, and the conductive film 139 part of which functions as the gate electrode.

The transistor Tr4 includes the gate insulating film 137, the semiconductor layer 143, and the word line WL part of which functions as the gate electrode. The insulating film 138 is provided over the transistor Tr4. An opening is formed in the insulating film 138. The inverted bit line BLB connected to the transistor Tr4 is formed in the opening.

The transistor Tr5 includes the gate insulating film 137, the semiconductor layer 144, and the conductive film 140 part of which functions as the gate electrode.

The semiconductor layers 131, 132, 143, and 144 are preferably formed using an oxide semiconductor. An oxide semiconductor will be described in detail in Embodiment 6.

The semiconductor layers 131, 132, 143, and 144 are not limited to a single film of an oxide semiconductor and may be a stack including a plurality of oxide semiconductor films.

In FIG. 6B, the transistors Tr1, Tr2, Tr4, and Tr5 have the gate electrode on at least one side of the semiconductor layer; alternatively, they may have a pair of gate electrodes with the semiconductor layer positioned therebetween.

When the transistors Tr1, Tr2, Tr4, and Tr5 include a pair of gate electrodes with the semiconductor layer positioned therebetween, one of the gate electrodes may be supplied with a signal for controlling the on/off state, and the other of the gate electrodes may be supplied with a potential from another element. In the latter case, potentials with the same level may be supplied to the pair of gate electrodes, or a fixed potential such as a ground potential may be supplied only to the other of the gate electrodes. When the level of a potential supplied to the other of the gate electrodes is controlled, the threshold voltage of the transistors Tr1, Tr2, Tr4, and Tr5 can be controlled.

In the programmable switch element 200A in this embodiment, an oxide semiconductor is used for the semiconductor layers including the channel formation regions in the transistors Tr1, Tr2, Tr4, and Tr5 as described with FIG. 6B. The gate insulating films of the transistors Tr1, Tr2, Tr4, and Tr5 are thicker than the gate insulating film of the Si transistor that can be used as the path transistor.

Accordingly, in the programmable switch element 200A illustrated in FIG. 6B, the use of OS transistors including a thicker gate insulating film than a Si transistor as the transistors Tr1, Tr2, Tr4, and Tr5 enables long-term charge retention at the node FN1 and the node FN2. Thus, leakage current that is increased because of miniaturization of the Si transistor can be suppressed, and the switching characteristics of the path transistor can be improved.

Figure 7A:
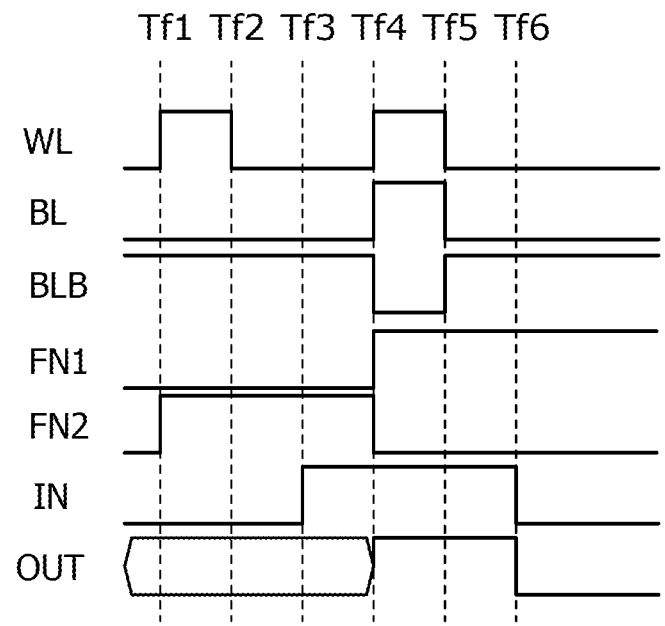
FIGS. 7A and 7B are timing charts of one embodiment of the present invention.
Figure 7B:
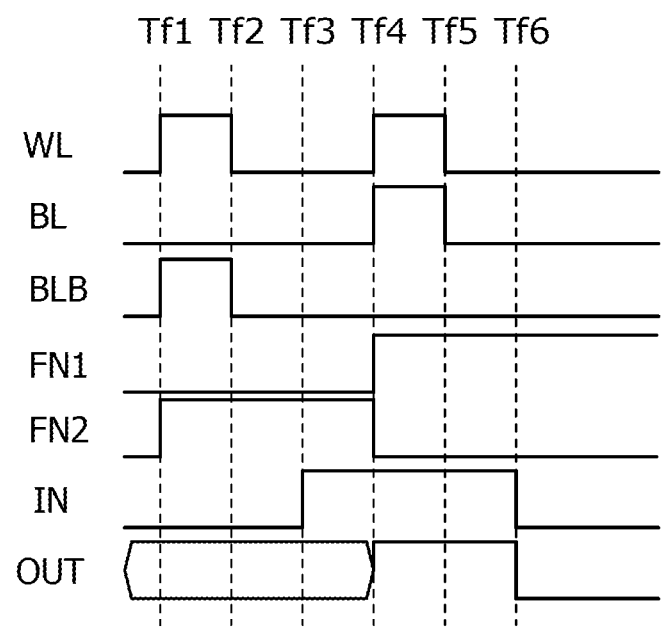

Next, an example of the operation of the programmable switch element 200A in FIG. 6A will be described with reference to timing charts in FIGS. 7A and 7B. In the following description, as configuration data written into the programmable switch element 200A, an L-level potential corresponds to data "0" and an H-level potential corresponds to data "1". Note that in the following description, a signal obtained by inverting the logic of configuration data is referred to as inverted configuration data. Inverted configuration data can be represented in a manner similar to configuration data.

First, the timing chart in FIG. 7A will be described.

From the time Tf1 to the time Tf2, the word line WL is set at H level, the bit line BL is set at L Level, and the inverted bit line BLB is set at H level. This operation corresponds to writing of configuration data "0" into the node FN1 and writing of inverted configuration data "1" into the node FN2. Then, the potential of the node FN1 becomes L level and the potential of the node FN2 becomes H level, so that the transistor Tr2 is turned off and the transistor Tr5 is turned on; thus, the gate potential of the transistor Tr3 becomes the L-level potential, which is the potential of the wiring VL2. That is, the transistor Tr3 serving as the path transistor is turned off.

From the time Tf2 to the time Tf4, the word line WL is set at L level. This operation keeps configuration data "0" written into the node FN1 and inverted configuration data "1" written into the node FN2. Since the transistor Tr3 serving as the path transistor is off, the potential of the output terminal OUT is floating regardless of the potential of the input terminal N. Note that the potential of the output terminal OUT can be kept constant when a latch circuit is connected to the output terminal OUT.

From the time Tf4 to the time Tf5, the word line WL is set at H level, the bit line BL is set at H Level, and the inverted bit line BLB is set at L level. This operation corresponds to writing of configuration data "1" into the node FN1 and writing of inverted configuration data "0" into the node FN2. Then, the potential of the node FN1 becomes H level and the potential of the node FN2 becomes L level, so that the transistor Tr2 is turned on and the transistor Tr5 is turned off; thus, the gate potential of the transistor Tr3 is set at the H-level potential, which is the potential of the wiring VL1. That is, the transistor Tr3 serving as the path transistor is turned on.

After the time Tf5, the word line WL is set at L level. This operation keeps configuration data "1" written into the node FN1 and inverted configuration data "0" written into the node FN2. Since the transistor Tr3 serving as the path transistor is on, the potential of the input terminal N is transmitted to the output terminal OUT. In other words, from the time Tf5 to the time Tf6, the input terminal N is at H level and the output terminal OUT is at H level; after the time Tf6, the input terminal IN is at L level and the output terminal OUT is at L level.

As initial configuration data written into the programmable switch element 200A, it is effective to write data "0", that is, an L-level potential into the node FN1 and write data "1", that is, an H-level potential into the node FN2 immediately after reset. In this case, the transistor Tr2 can be turned off immediately after reset, thereby easily preventing unintended short circuit between the input terminal N and the output terminal OUT.

Note that in periods other than the period between the time Tf1 and the time Tf2 and the period between the time Tf4 and the time Tf5, during which the word line WL is at L level, it is effective that signals at both the bit line BL and the inverted bit line BLB have L level. In other words, the operation as in the timing chart of FIG. 7B is effective. With such operation, stress applied to the transistor Tr1 and the transistor Tr4, which are connected to the bit line BL and the inverted bit line BLB, respectively, can be reduced while potentials are held at the node FN1 and the node FN2.

Note that in FIG. 6A, a potential held at the node FN1 is maintained at the node where the other of the source and the drain of the transistor Tr1 and the gate of the transistor Tr2 are connected, and a potential held at the node FN2 is maintained at the node where the other of the source and the drain of the transistor Tr4 and the gate of the transistor Tr5 are connected. Alternatively, capacitors may be additionally provided to hold a potential. For example, the capacitor Cp1 and a capacitor Cp2 are provided as in a circuit diagram of FIG. 8A. The capacitor Cp1 is provided so that one electrode is connected to the node FN1 and the other electrode is grounded (is kept at a ground potential, which is a fixed potential). The capacitor Cp2 is provided so that one electrode is connected to the node FN2 and the other electrode is grounded (is kept at a ground potential, which is a fixed potential).

Figure 8A:
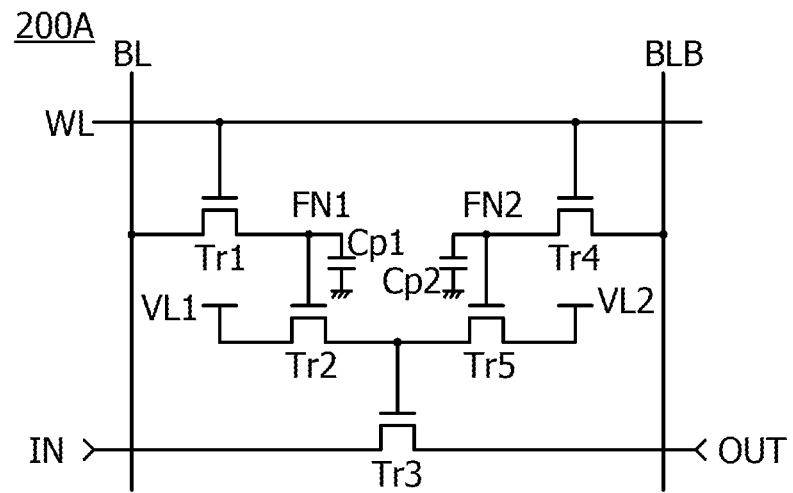
FIGS. 8A and 8B are circuit diagrams of one embodiment of the present invention.
Figure 8B:
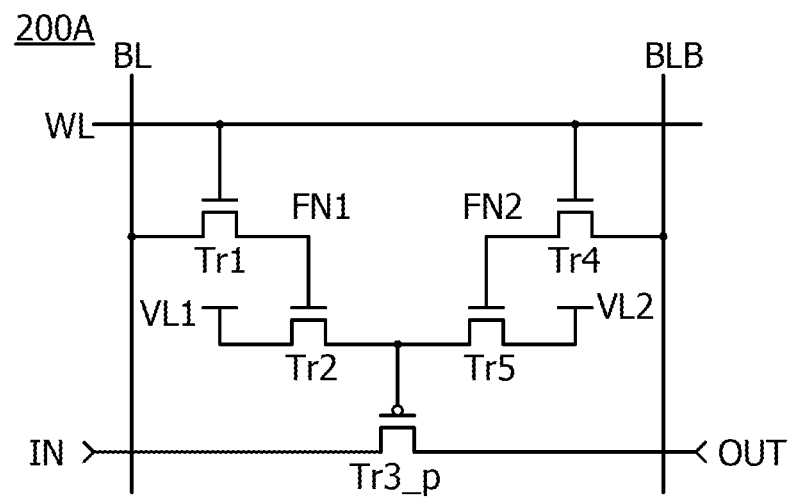

Although the transistors Tr1 to Tr5 are n-channel transistors in FIG. 8A, some of them may be a p-channel transistor. For example, the transistor Tr3 can be the p-channel transistor Tr3_p as in a circuit diagram of FIG. 8B.

Figure 9A:
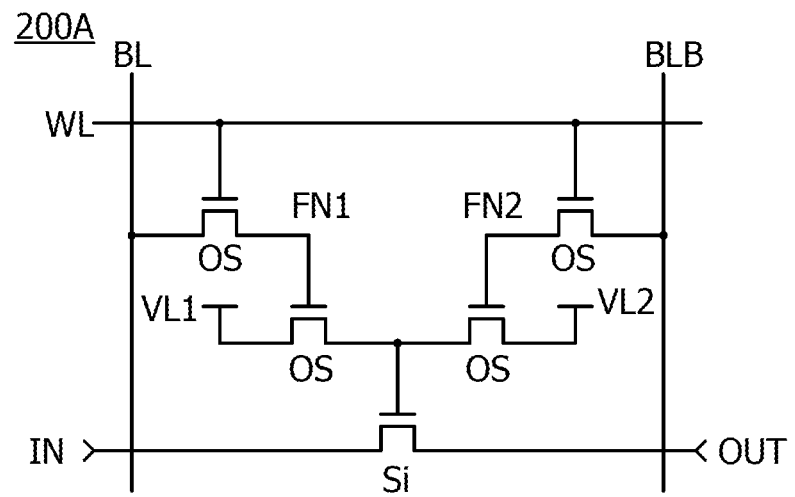
FIGS. 9A and 9B are circuit diagrams of one embodiment of the present invention.

In the structure illustrated in FIGS. 6A and 6B, the transistors Tr1, Tr2, Tr4, and Tr5 are OS transistors and the transistor Tr3 is a Si transistor. FIG. 9A is a circuit diagram in which "OS" is used to indicate that a semiconductor layer including a channel formation region of the OS transistor contains an oxide semiconductor and "Si" is used to indicate that a semiconductor layer including a channel formation region of the Si transistor contains silicon.

Figure 9B:
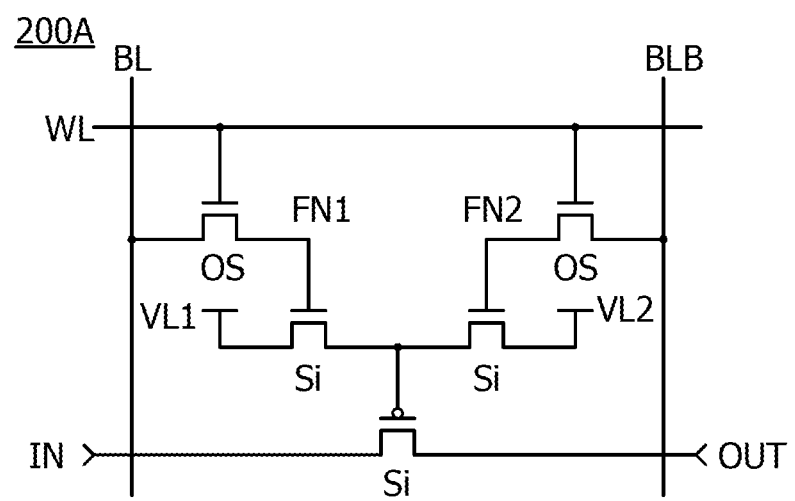

As described above, the transistors Tr2 and Tr5 only need to have a thick gate insulating film; therefore, there is no particular limitation on the kind of semiconductor contained in the semiconductor layers including a channel formation region. For this reason, the transistors Tr2 and Tr5 can be Si transistors as illustrated in FIG. 9B.

Figure 10A:
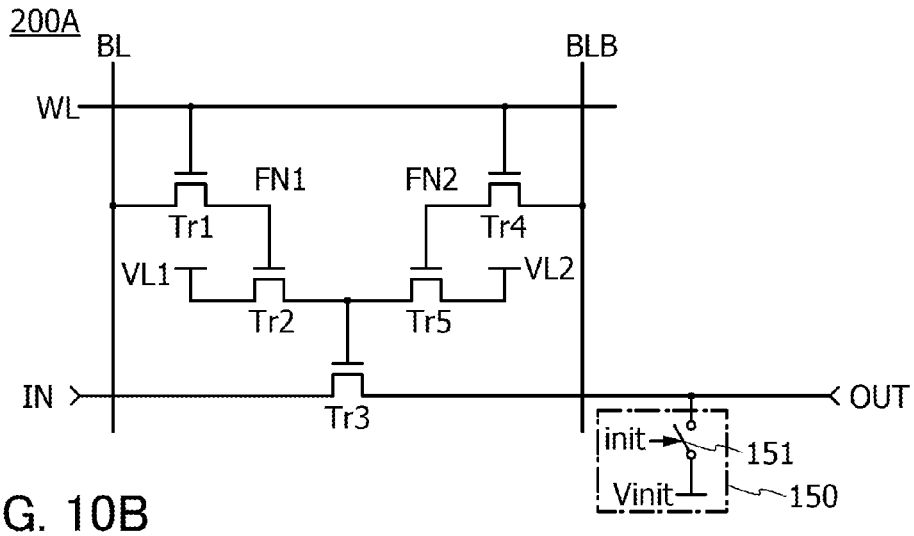
FIGS. 10A to 10C are circuit diagrams of one embodiment of the present invention.
Figure 10B:
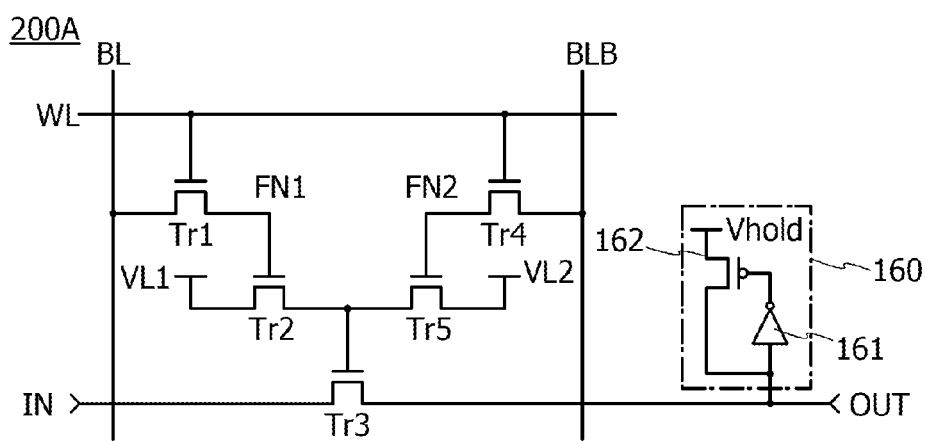
Figure 10C:
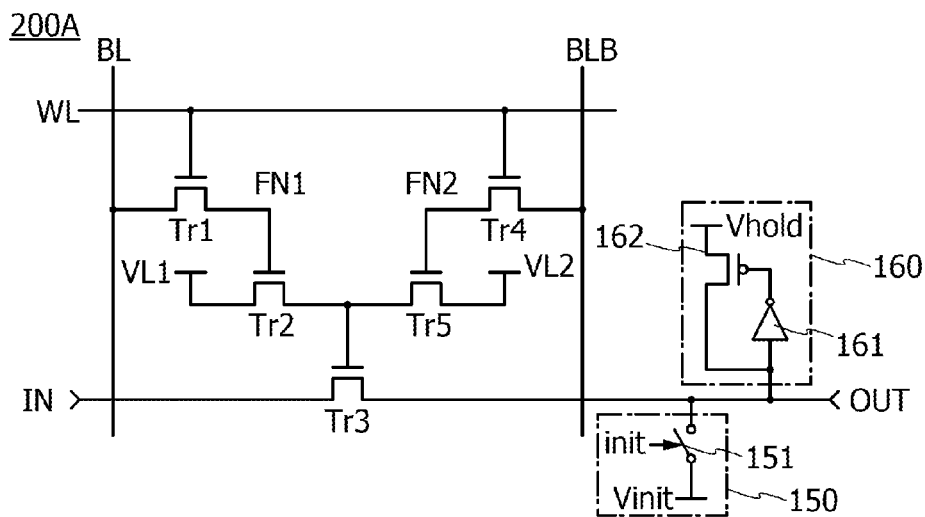

Furthermore, a switch for initializing the potential of the output terminal OUT or a latch for holding the potential of the output terminal OUT may be connected to the programmable switch element 200A in this embodiment. FIGS. 10A to 10C illustrate structures where the reset circuit 150 for initializing the potential of the output terminal OUT and/or the latch circuit 160 for holding the potential of the output terminal OUT is/are connected to the output terminal OUT.

FIG. 10A illustrates a circuit structure in which the reset circuit 150 is connected to the output terminal OUT of the programmable switch element 200A illustrated in FIG. 6A.

FIG. 10B illustrates a circuit structure in which the latch circuit 160 is connected to the output terminal OUT of the programmable switch element 200A in FIG. 6A.

FIG. 10C illustrates a circuit structure in which the reset circuit 150 and the latch circuit 160 are connected to the output terminal OUT of the programmable switch element 200A in FIG. 6A.

With the circuit structure illustrated in FIG. 10A or FIG. 10C, the potential of the output terminal OUT can be kept at L level after a PLD is powered on. Consequently, even if the output terminal OUT remains at an intermediate potential, flow-through current can be prevented from occurring in a programmable logic element having an input terminal IN connected to this output terminal OUT. Moreover, with the circuit structure illustrated in FIG. 10B or FIG. 10C, the potential of the output terminal OUT can be kept at either H level or L level. Thus, even if the output terminal OUT remains at an intermediate potential, flow-through current can be prevented from occurring in a programmable logic element having an input terminal IN connected to this output terminal OUT.

As has been described above, in the programmable switch element 200A of one embodiment of the present invention, an oxide semiconductor is used for the semiconductor layer including a channel formation region of the transistors Tr1 and Tr4. The gate insulating films of the transistors Tr2 and Tr5 are thicker than the gate insulating film of the Si transistor that can be used as the path transistor.

Accordingly, in the programmable switch element, charge at the node FN1 and the node FN2 can be retained for a long time by using OS transistors with low leakage current as the transistors Tr1 and Tr4 and transistors including a thick gate insulating film as the transistors Tr2 and Tr5. Thus, leakage current that is increased because of miniaturization of the Si transistor can be suppressed, and the switching characteristics of the path transistor can be improved.

This embodiment can be implemented in appropriate combination with any of the other embodiments.

Embodiment 3

This embodiment will show a structure example of a PLD, a structure example of a programmable logic element, and a layout example of circuits included in a PLD.

Figure 11A:
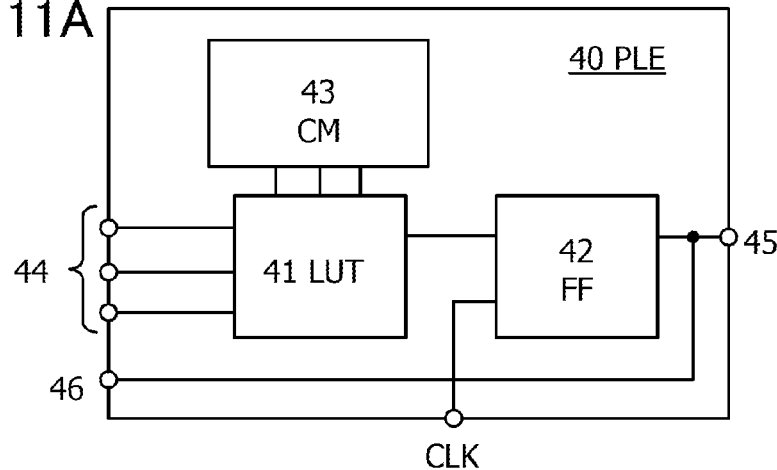
FIGS. 11A to 11C are block diagrams of one embodiment of the present invention.

FIG. 11A illustrates an example of a programmable logic element (PLE) 40. The programmable logic element 40 illustrated in FIG. 11A includes a look-up table (LUT) 41, a flip-flop (FF) 42, and a configuration memory (CM) 43. Logical operation of the LUT 41 is determined in accordance with configuration data in the configuration memory 43. Specifically, one output value of the LUT 41 with respect to input values of a plurality of input signals supplied to input terminals 44 is determined. Then, the LUT 41 outputs a signal including the output value. The flip-flop 42 holds the signal output from the LUT 42 and outputs an output signal corresponding to the signal from a first output terminal 45 and a second output terminal 46 in synchronization with a clock signal CLK.

Note that the programmable logic element 40 may also include a multiplexer circuit capable of selecting whether the signal output from the LUT 41 passes through the flip-flop 42 or not.

Further, the type of the flip-flop 42 may be determined by configuration data. Specifically, the flip-flop 42 may function as any of a D flip-flop, a T flip-flop, a JK flip-flop, and an RS flip-flop depending on configuration data.

Figure 11B:
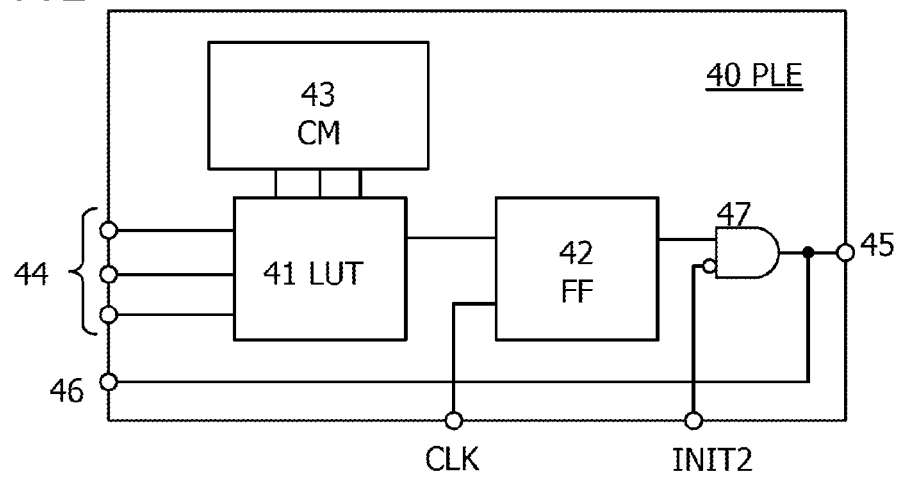

FIG. 11B illustrates another example of the programmable logic element 40. The programmable logic element 40 illustrated in FIG. 11B includes an AND circuit 47 in addition to the components of the programmable logic element 40 in FIG. 11A. To the AND circuit 47, a signal from the flip-flop 42 is applied as an active high input, and a signal INIT2 for initializing the potential of a wiring is applied as an active low input. With such a structure, the potential of a wiring supplied with a signal output from the programmable logic element 40 can be initialized. Consequently, a large amount of current can be prevented from flowing between the programmable logic elements 40, so that breakage of a PLD can be prevented.

Figure 11C:
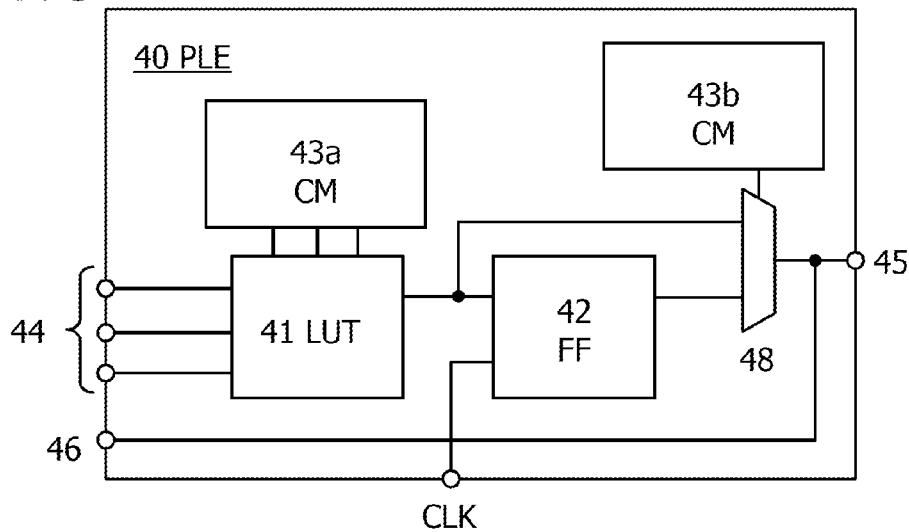

FIG. 11C illustrates another example of the programmable logic element 40. The programmable logic element 40 illustrated in FIG. 11C includes a multiplexer 48 in addition to the components of the programmable logic element 40 in FIG. 11A. The programmable logic element 40 in FIG. 11C includes two configuration memories 43 indicated by a configuration memory 43a and a configuration memory 43b. Logical operation of the LUT 41 is determined in accordance with configuration data in the configuration memory 43a. A signal output from the LUT 41 and a signal output from the flip-flop 42 are input to the multiplexer 48. The multiplexer 48 has a function of selecting and outputting one of the two output signals in accordance with configuration data stored in the configuration memory 43b. The signal output from the multiplexer 48 is output from the first output terminal 45 and the second output terminal 46.

Figure 12A:
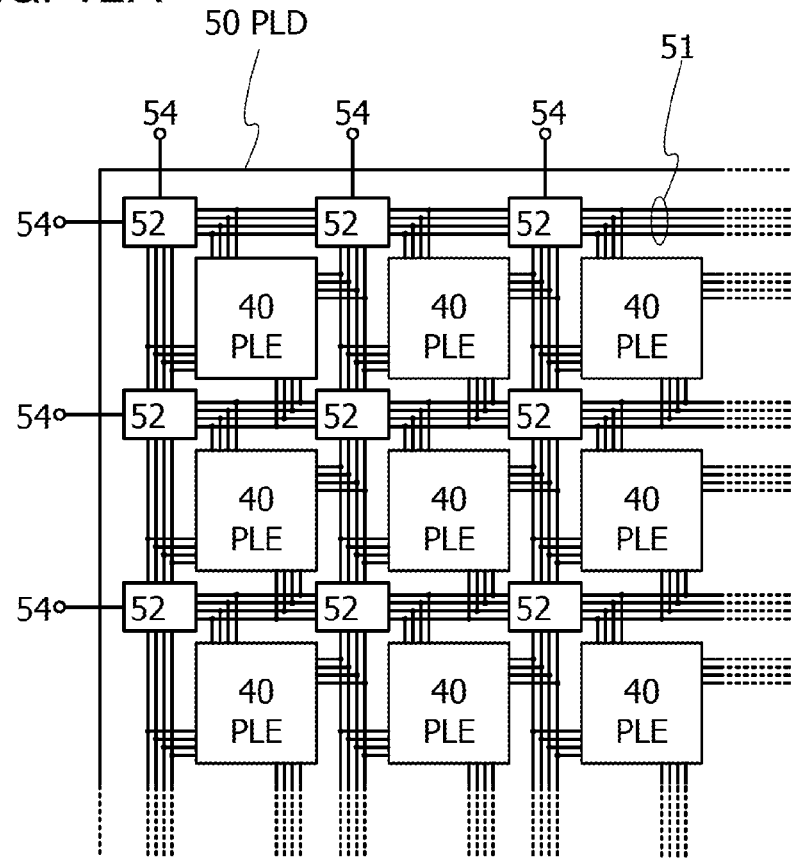
FIGS. 12A and 12B are circuit diagrams of one embodiment of the present invention.

FIG. 12A schematically illustrates an example of a partial structure of a PLD 50. The PLD 50 in FIG. 12A includes a plurality of programmable logic elements (PLE) 40, a wiring group 51 connected to the programmable logic elements 40, and programmable switch elements 52 for controlling connections between the wirings included in the wiring group 51.

Figure 12B:
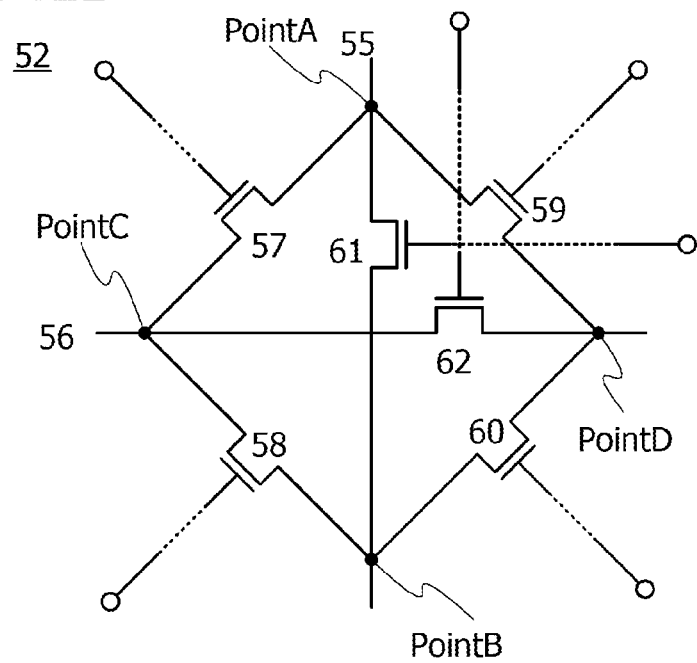

FIG. 12B illustrates a structure example of the programmable switch element 52. The programmable switch element 52 in FIG. 12B has a function of controlling connection between a wiring 55 and a wiring 56 included in the wiring group 51. Specifically, the programmable switch element 52 includes path transistors 57 to 62. The path transistors 57 to 62 correspond to the transistor Tr3 in Embodiment 1. The on/off state of each of the path transistors 57 to 62 is controlled in accordance with the states of the transistors Tr1 and Tr2 and the node FN1 described in Embodiment 1.

The path transistor 57 has a function of controlling electrical connection between a point A of the wiring 55 and a point C of the wiring 56. The path transistor 58 has a function of controlling electrical connection between a point B of the wiring 55 and the point C of the wiring 56. The path transistor 59 has a function of controlling electrical connection between the point A of the wiring 55 and a point D of the wiring 56. The path transistor 60 has a function of controlling electrical connection between the point B of the wiring 55 and the point D of the wiring 56. The path transistor 61 has a function of controlling electrical connection between the point A and the point B of the wiring 55.

The path transistor 62 has a function of controlling electrical connection between the point C and the point D of the wiring 56.

The programmable switch elements 52 also have a function of controlling electrical connection between the wiring group 51 and terminals 54 of the PLD 50.

Figure 13:
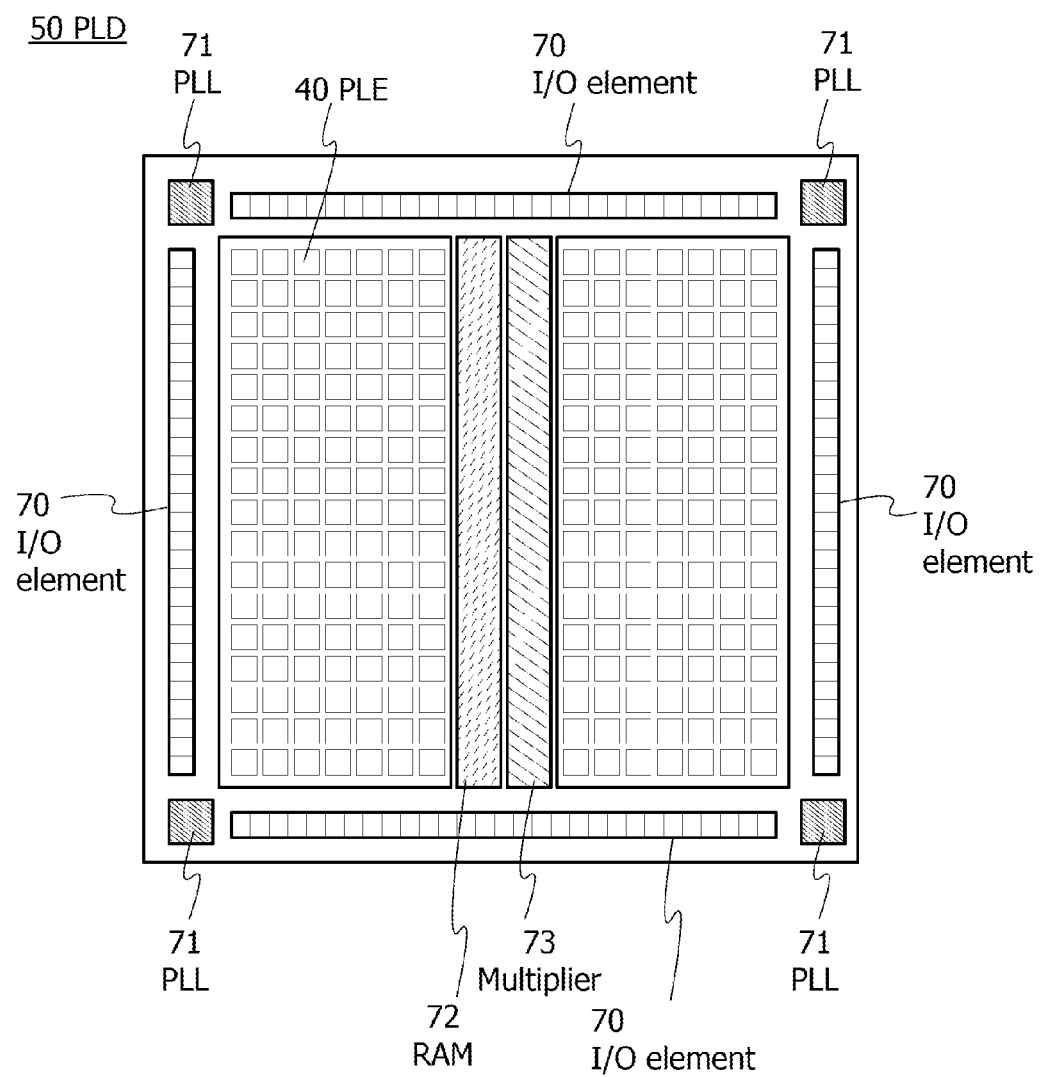
FIG. 13 is a block diagram of one embodiment of the present invention.

FIG. 13 illustrates a structure example of the entire PLD 50. In FIG. 13, I/O elements 70, phase lock loops (PLL) 71, RAM 72, and a multiplier 73 are provided in the PLD 50. The I/O element 70 functions as an interface that controls input/output of a signal from/to an external circuit of the PLD 50. The PLL 71 has a function of generating a clock signal CLK. The RAM 72 has a function of storing data used for logical operation. The multiplier 73 corresponds to a logic circuit for multiplication. When the PLD 50 has a function of executing multiplication, the multiplier 73 is not necessarily provided.

Embodiment 4

In this embodiment, a circuit structure and operation of a semiconductor device will be described.

Note that a semiconductor device refers to a device including a semiconductor element. The semiconductor device includes a driver circuit or the like for driving a circuit including a semiconductor element. Note that the semiconductor device may include a driver circuit, a power supply circuit, or the like provided over another substrate, in addition to a memory cell.

Figure 16:
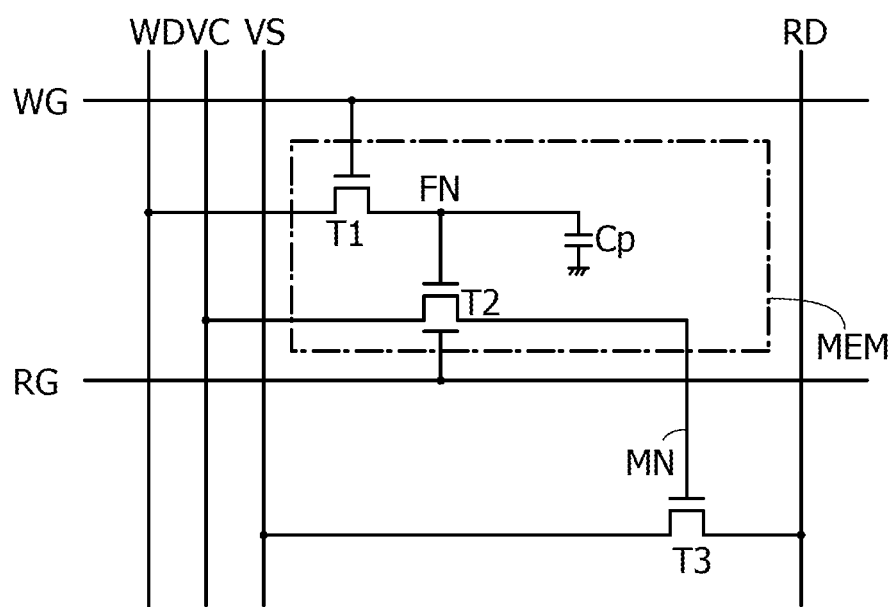
FIG. 16 is a circuit diagram of one embodiment of the present invention.

FIG. 16 is a circuit diagram illustrating an example of a memory cell MC included in a semiconductor device. In an actual semiconductor device, memory cells MC are arranged in a matrix.

The memory cell MC illustrated in FIG. 16 includes a transistor T1, a transistor T2, a transistor T3, and a capacitor Cp. In FIG. 16, the transistors T1 to T3 are n-channel transistors. Note that in FIG. 16, a circuit portion composed of the transistor T1, the transistor T2, and the capacitor Cp has a function of storing data. The circuit portion is referred to as a data memory unit MEM. For example, the memory cell MC including a plurality of data memory units MEM can store more than one piece of data.

The transistor T1 has a function of controlling writing of data into the data memory unit MEM in accordance with a write selection signal. A gate of the transistor T1 is connected to a write selection line WG for applying a write selection signal (wiring). One of a source and a drain of the transistor T1 is connected to a write data line WD for applying data (wiring).

The transistor T2 has a function of controlling whether a potential for controlling the on/off state of the transistor T3 is applied to a gate of the transistor T3 or not, in accordance with a potential corresponding to data written into the data memory unit MEM and a potential of a signal applied to a backgate of the transistor T2. A first gate of the transistor T2 is connected to the other of the source and the drain of the transistor T1. The second gate of the transistor T2 is connected to a read selection line RG supplied with a read selection signal (wiring). One of a source and a drain of the transistor T2 is connected to a voltage control line VC supplied with a read signal (wiring). Note that a node where the other of the source and the drain of the transistor T1 and the first gate of the transistor T2 are connected is hereinafter referred to as a node FN.

Note that the first gate and the second gate of the transistor T2 are a pair of gate electrodes that are positioned with a semiconductor layer including a channel formation region therebetween. The second gate of the transistor T2 is also called backgate. An insulating film between the first gate and the semiconductor layer including a channel formation region is referred to as a gate insulating film.

The transistor T3 has a function of controlling continuity between its source and drain in accordance with a potential of a read signal that is supplied to its gate from the voltage control line VC; the read signal is supplied to the gate of the transistor T3 when the transistor T2 is on. The gate of the transistor T3 is connected to the other of the source and the drain of the transistor T2. One of the source and the drain of the transistor T3 is connected to a wiring VS for applying a constant potential. The other of the source and the drain of the transistor T3 is connected to a read data line RD supplied with a voltage for reading data (wiring). Note that a node to which the gate of the transistor T3 is connected is hereinafter referred to as a node MN.

The capacitor Cp has a function of holding a potential of the node FN. One electrode of the capacitor Cp is connected to the node FN. The other electrode of the capacitor Cp is connected to a ground line. Note that the other electrode of the capacitor Cp only needs to be connected to a wiring at a constant potential and is not necessarily connected to a ground line.

The capacitance of the capacitor Cp needs to be large enough to prevent a potential change due to charge transfer at the node FN. Thus, the use of the parasitic capacitance of the node FN or the gate capacitance of the transistor T2 allows omission of the capacitor Cp in some cases.

A write selection signal applied to the write selection line WG is a signal for controlling the on/off state of the transistor T1. In the case where the transistor T1 is an n-channel transistor, the transistor T1 is turned on when the write selection signal is at H level and is turned off when the write selection signal is at L level. When the transistor T1 is turned on, the potential of one of the source and the drain of the transistor T1 (the potential of the write data line WD) is applied to the other of the source and the drain of the transistor T1 (the node FN). Note that a potential written into the node FN is sometimes lower than the potential of the write data line WD by the threshold voltage of the transistor T1. For this reason, it is preferable that the H-level potential of the write selection signal be previously set higher than a potential applied to the write data line WD.

Data applied to the write data line WD is data to be stored in the data memory unit MEM. For example, when 1-bit data is stored in the data memory unit MEM, an L-level potential is applied to store data "0" and an H-level potential is applied to store data "1". To store multi-bit data in the memory cell MC, a plurality of data memory units MEM may be provided or a plurality of potentials may be prepared for data applied to the write data line WD.

The node FN is a node for holding a potential corresponding to data applied to the write data line WD. The node FN can store data corresponding to the held potential because the potential change caused by charge transfer at the node FN is made as small as possible.

A read selection signal applied to the read selection line RG is a signal for controlling the on/off state of the transistor T2 together with the potential of the node FN. Specifically, in the case where the transistor T2 is an n-channel transistor, the transistor T2 is turned on when the potential of the node FN is at H level and the read selection signal is at H level. The transistor T2 is turned off when the potential of the node FN is at H level and the read selection signal is at L level, when the potential of the node FN is at L level and the read selection signal is at H level, and when the potential of the node FN is at L level and the read selection signal is at L level. When the transistor T2 is turned on, the potential of one of the source and the drain of the transistor T2 (the potential of the voltage control line VC) is applied to the other of the source and the drain of the transistor T2 (the node MN).

A read signal applied to the voltage control line VC is a signal for switching the potential of the node MN between a potential for turning on the transistor T3 and a potential for turning off the transistor T3. When the read signal is at H level and the transistor T2 is on, an H-level potential is applied to the node MN. When the read signal is at L level and the transistor T2 is on, an L-level potential is applied to the node MN. When the read signal is at either H level or L level and the transistor T2 is off, the node MN becomes electrically floating.

The node MN is supplied with a potential for controlling the on/off state of the transistor T3 in response to application of a read signal to the voltage control line VC. In the case where the transistor T3 is an n-channel transistor, the transistor T3 is turned on when an H-level potential is applied to the node MN and is turned off when an L-level potential is applied to the node MN.

A voltage applied to the read data line RD is a voltage for reading data stored in the data memory unit MEM. Specifically, the voltage applied to the read data line RD is a precharge voltage for detecting a change in the conduction state of the transistor T3.

The wiring VS for applying a constant potential is supplied with a potential for discharging a precharge voltage applied to the read data line RD, in accordance with a change in the conduction state of the transistor T3.

In the memory cell MC illustrated in FIG. 16, a potential corresponding to data is held at the node FN included in the data memory unit MEM, so that the data memory unit MEM can store the data. Data applied to the write data line WD is written into the node FN by turning on the transistor T1. Moreover, by turning off the transistor T1, the node FN can hold the potential for a long time, so that the data memory unit MEM can store data.

To prevent a potential change due to charge transfer at the node FN and retain data for a long time, the following two features are required: one is extremely low leakage current between the source and the drain of the transistor T1, and the other is extremely low leakage current through a gate insulating film of the transistor T2.

To prevent a potential change caused by charge transfer at the node FN, the transistor T1 is preferably a transistor with extremely low leakage current between its source and drain. Here, low leakage current means that a normalized leakage current per micrometer in channel width at room temperature is 10 zA/μm or lower. Since the leakage current is preferably as low as possible, the normalized leakage current is preferably 1 zA/μm or lower, more preferably 10 yA/m or lower, still more preferably 1 yA/μm or lower. Note that a voltage between the source and the drain in this case is, for example, approximately 0.1 V, 5 V, or 10 V. An example of a transistor with extremely low leakage current between its source and drain is a transistor in which a channel is formed in an oxide semiconductor.

To prevent a potential change due to charge transfer at the node FN, the transistor T2 is preferably a transistor with extremely low leakage current through a gate insulating film. The leakage current through the gate insulating film of the transistor T2 is preferably as low as the leakage current between the source and the drain of the transistor T1.

The leakage current of the transistor T2 through the gate insulating film is preferably 10 yA or lower, more preferably 1 yA or lower to prevent a potential change caused by charge transfer at the node FN. To achieve such leakage current, the thickness of the gate insulating film of the transistor T2 is preferably larger than that of the gate insulating film of the transistor T3 that is a Si transistor.

Note that a leakage current of the transistor T2 through the gate insulating film of 10 yA or lower is calculated on the basis of a retention period necessary to hold charge corresponding to configuration data at the node FN. Specifically, when the capacitance C of the node FN is 10 fF and allowable voltage change ΔV is 0.3 V, a leakage current I necessary to hold charge Q for about 10 years ($t \approx 3 \times 10^8$ s) is estimated at 10 yA or lower from Equation (1).

$$Q = C \times V > I \times t \quad (1)$$

In terms of equivalent oxide thickness, the thickness of the gate insulating film achieving a leakage current of 10 yA or lower, which is necessary for charge retention, is estimated at approximately 6 nm or more in a transistor with a channel width and length of 1 μm and 1 μm.

The thickness of the gate insulating film can be estimated as described in Embodiment 1 referring to the non-patent document (Kazunari Ishimaru, "45 nm/32 nm CMOS—Challenge and perspective", *Solid-State Electronics*, Vol. 52, 2008, pp. 1266-1273); therefore, the above description can be employed.

In the memory cell MC illustrated in FIG. 16, the on/off state of the transistor T2 is controlled in accordance with the potential of a read selection signal applied to its second gate as well as the potential of the node FN. The transistor T2 needs to have driving capability high enough to apply the potential of the voltage control line VC during its on state to the node MN and charge and discharge the gate capacitance of the transistor T3.

The transistor T3 needs to discharge the read data line RD at high speed when data read operation is performed, and thus requires higher driving capability than the transistor T2. For this reason, the transistor T3 is preferably a miniaturized Si transistor. Since the node FN is not connected to the gate of the transistor T3 in the structure of this embodiment, charge retention at the node FN is not adversely affected even if the amount of leakage current flowing through the gate insulating film of the transistor T3 is increased because of miniaturization.

As has been described, the driving capability of the transistor T2 may be relatively lower than that of the transistor T3. Accordingly, the transistor T2 can have a thicker gate insulating film than the transistor T3 and have extremely low leakage current, which is lower than or equal to the leakage current between the source and the drain of the transistor T1.

As described above, the node FN included in the data memory unit MEM in FIG. 16 is formed by an OS transistor as the transistor T1 and a transistor including a gate insulating film thicker than that of a Si transistor as the transistor T2, thereby providing a semiconductor device including the node FN with excellent charge retention characteristics.

The transistor T2 is a transistor with a thick gate insulating film and extremely low leakage current through the gate insulating film. Moreover, the transistor T2 is preferably an OS transistor like the transistor T1. This can reduce the amount of current flowing through the transistor T2 when the transistor T2 is off, whereby unintended leakage current caused by the change in the potential of the node MN in an unselected row can be prevented from flowing through the transistor T3.

With the structure of this embodiment, the data memory unit MEM included in the memory cell MC can serve as a nonvolatile memory circuit, which can store data even after power supply is stopped. Thus, data written into the node FN can be continuously stored at the node FN until the transistor T1 is turned on again. In the structure of this embodiment, charge retention at the node FN is not adversely affected even if the amount of leakage current flowing through the gate insulating film of the transistor T3 is increased. Thus, it is possible to provide a semiconductor device in which the function of a nonvolatile memory circuit is not impaired even if leakage current through the gate insulating film of the Si transistor occurs.

In the structure of this embodiment, the transistor T2 has a second gate serving as a backgate in addition to a first gate so that leakage current through the gate insulating film is low and the on/off state of the transistor T2 is controlled in accordance with the potential of the node FN. With the second transistor T2 having the second gate, continuity between the voltage control line VC and the node MN can be controlled without increase in the number of transistors. That is, continuity between the voltage control line VC and the node MN can be controlled without an additional transistor; thus, the increase in the memory cell area due to the increase in the number of elements can be prevented, and a semiconductor device with high area efficiency can be provided.

Figure 17A:
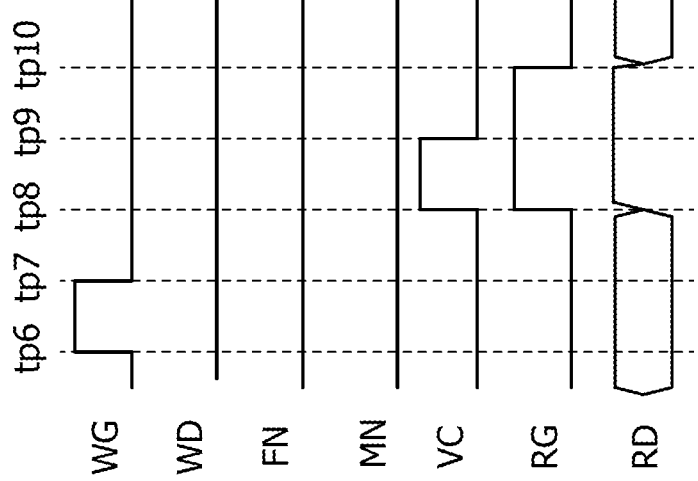
FIGS. 17A and 17B are timing charts of one embodiment of the present invention.
Figure 17B:
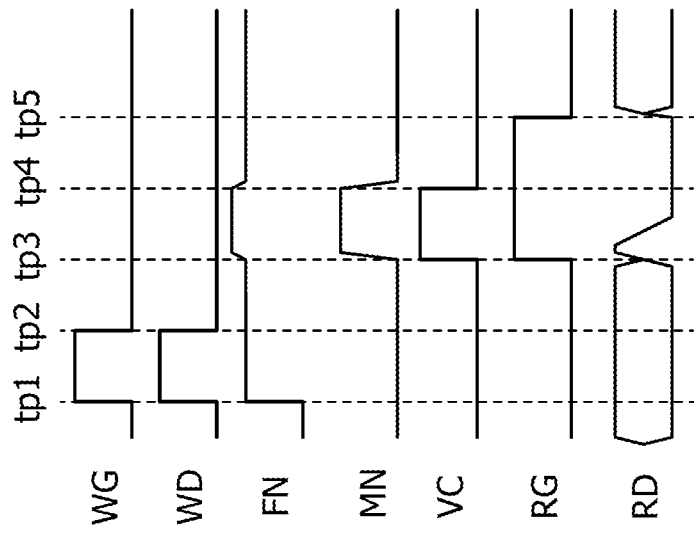

Next, an example of the operation of the memory cell MC illustrated in FIG. 16 will be described using timing charts in FIGS. 17A and 17B. The timing charts in FIGS. 17A and 17B show changes in the potentials of the write selection line WG, the write data line WD, the node FN, the node MN, the voltage control line VC, the read selection line RG, and the read data line RD from the time tp1 to the time tp10.

First, the timing chart in FIG. 17A will be described. FIG. 17A illustrates the case where data "1" (here, an H-level potential) is written into the data memory unit MEM of the memory cell MC.

From the time tp1 to the time tp2, data "1", that is, an H-level potential is written into the data memory unit MEM of the memory cell MC. Here, the write selection line WG and the write data line WD are set at H level. At this time, the potential of the node FN in the data memory unit MEM becomes the H-level potential, which is applied to the write data line WD.

After writing of data "1" is finished, from the time tp2 to the time tp3, the write selection line WG and the write data line WD are set at L level.

From the time tp3 to the time tp4, data "1", that is, the H-level potential written into the data memory unit MEM of the memory cell MC is read. Here, the read selection line RG and the voltage control line VC are set at H level. The read data line RD is precharged immediately after the time tp3.

From the time tp3 to the time tp4, in the data memory unit MEM of the memory cell MC, the node FN is at H level, so that the transistor T2 is turned on and the potential of the voltage control line VC is supplied to the node MN. Here, since the potential of the voltage control line VC goes from L level to H level after the read selection line RG is set at H level (after the transistor T2 is turned on), the node FN can be regarded as an electrically floating node. Thus, the potential of the node FN rises as the potential of the voltage control line VC changes from L level to H level. Accordingly, the effect of enhancing the driving capability of the transistor T2 is obtained. When the potential of the node FN increases to a potential sufficiently higher than the potential of the voltage control line VC, the potential of the node MN can be made equal to that of the voltage control line VC. Consequently, the potential of the gate of the transistor T3 becomes H level, and the transistor T3 is turned on. Then, the potential of the read data line RD becomes L level. The L-level potential obtained at the read data line RD is a potential corresponding to the data "1", which is written into the data memory unit MEM.

From the time tp4 to the time tp5, the voltage control line VC is set at L level while the read selection line RG is kept at H level, so that the potential of the node MN in the memory cell MC is set at L level. This operation prevents output of an unnecessary signal from a memory cell in an unselected row during data reading to be performed later.

Next, the timing chart in FIG. 17B will be described. FIG. 17B illustrates the case where data "0" (here, an L-level potential) is written into the data memory unit MEM of the memory cell MC.

From the time tp6 to the time tp7, data "0", that is, an L-level potential is written into the data memory unit MEM of the memory cell MC. Here, the write selection line WG is set at H level and the write data line WD is set at L level. At this time, the potential of the node FN in the data memory unit MEM becomes the L-level potential, which is applied to the write data line WD.

After writing of data "0" is finished, from the time tp7 to the time tp8, the write selection line WG and the write data line WD are set at L level.

From the time tp8 to the time tp9, data "0", that is, the L-level potential written into the data memory unit MEM of the memory cell MC is read. Here, the read selection line RG and the voltage control line VC are set at H level. The read data line RD is precharged immediately after the time tp8.

From the time tp8 to the time tp9, in the data memory unit MEM of the memory cell MC, the node FN is at L level, so that the transistor T2 is turned off and the potential of the voltage control line VC is not supplied to the node MN; thus, the node MN remains at L level. Since the transistor T2 is turned off, the rise of the potential of the node FN caused by the change in the potential of the read selection line RG from L level to H level hardly occurs. Consequently, the potential of the gate of the transistor T3 is at H level, and the transistor T3 is turned off. Then, the potential of the read data line RD remains at H level. The H-level potential obtained at the read data line RD is a potential corresponding to the data "0", which is written into the data memory unit MEM.

From the time tp9 to the time tp10, the voltage control line VC is set at L level while the read selection line RG is kept at H level, so that the potential of the node MN in the memory cell MC is set at L level. As in the above operation from the time tp4 to the time tp5, this operation prevents output of an unnecessary signal from a memory cell in an unselected row during subsequent data reading, although the operation has no immediate effect because the potential of the node MN is already at L level and the transistor T2 is off.

Note that precharge of the read data line RD at the time tp3 and the time tp8 in the timing charts in FIGS. 17A and 17B may be performed before the time tp3 and the time tp8, in which case power consumption can be reduced. The operation shown in FIGS. 17A and 17B is preferable to perform data reading at high speed.

As described above, data can be written into the memory cell MC and read from the memory cell MC as shown in the timing charts in FIGS. 17A and 17B.

Although FIG. 16 shows an example where one-state data that is an L-level potential corresponding to data "0" or an H-level potential corresponding to data "1" is stored by being written into the memory cell MC, a memory cell can store data having two states or more.

Figure 18:
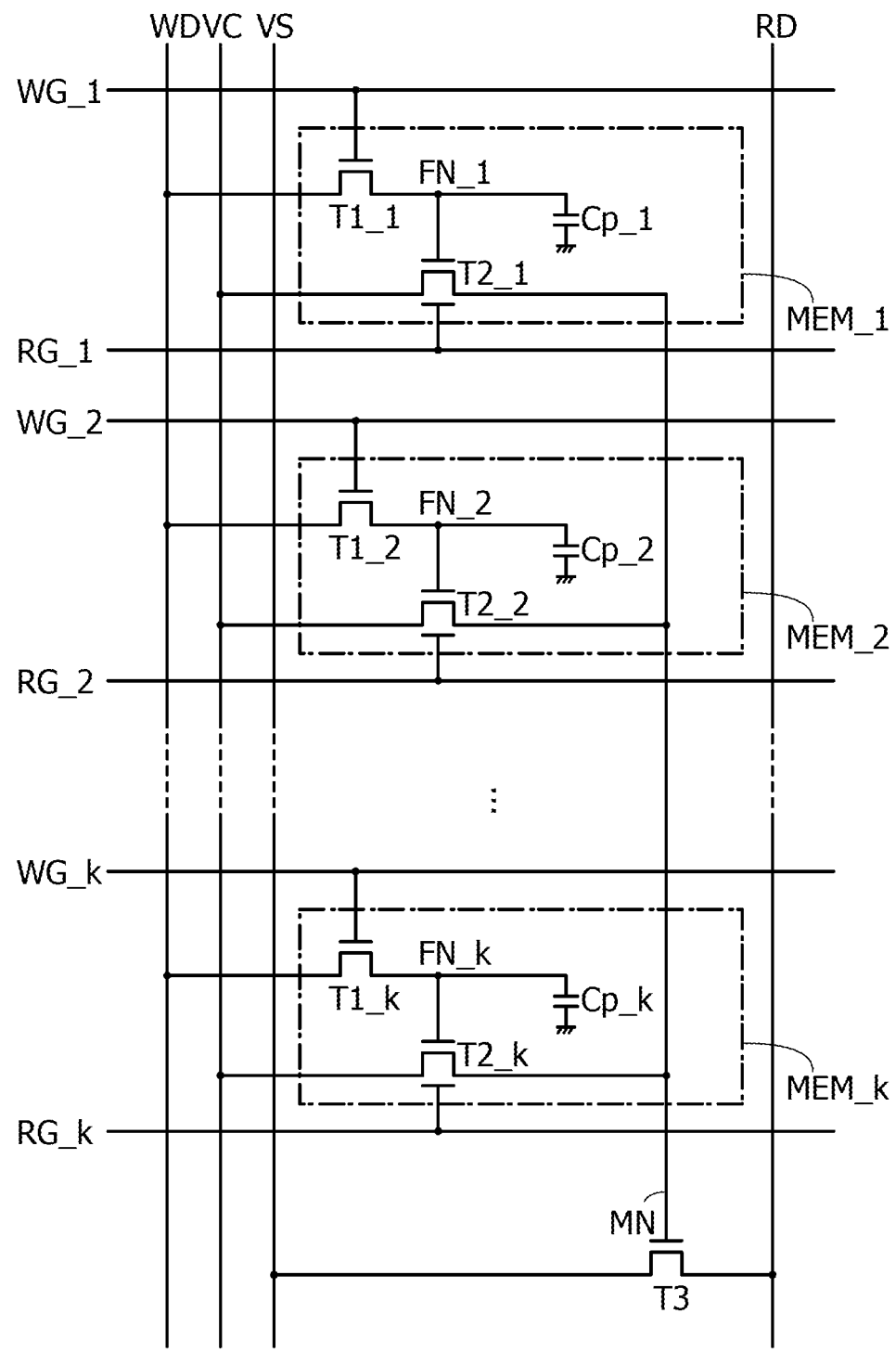
FIG. 18 is a circuit diagram of one embodiment of the present invention.

FIG. 18 illustrates a circuit structure of a memory cell MCx capable of storing k-state data (k is a natural number of 2 or more). The memory cell MCx illustrated in FIG. 18 includes data memory units MEM_1 to MEM_k and the transistor T3.

The data memory unit MEM_1 includes a transistor T1_1, a transistor T2_1, and a capacitor Cp_1. The data memory unit MEM_2 includes a transistor T1_2, a transistor T2_2, and a capacitor Cp_2. The data memory unit MEM_k includes a transistor T1_k, a transistor T2_k, and a capacitor Cp_k.

A wiring through which the transistor T1_1, the transistor T2_1, and the capacitor Cp_1 are connected to each other serves as a node FN_1. The data memory unit MEM_2 includes a node FN_2, and the data memory unit MEM_k includes a node FN_k.

As illustrated in FIG. 18, the transistors T1_1 to T1_k, the transistors T21 to T2_k, and the capacitors Cp_1 to Cp_k included in the data memory units MEM_1 to MEM_k are connected to respective write selection lines WG_1 to WG_k, respective read selection lines RG_1 to RG_k, the write data line WD, and the voltage control line VC. In the data memory units MEM_1 to MEM_k, data writing and reading are performed according to the operation described using the data memory unit MEM in FIG. 16.

When the data memory units MEM_1 to MEM_k are included in the memory cell MCx, one memory cell can store k-state data.

Figure 19:
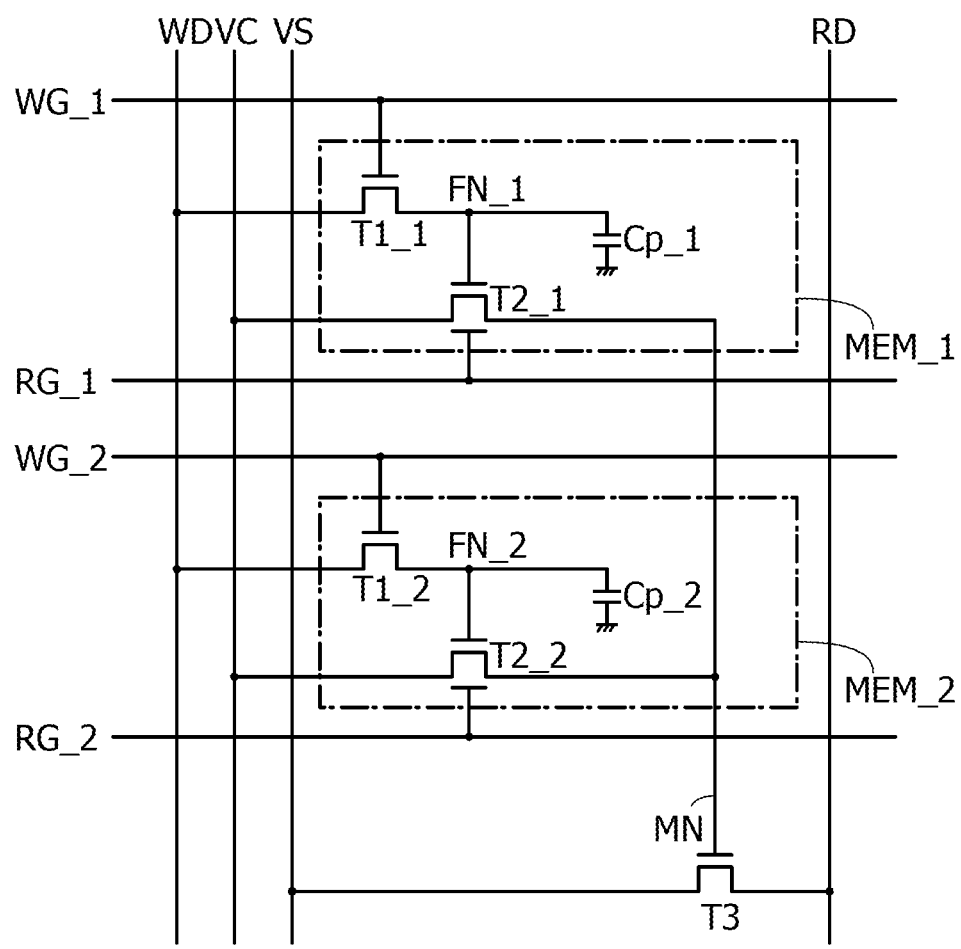
FIG. 19 is a circuit diagram of one embodiment of the present invention.

FIG. 19 illustrates an example of a circuit structure of a memory cell having two data memory units.

A memory cell MC2 illustrated in FIG. 19 includes the data memory unit MEM_1, the data memory unit MEM_2, and the transistor T3.

The data memory unit MEM_1 includes the transistor T1_1, the transistor T2_1, and the capacitor Cp_1. A wiring through which the transistor T1_1, the transistor T2_1, and the capacitor Cp_1 are connected to each other serves as the node FN_1. The transistor T1_1, the transistor T2_1, and the capacitor Cp_1 are connected to the write selection line WG_1, the read selection line RG_1, the write data line WD, and the voltage control line VC. In the data memory unit MEM_1, data writing and reading are performed according to the operation described using the data memory unit MEM in FIG. 16.

The data memory unit MEM_2 includes the transistor T1_2, the transistor T2_2, and the capacitor Cp_2. A wiring through which the transistor T1_2, the transistor T2_2, and the capacitor Cp_2 are connected to each other serves as the node FN_2. The transistor T1_2, the transistor T2_2, and the capacitor Cp_2 are connected to the write selection line WG_2, the read selection line RG_2, the write data line WD, and the voltage control line VC. In the data memory unit MEM_2, data writing and reading are performed according to the operation described using the data memory unit MEM in FIG. 16.

With the structure illustrated in FIG. 19, one memory cell can store binary data by using the data memory units MEM_1 and MEM_2 as in the description of FIG. 18.

Figure 20:
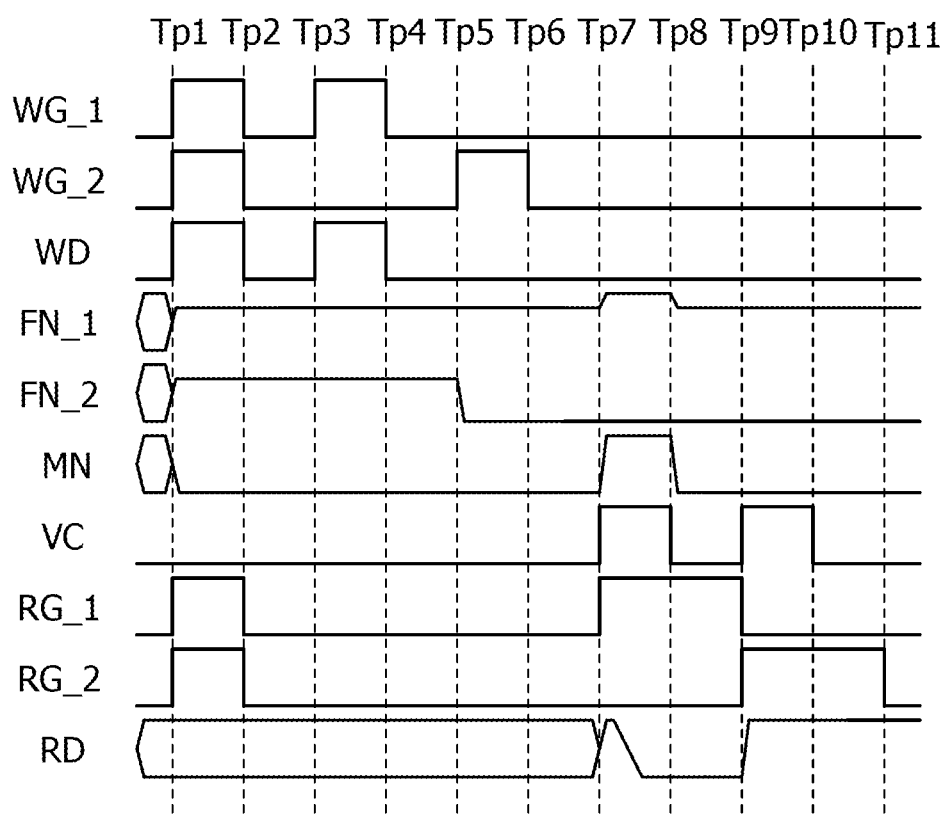
FIG. 20 is a timing chart of one embodiment of the present invention.

Next, an example of the operation of the memory cell MC2 illustrated in FIG. 19 will be described using a timing chart in FIG. 20. In the following description, as data written into the memory cell MC2, an L-level potential corresponds to data "0" and an H-level potential corresponds to data "1". The timing chart in FIG. 20 shows changes in the potentials of the write selection line WG_1, the write selection line WG_2, the write data line WD, the node FN_1, the node FN2, the node MN, the voltage control line VC, the read selection line RG_1, the read selection line RG_2, and the read data line RD from the time Tp1 to the time Tp11.

From the time Tp1 to the time Tp2, data in the memory cell MC2 is initialized. Specifically, the potential of the node MN in the memory cell MC2 is set at L level. Setting the potential of the node MN at L level to initialize data prevents output of an unnecessary signal from the memory cell MC2 in an unselected row during subsequent data reading. In the example of the timing chart in FIG. 20, the write selection line WG_1, the write selection line WG_2, the write data line WD, the read selection line RG_1, and the read selection line RG_2 are set at H level and the voltage control line VC is set at L level. At this time, the potentials of the node FN_1 in the data memory unit MEM_1 and the node FN_2 in the data memory unit MEM_2 become H level. Note that the potentials held at the node FN_1 and the node FN_2 are actually lower than the H-level potential by the threshold voltages of the transistor T1_1 and the transistor T1_2, respectively. Since the read selection lines RG_1 and RG_2 are at H level, the transistors T2_1 and T2_2 are turned on and the potential of the node MN becomes L level. Consequently, the transistor T3 is turned off.

From the time Tp2 to the time Tp3, the read selection lines RG_1 and RG_2 are set at L level. At this time, the transistors T21 and T2_2 are turned off because the potentials of their backgates are at L level although the potentials of their gates, that is, the potentials of the node FN_1 and the node FN_2 are at H level.

From the time Tp3 to the time Tp4, first data is written into the data memory unit MEM_1 of the memory cell MC2. Here, the write selection line WG_1 and the write data line WD are set at H level, and the write selection line WG_2 is set at L level. At this time, the potential of the node FN_1 in the data memory unit MEM_1 becomes H level in accordance with the first data applied to the write data line WD.

After writing of the first data is finished, from the time Tp4 to the time Tp5, the write selection lines WG_1 and WG_2 and the write data line WD are set at L level.

From the time Tp5 to the time Tp6, second data is written into the data memory unit MEM_2 of the memory cell MC2. Here, the write selection line WG_1 and the write data line WD are set at L level, and the write selection line WG_2 is set at H level. At this time, the potential of the node FN_2 in the data memory unit MEM_2 becomes L level in accordance with the second data applied to the write data line WD.

After writing of the second data is finished, from the time Tp6 to the time Tp7, the write selection lines WG_1 and WG_2 and the write data line WD are set at L level.

From the time Tp7 to the time Tp8, the first data written into the data memory unit MEM_1 of the memory cell MC2 is read. Here, the read selection line RG_1 and the voltage control line VC are set at H level, and the read selection line RG_2 is set at L level. The read data line RD is precharged immediately after the time Tp7.

From the time Tp7 to the time Tp8, in the data memory unit MEM_1 of the memory cell MC2, the node FN_1 is at H level, so that the transistor T2_1 is turned on and the potential of the voltage control line VC is supplied to the node MN. Here, since the potential of the voltage control line VC goes from L level to H level after the read selection line RG_1 is set at H level (after the transistor T2_1 is turned on), the node FN_1 can be regarded as an electrically floating node. Thus, the potential of the node FN_1 rises as the potential of the voltage control line VC changes from L level to H level. Accordingly, the effect of enhancing the driving capability of the transistor T2_1 is obtained. When the potential of the node FN_1 increases to a potential sufficiently higher than the potential of the voltage control line VC, the potential of the node MN can be made equal to that of the voltage control line VC. Consequently, the potential of the gate of the transistor T3 becomes H level, and the transistor T3 is turned on. Then, the potential of the read data line RD becomes the L-level potential, which corresponds to the first data.

From the time Tp8 to the time Tp9, the voltage control line VC is set at L level while the read selection line RG_1 is kept at H level, so that the potential of the node MN in the memory cell MC2 is set at L level. This operation prevents output of an unnecessary signal from a memory cell in an unselected row during data reading to be performed later.

From the time Tp9 to the time Tp10, the second data written into the data memory unit MEM_2 of the memory cell MC2 is read. Here, the read selection line RG_1 is set at L level, and the read selection line RG_2 and the voltage control line VC are set at H level. The read data line RD is precharged immediately after the time Tp9.

From the time Tp9 to the time Tp10, in the data memory unit MEM_2 of the memory cell MC2, the node FN_2 is at L level, so that the transistor T2_2 is turned off and the potential of the voltage control line VC is not supplied to the node MN; thus, the node MN remains at L level. Since the transistor T22 is turned off, the rise of the potential of the node FN_2 caused by the change in the potential of the read selection line RG_2 from L level to H level hardly occurs. Consequently, the potential of the gate of the transistor T3 is at L level, and the transistor T3 is turned off. Then, the potential of the read data line RD remains at the H-level potential, which corresponds to the second data.

From the time Tp10 to the time Tp11, the voltage control line VC is set at L level while the read selection line RG_2 is kept at H level. As in the above operation from the time Tp8 to the time Tp9, this operation prevents output of an unnecessary signal from a memory cell in an unselected row during subsequent data reading, although the operation has no immediate effect because the potential of the node MN in the memory cell MC2 is already at L level and the transistor T2_2 is off.

As described above, data can be written into the memory cell MC2 and read from the memory cell MC2 as shown in the timing chart in FIG. 20.

Figure 21:
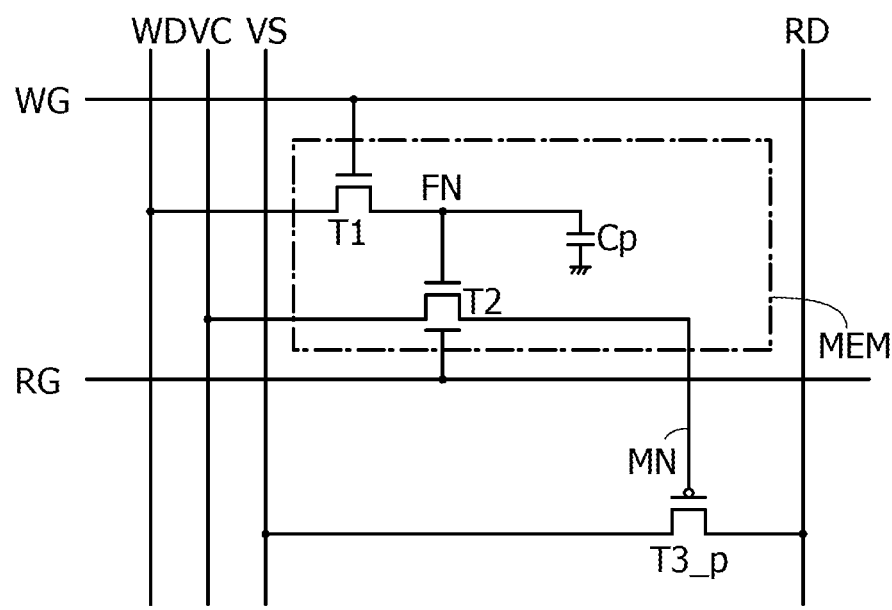
FIG. 21 is a circuit diagram of one embodiment of the present invention.

Although the transistors T1 to T3 are n-channel transistors in FIG. 16, some of them may be a p-channel transistor. For example, the transistor T3 can be a p-channel transistor T3_p as in a circuit diagram of FIG. 21.

Figure 22A:
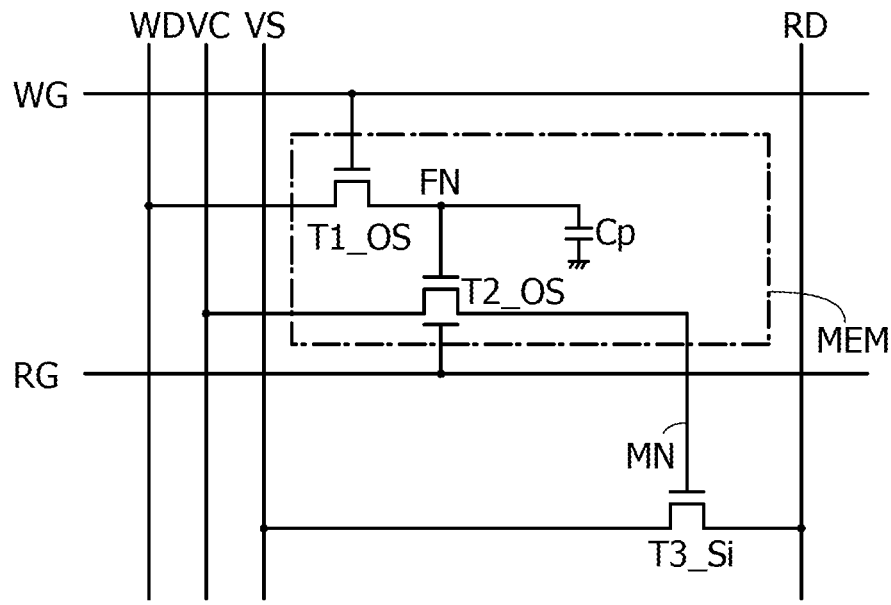
FIGS. 22A and 22B are circuit diagrams of one embodiment of the present invention.

In the structure illustrated in FIG. 16, the transistors T1 and T2 are OS transistors and the transistor T3 is a Si transistor. FIG. 22A is a circuit diagram in which "OS" is used to indicate that a semiconductor layer including a channel formation region of the OS transistor contains an oxide semiconductor and "Si" is used to indicate that a semiconductor layer including a channel formation region of the Si transistor contains silicon. In FIG. 22A, the transistor T1, the transistor T2, and the transistor T3 are shown as a transistor T1_OS, a transistor T205, and a transistor T3 Si, respectively.

Figure 22B:
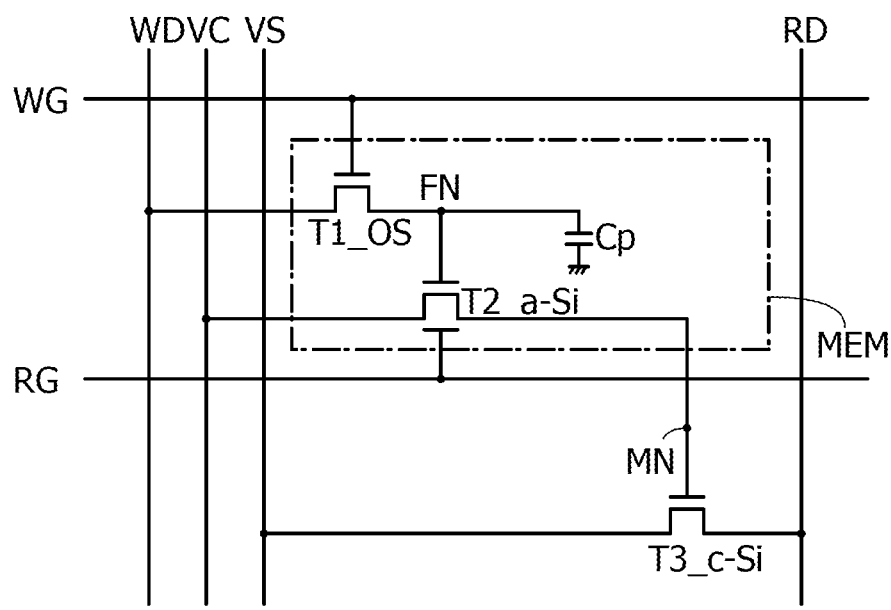

As described above, there is no particular limitation on the kind of semiconductor contained in the semiconductor layer of the transistor T2 because the transistor T2 only needs to have the feature of low gate leakage current. Thus, for example, the transistor T2 can be a transistor T2_a-Si containing amorphous silicon and the transistor T3 can be a transistor T3_c-Si containing single crystal silicon as illustrated in FIG. 22B. In this case, the three transistors are provided in different layers, so that the area of memory cells per unit area can be reduced.

As has been described, in one embodiment of the present invention, an oxide semiconductor is used for the semiconductor layer including a channel formation region of the transistor T1, the transistor T2 has a first gate and a second gate serving as a backgate, and the thickness of the gate insulating film on the first gate side of the transistor T2 is larger than that of a gate insulating film of the transistor T3.

Consequently, in one embodiment of the present invention, charge retention characteristics of a node that holds charge are improved, and the function of a nonvolatile memory circuit with excellent charge retention characteristics is maintained. Furthermore, stacking transistors composing a memory cell prevents the increase in the memory cell area due to the increase in the number of elements.

This embodiment can be implemented in appropriate combination with any of the other embodiments.

Embodiment 5

Referring to FIGS. 23 to 27, this embodiment will show an example of a semiconductor device including a matrix of the memory cells described in Embodiment 4.

<Structure Example of Semiconductor Device>

Figure 23:
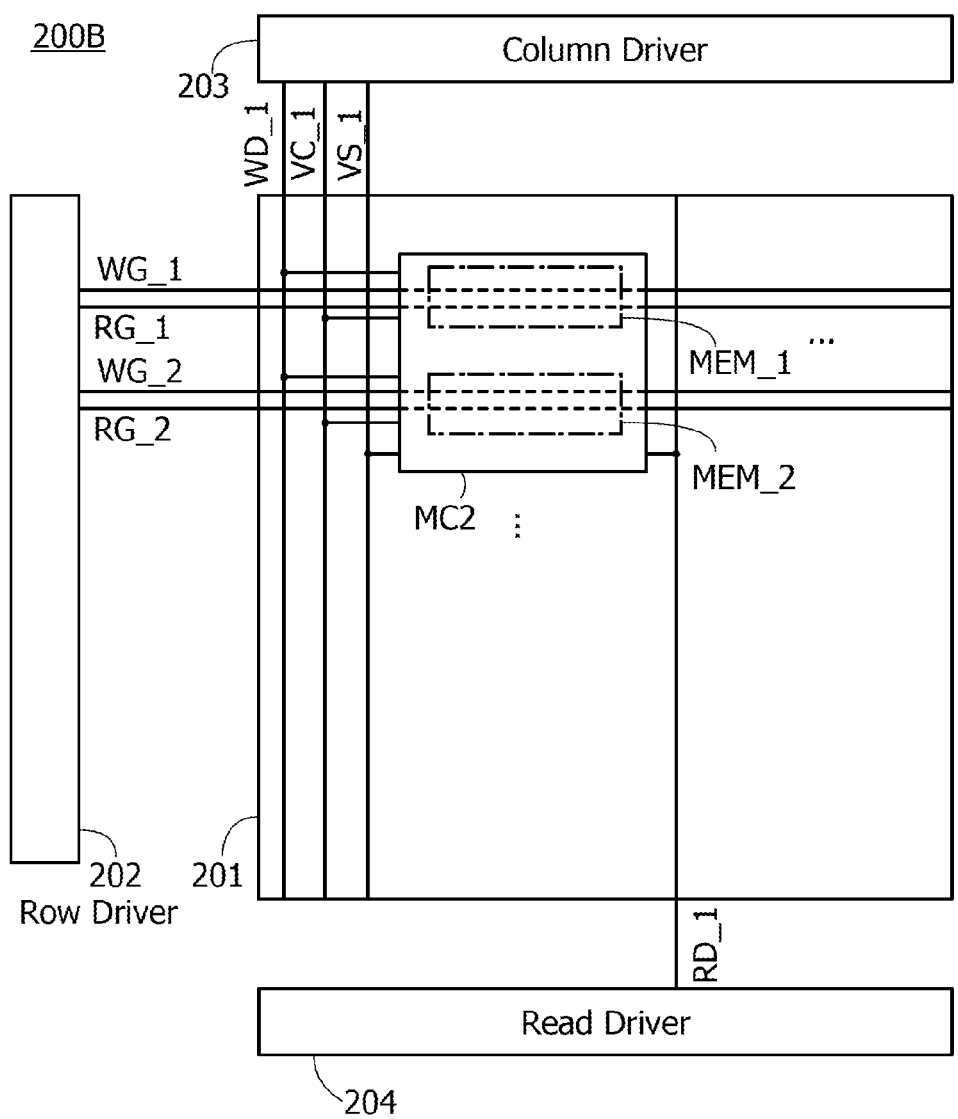
FIG. 23 is a block diagram of one embodiment of the present invention.
Figure 24:
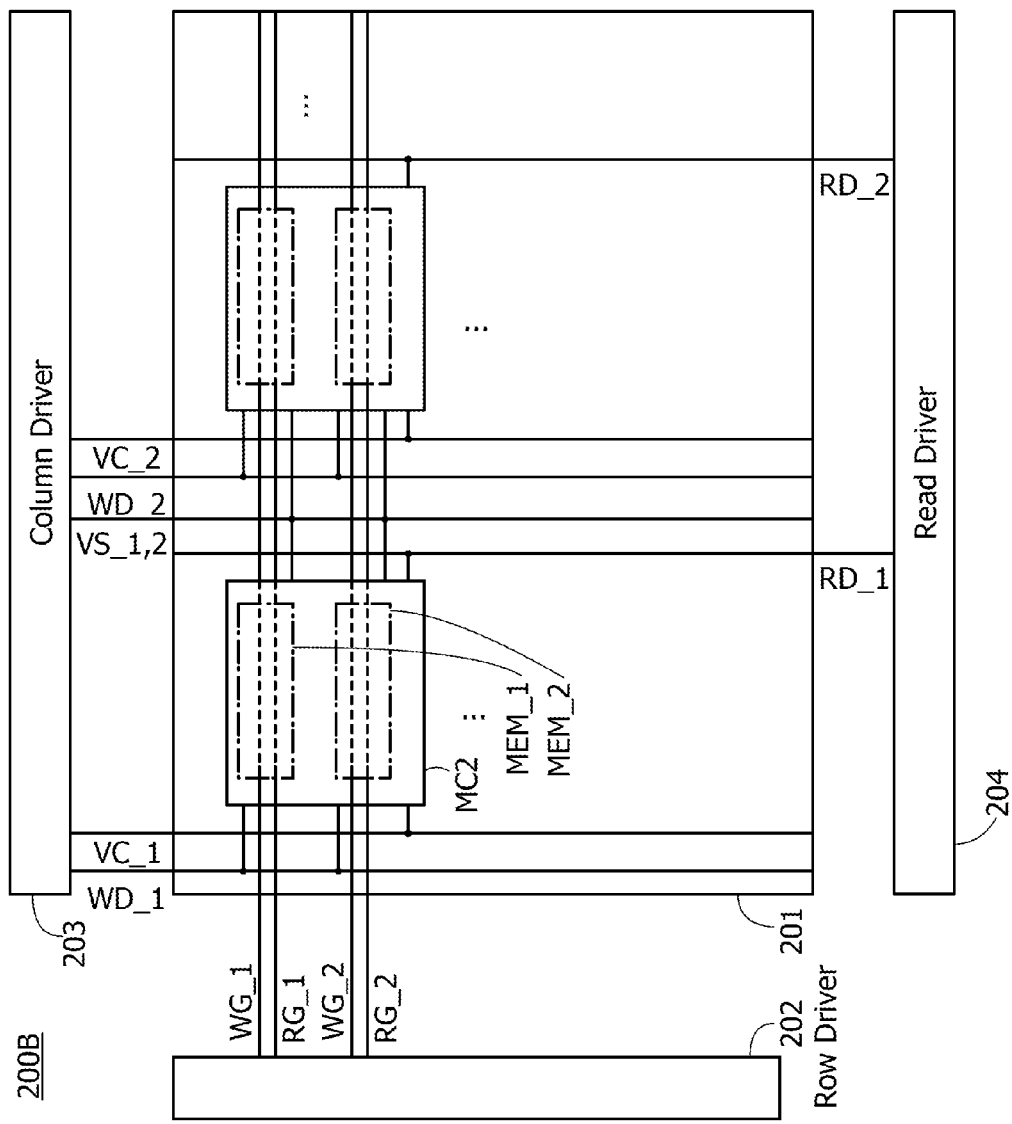
FIG. 24 is a block diagram of one embodiment of the present invention.

FIG. 23 is a block diagram illustrating a structure example of a semiconductor device including the memory cell MC2 shown in FIG. 19.

A semiconductor device 200B illustrated in FIG. 23 includes a memory cell array 201 including a plurality of memory cells MC2 described using FIG. 19, a row driver 202, a column driver 203, and a read driver 204. The memory cell MC2 includes the data memory unit MEM_1 and the data memory unit MEM_2. FIG. 23 illustrates the memory cell MC2 in the first row and the first column. FIG. 23 also illustrates wirings connected to this memory cell, specifically, the write selection line WG_1, the read selection line RG_1, the write selection line WG_2, the read selection line RG_2, a read data line RD_1, a write data line WD_1, a voltage control line VC_1, and a wiring VS_1 for applying a constant potential.

In the memory cell array 201 illustrated in FIG. 23, the memory cells MC2 described using FIG. 19 are arranged in a matrix. Note that the components of the memory cell MC2 are the same as those in FIG. 19; thus, the description of the components is omitted here and the description of FIG. 19 can be referred to.

The row driver 202 is a circuit having a function of selectively controlling data reading and writing of the data memory units MEM_1 and MEM_2 in each row of the memory cells MC2. Specifically, the row driver 202 supplies a write selection signal and a read selection signal to the write selection line WG_1, the read selection line RG_1, the write selection line WG_2, and the read selection line RG_2.

The column driver 203 is a circuit having a function of selectively writing data into the node FN_1 and the node FN_2 in each column of the memory cells MC2, a function of selectively supplying a read signal to the node MN in each column of the memory cells MC2, and a function of supplying a constant potential to the columns of the memory cells MC2. Specifically, the column driver 203 supplies data to the write data line WD_1, supplies a voltage for reading data to the voltage control line VC_1, and supplies the constant potential to the wiring VS_1.

The read driver 204 is a circuit having a function of reading data stored in the data memory units MEM_1 and MEM_2 of the memory cell MC2 and outputting the data to the outside. Specifically, the read driver 204 applies a precharge voltage to the read data line RD_1, reads in a voltage changed from the precharge voltage, and outputs data obtained by comparing the voltage with a reference voltage to the outside.

Note that the wiring VS_1 for applying the constant potential in FIG. 23 can be shared by adjacent memory cells. For example, as in the semiconductor device illustrated in a block diagram of FIG. 24, one wiring VS_1,2 can be provided instead of the wiring VS_1 in the first column and a wiring VS_2 in the second column. Like the wiring VS_1,2, the voltage control line VC_1 illustrated in FIG. 23 can also be shared by adjacent memory cells.

<Structure Example of Row Driver>

Figure 25:
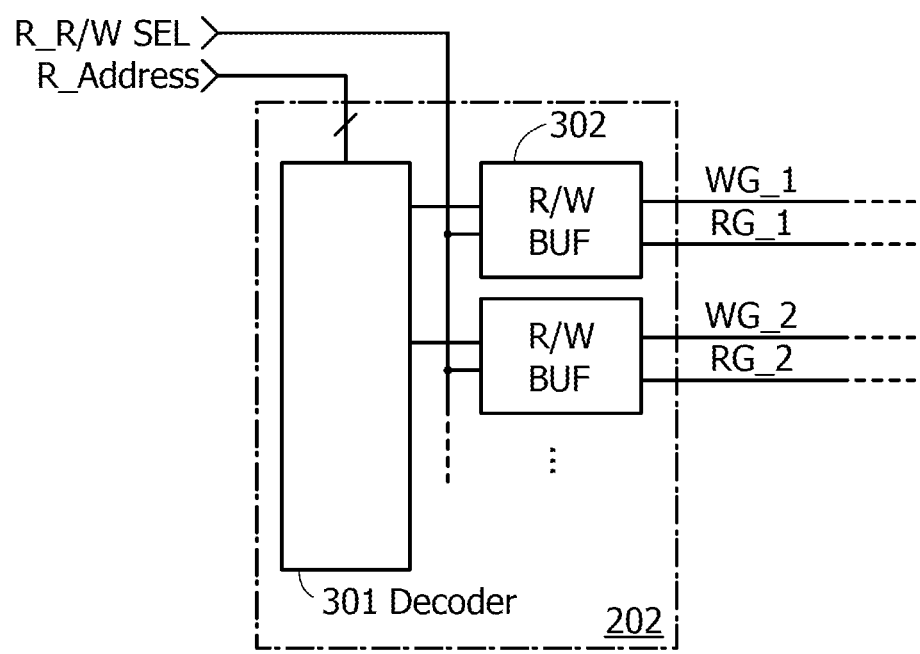
FIG. 25 is a block diagram of one embodiment of the present invention.

FIG. 25 is a block diagram showing a structure example of the row driver 202 illustrated in FIG. 23.

The row driver 202 illustrated in FIG. 25 includes a decoder 301 and read/write buffer circuits 302. The read/write buffer circuit 302 is provided for every row of the data memory units MEM, to which the write selection line WG_1, WG_2, or the like and the read selection line RG_1, RG_2, or the like are connected.

The decoder 301 is a circuit having a function of outputting a signal for selecting a row in which the write selection line WG_1, WG_2, or the like and the read selection line RG_1, RG_2, or the like are provided. Specifically, the decoder 301 selects the read/write buffer circuit 302 in any of the rows in accordance with an inputted row address signal R_Address.

The read/write buffer circuit 302 has functions of outputting a write selection signal and selectively outputting a read selection signal to a row including the write selection line WG_1, WG_2, or the like and the read selection line RG_1, RG_2, or the like selected by the decoder 301. Specifically, the read/write buffer circuit 302 selectively outputs a write selection signal or a read selection signal in accordance with an inputted row read/write selection signal R_R/W_SEL.

<Structure Example of Column Driver>

Figure 26:
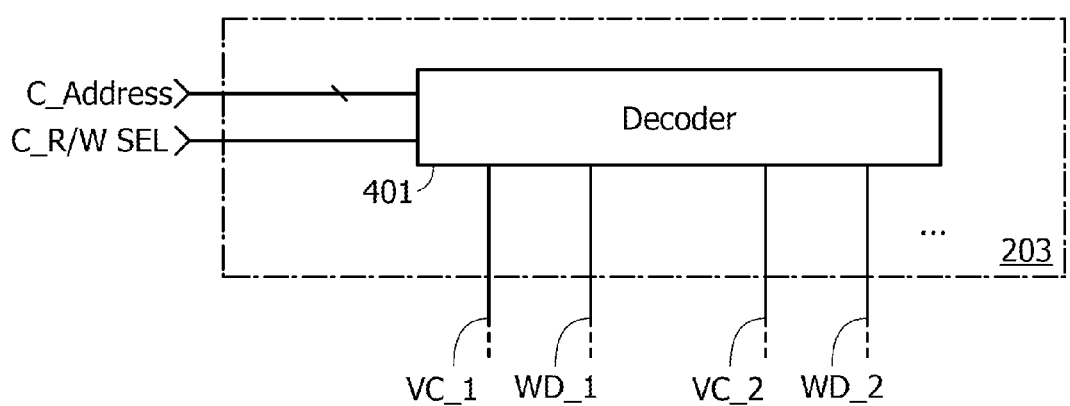
FIG. 26 is a block diagram of one embodiment of the present invention.

FIG. 26 is a block diagram showing a structure example of the column driver 203 illustrated in FIG. 23.

The column driver 203 illustrated in FIG. 26 includes a decoder 401. The decoder 401 is connected to the write data line WD and the voltage control line VC of every column. Although not shown, the wirings VS for applying a constant potential are connected to the memory cells MC in the respective columns without being connected to the column driver 203 in FIG. 26.

The decoder 401 is a circuit having a function of selecting the write data line WD_1, WD_2, or the like and the voltage control line VC_1, VC_2, or the like in a column to output data or a voltage for reading the data. Specifically, the decoder 401 is supplied with a column address signal C_Address and a column read/write selection signal C_R/W_SEL, and outputs data or a voltage for reading the data to the write data line WD_1, WD_2, or the like and the voltage control line VC_1, VC_2, or the like in any of the columns.

<Structure Example of Read Driver>

Figure 27:
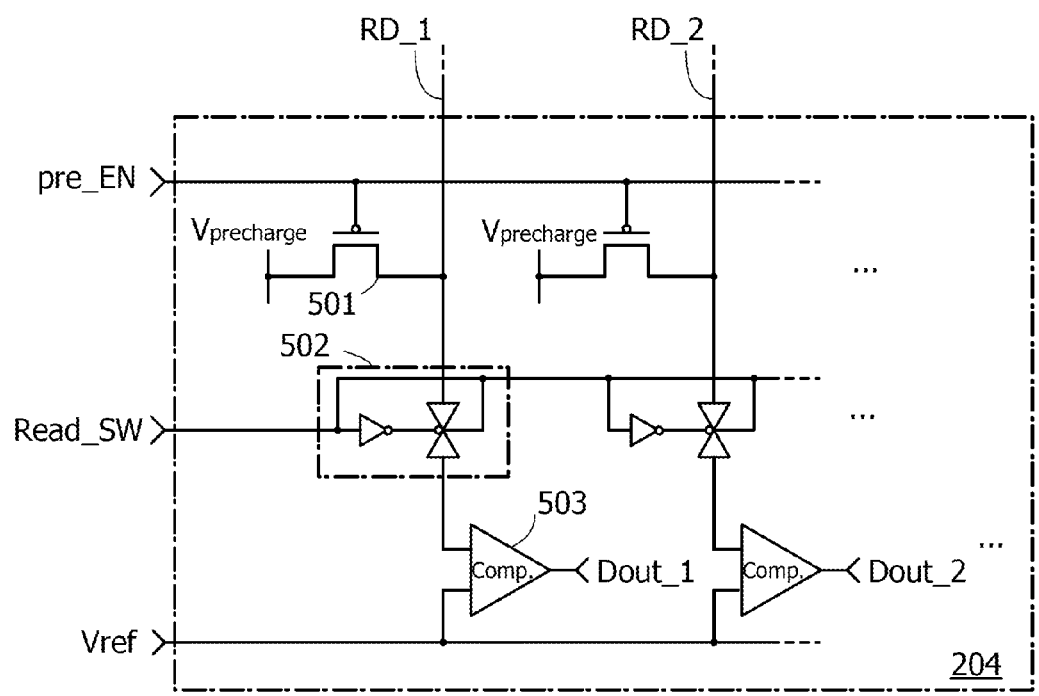
FIG. 27 is a block diagram of one embodiment of the present invention.

FIG. 27 is a block diagram showing a structure example of the read driver 204 illustrated in FIG. 23.

The read driver 204 illustrated in FIG. 27 includes transistors 501, switch circuits 502, and comparators 503. The transistor 501, the switch circuit 502, and the comparator 503 are provided in each column corresponding to the read data line RD_1, RD_2, or the like. The comparator 503 in each column is connected to an output terminal Dout_1, Dout_2, or the like connected to the outside.

The transistor 501 has a function of applying a precharge voltage $V_{precharge}$ to the read data line RD_1, RD_2, or the like. Specifically, the transistor 501 is a switch for applying the precharge voltage $V_{precharge}$ to the read data line RD_1, RD_2, or the like under control with a precharge control signal pre_EN.

The switch circuit 502 supplies a potential of the read data line RD_1, RD_2, or the like that varies with data stored in the memory cell MC to one of input terminals of the comparator 503. Specifically, the switch circuit 502 includes an analog switch and an inverter. Moreover, the switch circuit 502 supplies the potential of the read data line RD_1, RD_2, or the like to one of the input terminals of the comparator 503 under control with a switch control signal Read_SW, and subsequently turns off the analog switch. Note that the potential of the read data line RD_1, RD_2, or the like, which is applied to one of the input terminals of the comparator 503, may be held at the one input terminal of the comparator 503 by using a latch circuit or the like.

The comparator 503 compares the potential of the read data line RD_1, RD_2, or the like, which is applied to one of the input terminals, with a reference voltage Vref applied to the other input terminal to judge a change in the potential of the read data line RD_1, RD_2, or the like. A signal corresponding to the judgment result can be output to the outside through the output terminal Dout_1, Dout_2, or the like.

In the memory cell included in the semiconductor device shown in this embodiment, as described in Embodiment 4, the transistor T1 contains an oxide semiconductor in its semiconductor layer including a channel formation region, the transistor T2 has a first gate and a second gate serving as a backgate, and the thickness of the gate insulating film on the first gate side of the transistor T2 is larger than that of the gate insulating film of the transistor T3.

Thus, in the semiconductor device illustrated in FIG. 23, charge retention characteristics of a node that holds charge are improved, and the function of a nonvolatile memory circuit with excellent charge retention characteristics is maintained. Furthermore, stacking transistors composing a memory cell prevents the increase in the memory cell area caused by the increase in the number of elements.

The structure described in this embodiment can be combined as appropriate with any of the structures described in the other embodiments.

Embodiment 6

This embodiment will explain an oxide semiconductor layer that can be used as a semiconductor layer including a channel formation region of the transistor with low leakage current described in the foregoing embodiments.

An oxide semiconductor used for the semiconductor layer including a channel formation region of the transistor preferably contains at least indium (In) or zinc (Zn). In particular, the oxide semiconductor preferably contains both In and Zn. The oxide semiconductor preferably contains a stabilizer that is strongly bonded to oxygen, in addition to In and Zn. The oxide semiconductor preferably contains at least one of gallium (Ga), tin (Sn), zirconium (Zr), hafnium (Hf), and aluminum (Al) as the stabilizer.

As another stabilizer, the oxide semiconductor may contain one or more kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

As the oxide semiconductor used for the semiconductor layer including a channel formation region of the transistor, any of the following can be used, for example: indium oxide, tin oxide, zinc oxide, In—Zn-based oxide, Sn—Zn-based oxide, Al—Zn-based oxide, Zn—Mg-based oxide, Sn—Mg-based oxide, In—Mg-based oxide, In—Ga-based oxide, In—Ga—Zn-based oxide (also referred to as IGZO), In—Al—Zn-based oxide, In—Sn—Zn-based oxide, Sn—Ga—Zn-based oxide, Al—Ga—Zn-based oxide, Sn—Al—Zn-based oxide, In—Hf—Zn-based oxide, In—Zr—Zn-based oxide, In—Ti—Zn-based oxide, In—Sc—Zn-based oxide, In—Y—Zn-based oxide, In—La—Zn-based oxide, In—Ce—Zn-based oxide, In—Pr—Zn-based oxide, In—Nd—Zn-based oxide, In—Sm—Zn-based oxide, In—Eu—Zn-based oxide, In—Gd—Zn-based oxide, In—Tb—Zn-based oxide, In—Dy—Zn-based oxide, In—Ho—Zn-based oxide, In—Er—Zn-based oxide, In—Tm—Zn-based oxide, In—Yb—Zn-based oxide, In—Lu—Zn-based oxide, In—Sn—Ga—Zn-based oxide, In—Hf—Ga—Zn-based oxide, In—Al—Ga—Zn-based oxide, In—Sn—Al—Zn-based oxide, In—Sn—Hf—Zn-based oxide, and In—Hf—Al—Zn-based oxide.

For example, an In—Ga—Zn-based oxide with an atomic ratio of In:Ga:Zn=1:1:1, 3:1:2, or 2:1:3 or an oxide with an atomic ratio close to the above atomic ratios can be used.

If an oxide semiconductor film forming the semiconductor layer including a channel formation region contains a large amount of hydrogen, the hydrogen and the oxide semiconductor are bonded to each other, so that part of the hydrogen serves as a donor and causes generation of an electron which is a carrier. As a result, the threshold voltage of the transistor shifts in the negative direction. It is therefore preferable that after formation of the oxide semiconductor film, dehydration treatment (dehydrogenation treatment) be performed to remove hydrogen or moisture from the oxide semiconductor film so that the oxide semiconductor film is highly purified to contain impurities as little as possible.

Note that oxygen in the oxide semiconductor film is sometimes reduced by the dehydration treatment (dehydrogenation treatment). For that reason, it is preferable that oxygen be added to the oxide semiconductor film to fill oxygen vacancies increased by the dehydration treatment (dehydrogenation treatment). In this specification and the like, supplying oxygen to an oxide semiconductor film may be expressed as oxygen adding treatment, and treatment for making the oxygen content of an oxide semiconductor film be in excess of that in the stoichiometric composition may be expressed as treatment for making an oxygen-excess state.

In this manner, hydrogen or moisture is removed from the oxide semiconductor film by the dehydration treatment (dehydrogenation treatment) and oxygen vacancies therein are filled by the oxygen adding treatment, whereby the oxide semiconductor film can be turned into an i-type (intrinsic) oxide semiconductor film or a substantially i-type (intrinsic) oxide semiconductor film that is extremely close to an i-type oxide semiconductor film. Note that "substantially intrinsic" means that the oxide semiconductor film contains extremely few (close to zero) carriers derived from a donor and has a carrier density of $1\times10^{17}/cm^3$ or lower, $1\times10^{16}/cm^3$ or lower, $1\times10^{15}/cm^3$ or lower, $1\times10^{14}/cm^3$ or lower, or $1\times10^{13}/cm^3$ or lower.

The transistor including an i-type or substantially i-type oxide semiconductor film can have extremely favorable leakage current characteristics. For example, the off-state drain current of the transistor including the oxide semiconductor film can be $1\times10^{-18}$ A or less, preferably $1\times10^{-21}$ A or less, more preferably $1\times10^{-24}$ A or less at room temperature (approximately 25° C.), or $1\times10^{-15}$ A or less, preferably $1\times10^{-18}$ A or less, more preferably $1\times10^{-21}$ A or less at 85° C. Note that the off state of an n-channel transistor refers to a state where a gate voltage is sufficiently lower than the threshold voltage. Specifically, the transistor is off when the gate voltage is lower than the threshold voltage by 1 V or more, 2 V or more, or 3 V or more.

A structure of an oxide semiconductor film will be described below.

An oxide semiconductor film is classified roughly into a single-crystal oxide semiconductor film and a non-single-crystal oxide semiconductor film. The non-single-crystal oxide semiconductor film includes any of an amorphous oxide semiconductor film, a microcrystalline oxide semiconductor film, a polycrystalline oxide semiconductor film, a c-axis aligned crystalline oxide semiconductor (CAAC-OS) film, and the like.

The amorphous oxide semiconductor film has disordered atomic arrangement and no crystalline component. A typical example of the amorphous oxide semiconductor film is an oxide semiconductor film in which no crystal part exists even in a microscopic region and which is entirely amorphous.

The microcrystalline oxide semiconductor film includes a microcrystal (also referred to as nanocrystal) with a size greater than or equal to 1 nm and less than 10 nm, for example. Thus, the microcrystalline oxide semiconductor film has a higher degree of atomic order than the amorphous oxide semiconductor film. Hence, the density of defect states of the microcrystalline oxide semiconductor film is lower than that of the amorphous oxide semiconductor film.

The CAAC-OS film is an oxide semiconductor film including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm. The density of defect states of the CAAC-OS film is lower than that of the microcrystalline oxide semiconductor film. The CAAC-OS film will be described below in detail.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when a CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the $InGaZnO_4$ crystal. Here, analysis (φ scan) is performed under conditions where the sample is rotated around a normal vector of a sample surface as an axis (φ axis) with 2θ fixed at around 56°. When the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface of the CAAC-OS film. Thus, for example, when the shape of the CAAC-OS film is changed by etching or the like, the c-axis might not be necessarily parallel to a normal vector of a formation surface or a normal vector of a top surface of the CAAC-OS film.

The degree of crystallinity in the CAAC-OS film is not necessarily uniform. For example, when crystal growth leading to the CAAC-OS film occurs from the vicinity of the top surface of the film, the degree of the crystallinity in the vicinity of the top surface is sometimes higher than that in the vicinity of the formation surface. Further, when an impurity is added to the CAAC-OS film, the crystallinity in a region to which the impurity is added is changed, and the degree of crystallinity in the CAAC-OS film varies depending on regions in some cases.

Note that when the CAAC-OS film with an $InGaZnO_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appears at around 31° and a peak of 2θ do not appear at around 36°.

With the use of the CAAC-OS film in a transistor, change in electrical characteristics of the transistor due to irradiation with visible light or ultraviolet light is small. Thus, the transistor has high reliability.

Note that an oxide semiconductor film may be a stacked film including two or more kinds of an amorphous oxide semiconductor film, a microcrystalline oxide semiconductor film, and a CAAC-OS film, for example.

This embodiment can be implemented in appropriate combination with any of the other embodiments.

Embodiment 7

Referring to a drawing, this embodiment will show a cross-sectional structure of a transistor included in the memory cell MC of the semiconductor device of one embodiment of the disclosed invention.

Figure 28:
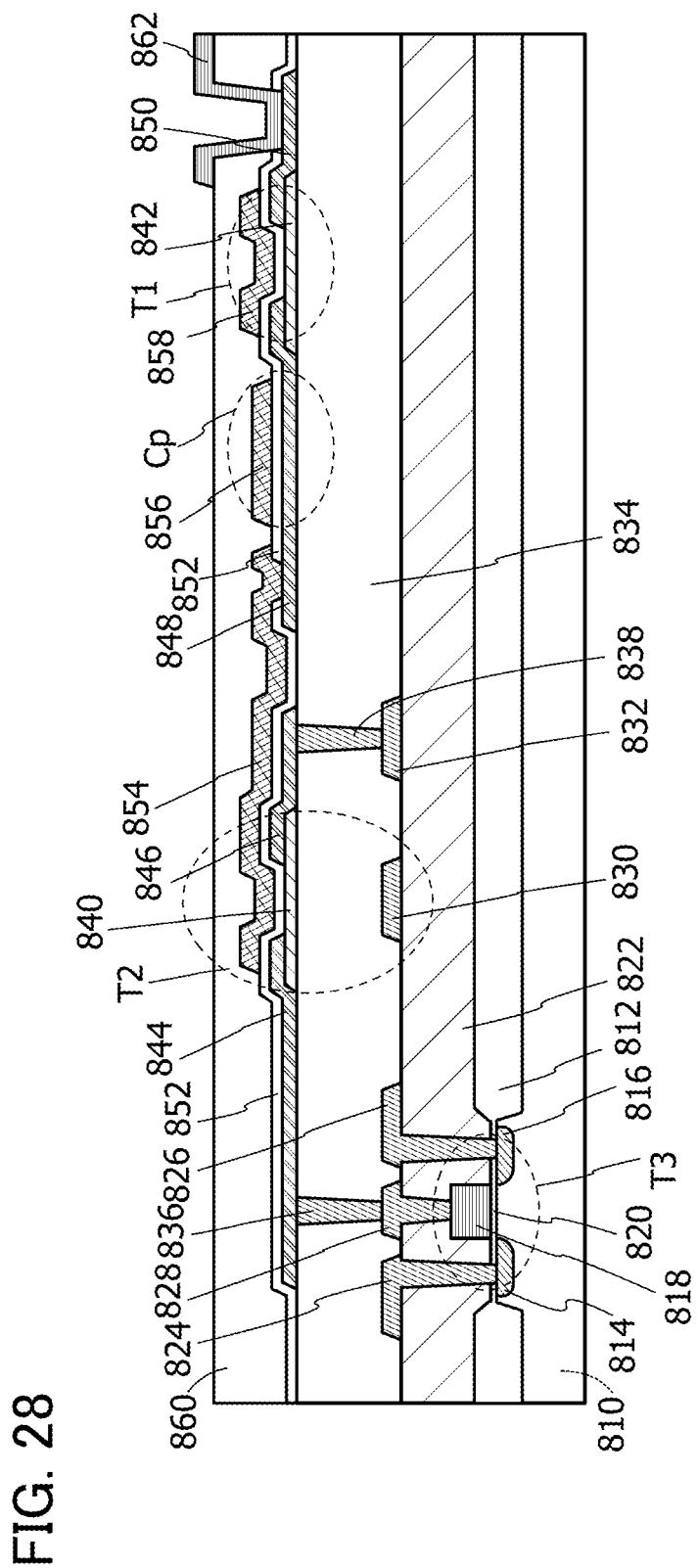
FIG. 28 is a cross-sectional view of one embodiment of the present invention.

FIG. 28 illustrates an example of part of a cross-sectional structure of the memory cell MC. FIG. 28 illustrates the transistor T1, the transistor T2, the transistor T3, and the capacitor Cp shown in Embodiment 4.

In the cross-sectional view in FIG. 28, the transistors T1 to T3 and the capacitor Cp shown in FIG. 16 are denoted by the same reference signs.

The cross-sectional view in FIG. 28 shows an example where the transistor T3 is formed on a single crystal silicon substrate and the transistors T1 and T2 using an oxide semiconductor for a semiconductor layer including a channel formation region are formed over the transistor T3. In the transistor T3, a thin semiconductor layer of silicon, germanium, or the like in an amorphous, microcrystalline, polycrystalline, or single crystal state may be used for the semiconductor layer including a channel formation region.

In the cross-sectional view in FIG. 28, the transistors T1 and T2 are transistors in which an oxide semiconductor provided in the same layer is used for a semiconductor layer including a channel formation region. Alternatively, the transistors T1 and T2 may be provided in different layers and stacked as described in Embodiment 4. In this structure, the transistor T2 does not necessarily use an oxide semiconductor for the semiconductor layer including a channel formation region as long as the transistor T2 includes a thicker gate insulating film than the transistor T3. With such a structure, the density of memory cells can be further increased.

When the Si transistor and the OS transistors are stacked in the semiconductor device as in FIG. 28, the chip area of the semiconductor device can be reduced.

In FIG. 1B, the n-channel transistor T3 is formed on a semiconductor substrate 810.

The semiconductor substrate 810 can be, for example, an n-type or p-type silicon substrate, germanium substrate, silicon germanium substrate, or compound semiconductor substrate (e.g., GaAs substrate, InP substrate, GaN substrate, SiC substrate, GaP substrate, GaInAsP substrate, or ZnSe substrate). In FIG. 28, a single crystal silicon substrate having n-type conductivity is used.

The transistor T3 is electrically isolated from other transistors existing in the same layer by element isolation insulating films 812. The element isolation insulating films 812 can be formed by a local oxidation of silicon (LOCOS) method, a trench isolation method, or the like.

Specifically, the transistor T3 includes impurity regions 814 and 816 that are formed in the semiconductor substrate 810 and function as a source region and a drain region, a conductive film 818, and a gate insulating film 820 provided between the semiconductor substrate 810 and the conductive film 818. The conductive film 818 overlaps a channel formation region between the impurity regions 814 and 816 with the gate insulating film 820 positioned between the conductive film 818 and the channel formation region. Note that the conductive film 818 functions as a gate electrode.

An insulating film 822 is provided over the transistor T3. Openings are formed in the insulating film 822. A conductive film 824 in contact with the impurity region 814, a conductive film 826 in contact with the impurity region 816, and a conductive film 828 in contact with the conductive film 818 are formed in the openings. Conductive films 830 and 832 are formed in the same layer as the conductive films 824, 826, and 828.

An insulating film 834 is provided over the conductive films 824, 826, 828, 830, and 832. Openings are formed in the insulating film 834. A conductive film 836 that is a wiring in contact with the conductive film 828 and a conductive film 838 in contact with the conductive film 832 are formed in the openings.

In FIG. 28, the transistor T1, the transistor T2, and the capacitor Cp are formed over the insulating film 834.

The transistor T1 includes, over the insulating film 834, a semiconductor layer 842 containing an oxide semiconductor, conductive films 848 and 850 that are positioned over the semiconductor layer 842 and function as a source electrode and a drain electrode, a gate insulating film 852 over the semiconductor layer 842 and the conductive films 848 and 850, and a conductive film 858 that is positioned over the gate insulating film 852 and overlaps the semiconductor layer 842 between the conductive films 848 and 850. Note that the conductive film 858 functions as a gate electrode.

The transistor T2 includes, over the insulating film 834, a semiconductor layer 840 containing an oxide semiconductor, conductive films 844 and 846 that are positioned over the semiconductor layer 840 and function as a source electrode and a drain electrode, the gate insulating film 852 over the semiconductor layer 840 and the conductive films 844 and 846, a conductive film 854 that is positioned over the gate insulating film 852 and has a portion functioning as a first gate electrode in a region overlapping the semiconductor layer 840 and the conductive film 830 between the conductive films 844 and 846, and the conductive film 830 functioning as a second gate electrode. The conductive film 844 is connected to the conductive film 836. The conductive film 846 is connected to the conductive film 838. An opening reaching the conductive film 848 is formed in the gate insulating film 852. A conductive film 854 is provided in the opening.

The capacitor Cp includes, over the insulating film 834, the conductive film 848, the gate insulating film 852 over the conductive film 848, and a conductive film 856 which is over the gate insulating film 852 and part of which overlaps the conductive film 848.

An opening reaching the conductive film 850 is formed in the gate insulating film 852 and an insulating film 860. A conductive film 862 is provided in the opening.

Note that the conductive film 858 is a wiring corresponding to the write selection line WG described in Embodiment 4; the conductive film 832, a wiring corresponding to the voltage control line VC; the conductive films 848 and 854, a wiring corresponding to the node FN; the conductive film 844, a wiring corresponding to the node MN; the conductive film 862, a wiring corresponding to the write data line WD; the conductive film 830, a wiring corresponding to the read selection line RG; the conductive film 824, a wiring corresponding to the wiring VS for applying a constant potential; and the conductive film 826, a wiring corresponding to the read data line RD.

As the gate insulating films 820 and 852, an inorganic insulating film may be used, for example. The inorganic insulating film preferably has a single-layer or multi-layer structure including any of a silicon nitride film, a silicon oxynitride film, a silicon nitride oxide film, and the like.

Each of the insulating films 822, 834, and 860 is preferably a single layer or a multilayer including an inorganic insulating film or an organic insulating film. The organic insulating film preferably has a single-layer or a multi-layer structure containing polyimide, acrylic, or the like.

The semiconductor layers 840 and 842 are preferably formed using an oxide semiconductor. The oxide semiconductor can be any of the materials described in Embodiment 6.

Each of the conductive films 818, 824, 826, 828, 830, 832, 836, 838, 844, 846, 848, 850, 854, 856, 858, and 862 can be, for example, a single layer or a stack containing a metal material such as aluminum, copper, titanium, tantalum, or tungsten.

In FIG. 28, the transistor T1 has the gate electrode on at least one side of the semiconductor layer; alternatively, it may have a pair of gate electrodes with the semiconductor layer positioned therebetween.

When the transistor T1 has a pair of gate electrodes with the semiconductor layer placed therebetween, one of the gate electrodes may be supplied with a signal for controlling the on/off state, and the other of the gate electrodes may be supplied with a potential from another element. In the latter case, potentials with the same level may be supplied to the pair of gate electrodes, or a fixed potential such as a ground potential may be supplied only to the other of the gate electrodes. When the level of a potential supplied to the other of the gate electrodes is controlled, the threshold voltage of the transistor T1 can be controlled.

The semiconductor layers 840 and 842 are not limited to a single film of an oxide semiconductor and may be a stack including a plurality of oxide semiconductor films.

In a memory cell of the semiconductor device described in this embodiment, as described in Embodiment 4, the transistor T1 contains an oxide semiconductor in its semiconductor layer including a channel formation region, the transistor T2 has a first gate and a second gate serving as a backgate, and the thickness of the gate insulating film on the first gate side of the transistor T2 is larger than that of the gate insulating film of the transistor T3.

Thus, with the cross-sectional structures of the transistors included in the memory cell in FIG. 28, charge retention characteristics of the node that holds charge are improved, and the function of a nonvolatile memory circuit with excellent charge retention characteristics is maintained. Furthermore, stacking transistors composing a memory cell prevents the increase in the memory cell area caused by the increase in the number of elements.

This embodiment can be implemented in appropriate combination with any of the other embodiments.

Embodiment 8

In this embodiment, application examples of a circuit including the PLD or the semiconductor device described in the foregoing embodiment to an electronic component and to an electronic device including the electronic component will be described with reference to FIGS. 14A and 14B and FIGS. 15A to 15E.

Figure 14A:
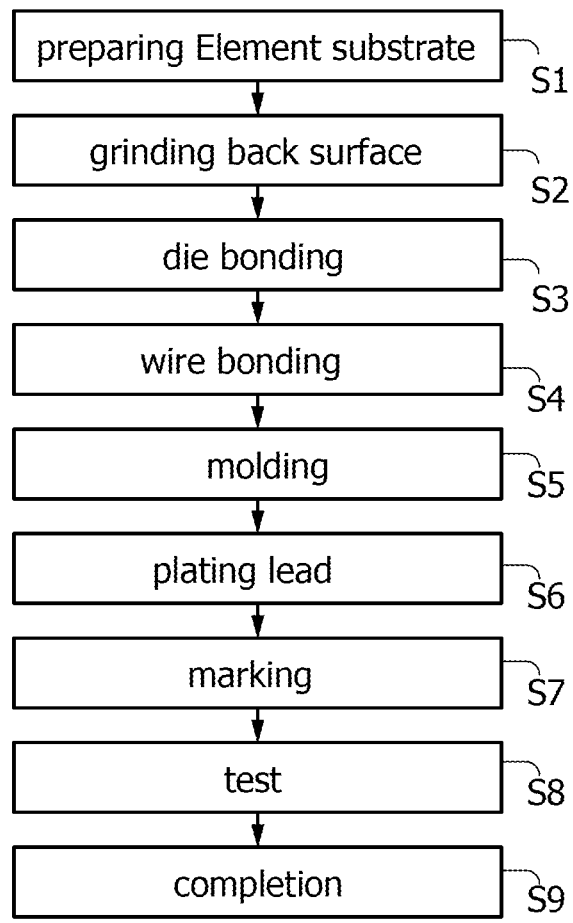
FIG. 14A is a flowchart showing fabrication steps of a semiconductor device.

FIG. 14A shows an example where the PLD or the semiconductor device described in the foregoing embodiment is used to make an electronic component. Note that an electronic component is also referred to as semiconductor package or IC package. For the electronic component, there are various standards and names corresponding to the direction of terminals or the shape of terminals; hence, one example of the electronic component will be described in this embodiment.

For example, a circuit portion including the transistors illustrated in FIG. 1B of Embodiment 1 is completed by integrating detachable components on a printed circuit board through the assembly process (post-process).

The post-process can be completed through steps shown in FIG. 14A. Specifically, after an element substrate obtained in the wafer process is completed (Step S1), a back surface of the substrate is ground (Step S2). The substrate is thinned in this step to reduce warpage or the like of the substrate in the wafer process and to reduce the size of the component itself.

A dicing step of grinding the back surface of the substrate to separate the substrate into a plurality of chips is performed. Then, a die bonding step of individually picking up separate chips to be mounted on and bonded to a lead frame is performed (Step S3). To bond a chip and a lead frame in the die bonding step, resin bonding, tape-automated bonding, or the like is selected as appropriate depending on products. Note that in the die bonding step, a chip may be mounted on and bonded to an interposer.

Next, wire bonding for electrically connecting a lead of the lead frame and an electrode on a chip through a metal wire is performed (Step S4). As a metal wire, a silver wire or a gold wire can be used. For wire bonding, ball bonding or wedge bonding can be employed.

A wire-bonded chip is subjected to a molding step of sealing the chip with an epoxy resin or the like (Step S5). With the molding step, the inside of the electronic component is filled with a resin, so that the circuit portion and the wire embedded in the component can be protected from external mechanical force and deterioration of characteristics due to moisture or dust can be reduced.

Subsequently, the lead of the lead frame is plated. Then, the lead is cut and processed into a predetermined shape (Step S6). With the plating process, corrosion of the lead can be prevented, and soldering for mounting the electronic component on a printed circuit board in a later step can be performed with higher reliability.

Next, printing process (marking) is performed on a surface of the package (Step S7). Then, through a final test step (Step S8), the electronic component that includes the circuit portion including the PLD is completed (Step S9).

The electronic component described above includes the circuit portion including the PLD or the semiconductor device of the foregoing embodiment. Thus, it is possible to obtain an electronic component including a programmable switch element having a highly reliable memory circuit. In addition, it is possible to obtain an electronic component including a semiconductor device that excels in charge retention characteristics even if leakage current due to miniaturization of a Si transistor occurs.

Figure 14B:
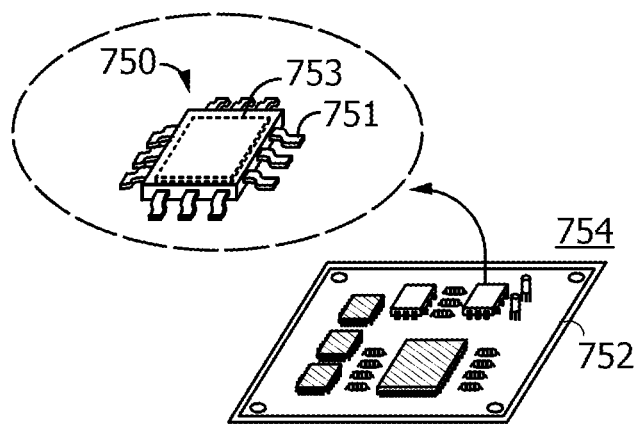
FIG. 14B is a perspective schematic view of the semiconductor device.

FIG. 14B is a perspective schematic diagram of a completed electronic component. FIG. 14B shows a perspective schematic diagram of a quad flat package (QFP) as an example of the electronic component. An electronic component 750 illustrated in FIG. 14B includes a lead 751 and a circuit portion 753. The electronic component 750 in FIG. 14B is, for example, mounted on a printed circuit board 752.

A plurality of electronic components 750 are used in combination and electrically connected to each other over the printed wiring board 752; thus, a component substrate 754 is completed. The completed component substrate 754 is provided in an electronic device or the like.

Next, the description is made on applications of the above electronic component to electronic devices such as a computer, a portable information appliance (including a mobile phone, a portable game machine, and an audio reproducing device), electronic paper, a television device (also referred to as television or television receiver), and a digital video camera.

Figure 15A:
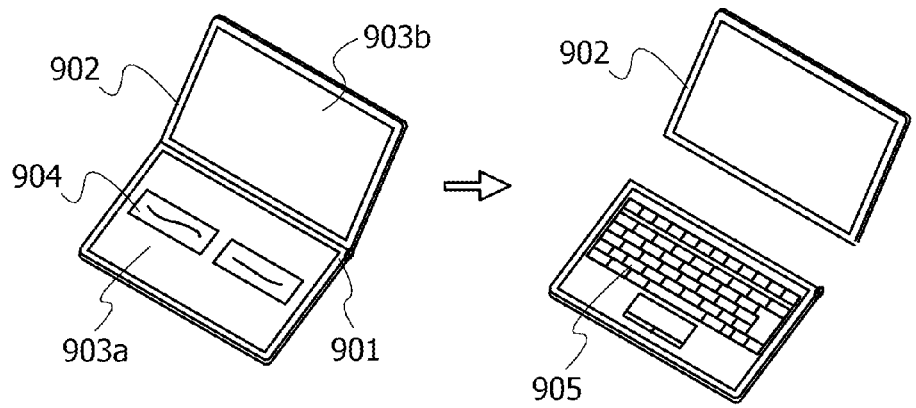
FIGS. 15A to 15E illustrate electronic devices each including a semiconductor device.

FIG. 15A illustrates a portable information appliance that includes a housing 901, a housing 902, a first display portion 903a, a second display portion 903b, and the like. The component substrate 754 illustrated in FIG. 14B is used for at least part of the housings 901 and 902. Thus, it is possible to obtain a portable information appliance with high reliability or excellent charge retention characteristics.

Note that the first display portion 903a is a panel having a touch input function, and for example, as illustrated in the left of FIG. 15A, which of "touch input" and "keyboard input" is performed can be selected by a selection button 904 displayed on the first display portion 903a. Since selection buttons with a variety of sizes can be displayed, the information appliance can be easily used by people of any generation. For example, when "touch input" is selected, a keyboard 905 is displayed on the first display portion 903a as illustrated in the right of FIG. 15A. Thus, letters can be input quickly by key input as in the case of using a conventional information appliance, for example.

One of the first display portion 903a and the second display portion 903b can be detached from the portable information appliance as shown in the right of FIG. 15A. Providing the second display portion 903b with a touch input function makes the information appliance convenient to carry because the weight can be further reduced and the information appliance can operate with one hand while the other hand supports the housing 902.

The portable information appliance in FIG. 15A can be equipped with a function of displaying a variety of information (e.g., a still image, a moving image, and a text image); a function of displaying a calendar, a date, the time, or the like on the display portion; a function of operating or editing information displayed on the display portion; a function of controlling processing by various kinds of software (programs); and the like. Furthermore, an external connection terminal (e.g., an earphone terminal or a USB terminal), a recording medium insertion portion, and the like may be provided on the back surface or the side surface of the housing.

The portable information appliance illustrated in FIG. 15A may transmit and receive data wirelessly. Through wireless communication, desired book data or the like can be purchased and downloaded from an e-book server.

Further, the housing 902 illustrated in FIG. 15A may be equipped with an antenna, a microphone function, or a wireless communication function to be used as a mobile phone.

Figure 15B:
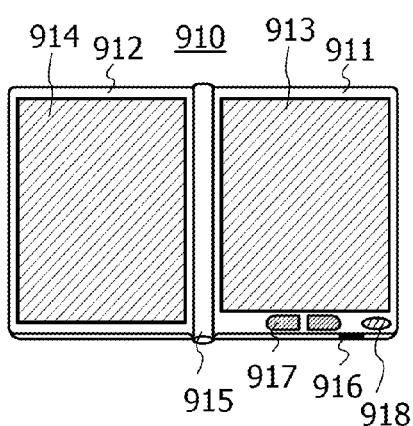

FIG. 15B illustrates an e-book reader 910 in which electronic paper is incorporated. The e-book reader has two housings of a housing 911 and a housing 912. The housing 911 and the housing 912 are provided with a display portion 913 and a display portion 914, respectively. The housings 911 and 912 are connected by a hinge 915 and can be opened or closed with the hinge 915 as an axis. The housing 911 is provided with a power switch 916, an operation key 917, a speaker 918, and the like. The component substrate 754 illustrated in FIG. 14B is provided in at least one of the housings 911 and 912. Consequently, it is possible to obtain an e-book reader with high reliability or excellent charge retention characteristics.

Figure 15C:
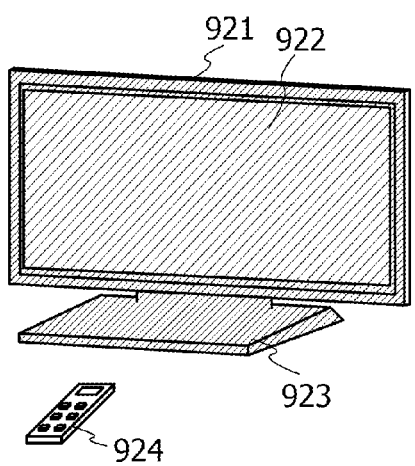

FIG. 15C illustrates a television device including a housing 921, a display portion 922, a stand 923, and the like. The television device can operate with a switch of the housing 921 and a separate remote controller 924. The component substrate 754 illustrated in FIG. 14B is mounted on the housings 921 and the remote controller 924. Thus, it is possible to obtain a television with high reliability or excellent charge retention characteristics.

Figure 15D:
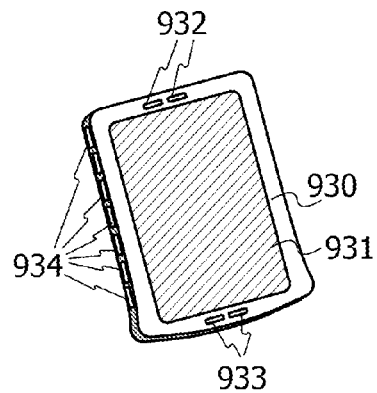

FIG. 15D illustrates a smartphone in which a main body 930 is provided with a display portion 931, a speaker 932, a microphone 933, an operation key 934, and the like. The component substrate 754 illustrated in FIG. 14B is provided in the main body 930. Consequently, it is possible to obtain a smartphone with high reliability or excellent charge retention characteristics.

Figure 15E:
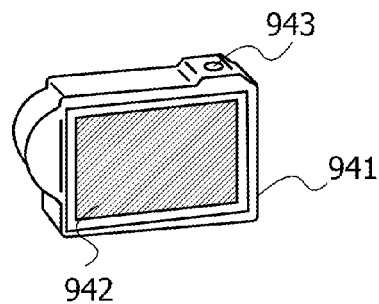

FIG. 15E illustrates a digital camera including a main body 941, a display portion 942, an operation switch 943, and the like. The component substrate 754 illustrated in FIG. 14B is provided in the main body 941. Thus, it is possible to obtain a digital camera with high reliability or excellent charge retention characteristics.

As described above, the electronic device shown in this embodiment incorporates the component substrate 754 illustrated in FIG. 14B. Thus, it is possible to obtain an electronic device provided with a programmable switch element having high reliability or excellent charge retention characteristics.

This application is based on Japanese Patent Applications serial No. 2013-130108 and No. 2013-139351 filed with Japan Patent Office on Jun. 21, 2013 and Jul. 3, 2013, respectively, the entire contents of which are hereby incorporated by reference.

What is claimed is:
1. A semiconductor device comprising:
a programmable switch element comprising:
    a first transistor;
    a second transistor; and
    a third transistor,
wherein one of a source and a drain of the first transistor is electrically connected to a first wiring,
wherein a gate of the first transistor is electrically connected to a second wiring,
wherein one of a source and a drain of the second transistor is electrically connected to a third wiring,
wherein a gate of the second transistor is directly connected to the other of the source and the drain of the first transistor,
wherein a gate of the third transistor is electrically connected to the other of the source and the drain of the second transistor,
wherein the gate of the second transistor is not directly connected to any transistor other than the first transistor,
wherein a thickness of a gate insulating film of the second transistor is larger than a thickness of a gate insulating film of the third transistor,
wherein the first transistor comprises a channel formation region comprising an oxide semiconductor, and
wherein the third transistor comprises a channel formation region comprising silicon.

2. The semiconductor device according to claim 1,
wherein the first wiring is a bit line,
wherein the second wiring is a word line, and
wherein the third wiring is a wiring applying a constant potential.

3. The semiconductor device according to claim 2,
wherein the third transistor is configured to control continuity between a source and a drain of the third transistor in accordance with the constant potential.

4. The semiconductor device according to claim 2,
wherein the constant potential is a potential for turning on or off the third transistor.

5. The semiconductor device according to claim 2,
wherein a potential of the bit line is at L level while a potential of the word line is at L level.

6. The semiconductor device according to claim 1,
wherein the second transistor comprises a back gate, and
wherein the back gate is electrically connected to a sixth wiring.

7. The semiconductor device according to claim 6,
wherein the first wiring is a write data line,
wherein the second wiring is a write selection line,
wherein the third wiring is a voltage control line, and
wherein the sixth wiring is a read selection line.

8. The semiconductor device according to claim 1, further comprising a programmable logic element, a fourth wiring, and a fifth wiring,
wherein the fourth wiring and the fifth wiring are electrically connected to the programmable logic element,
wherein one of a source and a drain of the third transistor is electrically connected to the fourth wiring, and
wherein the other of the source and the drain of the third transistor is electrically connected to the fifth wiring.

9. The semiconductor device according to claim 1, further comprising a capacitor including a first electrode electrically connected to the other of the source and the drain of the first transistor and the gate of the second transistor, and a second electrode electrically connected to a wiring applying a ground potential.

10. The semiconductor device according to claim 1,
wherein a reset circuit is electrically connected to one of a source and a drain of the third transistor.

11. The semiconductor device according to claim 1,
wherein a latch circuit is electrically connected to one of a source and a drain of the third transistor.

12. The semiconductor device according to claim 1,
wherein a memory cell comprises the first transistor, the second transistor, and the third transistor.

13. A semiconductor device comprising:
a programmable switch element comprising:
  a first transistor;
  a second transistor;
  a third transistor;
  a fourth transistor; and
  a fifth transistor,
wherein one of a source and a drain of the first transistor is electrically connected to a first wiring,
wherein a gate of the first transistor is electrically connected to a second wiring,
wherein one of a source and a drain of the second transistor is electrically connected to a third wiring,
wherein a gate of the second transistor is directly connected to the other of the source and the drain of the first transistor,
wherein one of a source and a drain of the third transistor is electrically connected to a fourth wiring,
wherein a gate of the third transistor is electrically connected to the second wiring,
wherein one of a source and a drain of the fourth transistor is electrically connected to a fifth wiring,
wherein a gate of the fourth transistor is directly connected to the other of the source and the drain of the third transistor,
wherein a gate of the fifth transistor is directly connected to the other of the source and the drain of the second transistor and the other of the source and the drain of the fourth transistor,
wherein a thickness of a gate insulating film of each of the second transistor and the fourth transistor is larger than a thickness of a gate insulating film of the fifth transistor,
wherein each of the first transistor and the third transistor comprises a channel formation region comprising an oxide semiconductor, and
wherein the fifth transistor comprises a channel formation region comprising silicon.

14. The semiconductor device according to claim 13,
wherein the first wiring is a bit line,
wherein the second wiring is a word line,
wherein the third wiring is a wiring applying a first potential,
wherein the fourth wiring is an inverted bit line, and
wherein the fifth wiring is a wiring applying a second potential.

15. The semiconductor device according to claim 14,
wherein the fifth transistor is configured to control continuity between a source and a drain of the fifth transistor in accordance with the first potential or the second potential.

16. The semiconductor device according to claim 14,
wherein the first potential is a potential for turning on the fifth transistor, and
wherein the second potential is a potential for turning off the fifth transistor.

17. The semiconductor device according to claim 14,
wherein a potential of the bit line and a potential of the inverted bit line are at L level while a potential of the word line is at L level.

18. The semiconductor device according to claim 14,
wherein the first potential is higher than the second potential.

19. The semiconductor device according to claim 13, further comprising a programmable logic element, a sixth wiring, and a seventh wiring,
wherein the sixth wiring and the seventh wiring are electrically connected to the programmable logic element,
wherein one of a source and a drain of the fifth transistor is electrically connected to the sixth wiring, and
wherein the other of the source and the drain of the fifth transistor is electrically connected to the seventh wiring.

20. The semiconductor device according to claim 13, further comprising:
a first capacitor including a first electrode electrically connected to the other of the source and the drain of the first transistor and the gate of the second transistor, and a second electrode electrically connected to a wiring applying a ground potential; and
a second capacitor including a first electrode electrically connected to the other of the source and the drain of the third transistor and the gate of the fourth transistor, and a second electrode electrically connected to the wiring applying the ground potential.

21. The semiconductor device according to claim 13, wherein a reset circuit is electrically connected to one of a source and a drain of the fifth transistor.

22. The semiconductor device according to claim 13, wherein a latch circuit is electrically connected to one of a source and a drain of the fifth transistor.

23. A semiconductor device comprising:
a first transistor;
a second transistor;
a third transistor; and
a capacitor,
wherein one of a source and a drain of the first transistor is directly connected to a first wiring,
wherein a gate of the first transistor is directly connected to a second wiring,
wherein one of a source and a drain of the second transistor is directly connected to a third wiring,
wherein a gate of the second transistor is directly connected to the other of the source and the drain of the first transistor,
wherein the gate of the second transistor is directly connected to the capacitor,
wherein a gate of the third transistor is directly connected to the other of the source and the drain of the second transistor,
wherein each of the first transistor and the second transistor comprises a channel formation region comprising an oxide semiconductor, and
wherein the third transistor comprises a channel formation region comprising silicon.

24. The semiconductor device according to claim 23, wherein the first wiring is a bit line,
wherein the second wiring is a word line, and
wherein the third wiring is a wiring applying a constant potential.

25. The semiconductor device according to claim 24, wherein the third transistor is configured to control continuity between a source and a drain of the third transistor in accordance with the constant potential.

26. The semiconductor device according to claim 24, wherein the constant potential is a potential for turning on or off the third transistor.

27. The semiconductor device according to claim 24, wherein a potential of the bit line is at L level while a potential of the word line is at L level.

28. The semiconductor device according to claim 23, wherein a thickness of a gate insulating film of the second transistor is larger than a thickness of a gate insulating film of the third transistor.

29. The semiconductor device according to claim 23, further comprising a programmable logic element, a fourth wiring, and a fifth wiring,
wherein the fourth wiring and the fifth wiring are electrically connected to the programmable logic element,
wherein one of a source and a drain of the third transistor is electrically connected to the fourth wiring,
wherein the other of the source and the drain of the third transistor is electrically connected to the fifth wiring, and
wherein a programmable switch element comprises the first transistor, the second transistor and the third transistor.

30. The semiconductor device according to claim 23, wherein a reset circuit is electrically connected to one of a source and a drain of the third transistor.

31. The semiconductor device according to claim 23, wherein a latch circuit is electrically connected to one of a source and a drain of the third transistor.

* * * * *